(12) United States Patent
Snaith et al.

(10) Patent No.: US 9,818,944 B2
(45) Date of Patent: Nov. 14, 2017

(54) ORGANIC SEMICONDUCTOR DOPING PROCESS

(71) Applicant: ISIS INNOVATION LIMITED, Oxfordshire (GB)

(72) Inventors: Henry Snaith, Oxfordshire (GB); Tomas Leijtens, Oxfordshire (GB); Antonio Abate, Oxfordshire (GB); Alan Sellinger, Golden, CO (US)

(73) Assignee: OXFORD UNIVERSITY INNOVATION LIMITED, Oxford (GB)

( * ) Notice: Subject to any disclaimer, the term of this patent is extended or adjusted under 35 U.S.C. 154(b) by 53 days.

(21) Appl. No.: 15/132,413

(22) Filed: Apr. 19, 2016

(65) Prior Publication Data

US 2016/0240781 A1    Aug. 18, 2016

Related U.S. Application Data

(63) Continuation of application No. 14/894,187, filed as application No. PCT/GB2014/051664 on May 30, 2014.

(30) Foreign Application Priority Data

May 30, 2013    (GB) .................................. 1309668.0

(51) Int. Cl.
*H01L 51/42*    (2006.01)
*H01L 51/00*    (2006.01)
(Continued)

(52) U.S. Cl.
CPC ......... *H01L 51/002* (2013.01); *H01G 9/0029* (2013.01); *H01G 9/2027* (2013.01);
(Continued)

(58) Field of Classification Search
CPC . H01L 51/002; H01L 51/005; H01L 51/4226; H01L 51/006; H01G 9/0029; H01G 9/2059; H01G 9/2027
See application file for complete search history.

(56) References Cited

U.S. PATENT DOCUMENTS 5,185,100 A    2/1993    Han et al.
6,416,887 B1    7/2002    Tokito
(Continued)

FOREIGN PATENT DOCUMENTS

EP    1289030    3/2003
WO    WO 2008/154914    12/2008

OTHER PUBLICATIONS

Tigelaar et al., "Study of the Incorporation of Protic Ionic Liquids into Hydrophilic and Hydrophobic Rigid-Rod Elastomeric Polymers," Polymer, 47(12), pp. 4269-4275, 2006.
(Continued)

*Primary Examiner* — Douglas Menz
(74) *Attorney, Agent, or Firm* — Kenneth H. Sonnenfeld; Bryte V. Kelly; King & Spalding LLP

(57) ABSTRACT

The present invention relates to the doping of organic semiconductors and processes for producing layers of p-doped organic semiconductors. Disclosed is a process for p-doping organic semiconductors comprising treating the organic semiconductor with an oxidized salt of the organic semiconductor. A process for producing a layer of a p-doped organic semiconductor comprising producing a p-doped organic semiconductor by treating the organic semiconductor with an oxidized salt of the organic semiconductor; disposing a composition comprising a solvent and the p-doped organic semiconductor on a substrate; and removing the solvent is also described. Also disclosed is a process for producing a layer of a p-doped organic semiconductor comprising: disposing a composition comprising a solvent,
(Continued)

the organic semiconductor and a protic ionic liquid on a substrate; and removing the solvent. A process for producing a semiconductor device comprising a process for doping an organic semiconductor according to the invention is also described. Finally, a high purity p-dopant composition is described.

41 Claims, 10 Drawing Sheets

(51) Int. Cl.
H01G 9/00 (2006.01)
H01G 9/20 (2006.01)
(52) U.S. Cl.
CPC ......... *H01G 9/2059* (2013.01); *H01L 51/005* (2013.01); *H01L 51/006* (2013.01); *H01L 51/4226* (2013.01); *H01G 9/2013* (2013.01); *H01L 51/0035* (2013.01); *H01L 51/0036* (2013.01); *H01L 51/0056* (2013.01); *H01L 51/0059* (2013.01); *H01L 2251/305* (2013.01); *Y02E 10/542* (2013.01); *Y02E 10/549* (2013.01)

(56) References Cited

U.S. PATENT DOCUMENTS

| | | | |
|---|---|---|---|
| 6,830,830 | B2 | 12/2004 | Hsieh et al. |
| 7,540,978 | B2 | 6/2009 | Pfeiffer et al. |
| 7,622,220 | B2 | 11/2009 | Kim et al. |
| 7,821,000 | B2 | 10/2010 | Kloc et al. |
| 2006/0263661 | A1 | 11/2006 | Takizawa et al. |
| 2007/0231647 | A1 | 10/2007 | Ohno |
| 2009/0220839 | A1 | 9/2009 | Oyama et al. |
| 2010/0171092 | A1 | 7/2010 | Yoon et al. |
| 2011/0097624 | A1 | 4/2011 | Bhatt et al. |
| 2011/0108772 | A1 | 5/2011 | Zeika et al. |
| 2011/0156019 | A1 | 6/2011 | Tessler et al. |
| 2012/0017995 | A1 | 1/2012 | Pschirer et al. |
| 2012/0192945 | A1 | 8/2012 | Kuhn et al. |
| 2013/0291941 | A1 | 11/2013 | Vail et al. |

OTHER PUBLICATIONS

Oxford University Innovation Limited, Communication Pursuant to Article 94(3) EPC for European Patent Application No. 14728261.0, 7 pages, Jun. 16, 2017.
Abate et al, "Protic Ionic Liquids as p-Dopant for Organic Hole Transporting Materials and Their Application in HIgh Efficiency Hybrid Solar Cells," J. Am. Chem. Soc., 135, pp. 13538-13548, 2013.
Abate et al., "Lithium Salts as "Redox Active" p-type Dopants for Organix Semiconductors and Their Impact in Solid-State Dye-Sensitized Solar Cells," Physical Chemistry Chemical Physics, 15, pp. 2572-2579, 2013.
Abrusci et al., "Influence of Ion Induced Local Coulomb Field and Polarity on Charge Generation and Efficiency in Poly(3-Hexylthiophene)-Based Solid-State Dye-Sensitized Solar Cells," Advanced Functional Materials, 21, pp. 2571-2579, 2011.
Armand et al., "Ionic-liquid materials for the electrochemical challenges of the future," Nature materials, 8, pp. 621-629, 2009.
Bach, et al., "Solid-state Dye-Sensitized Mesoporous $TiO_2$ Solar Cells Showing High Photon to Electron Conversion Efficiencies," Nature, 395, pp. 583-585, 1998.
Bach, "Solid-State Dye-Sensitized Mesoporous $TiO_2$ Solar Cells," Thesis No. 2187 (2000), EPFL, 2000.
Ball et al., "Low-temperature processed meso-superstructured to thin-film perovskite solar cells," Energy Environ. Sci., 6, pp. 1739-1743, 2013.
Blochwitz et al., "Interface Electronic Structure of Organic Semicondutors with Controlled Doping Levels," Organic Electronics, 2, pp. 97-104, 2001.
Burschka, et al., "Tris(2-(1H-pyrazol-1-yl)pyridine)cobalto(III) as p-Type Dopant for Organic Semiconductors and its Application in Highly Efficient Solid-State Dye-Sensitized Solar Cells," Journal of the American Chemical Society, 133, pp. 18042-18045, 2011.
Cappel et al., "Characterization of the Interface Properties and Processes in Solid State Dye-Sensitized Solar Cells Employing a Perylene Sensitizer," The Journal of Physical Chemistry C, 115, pp. 4345-4358, 2011.
Cappel, "Oxygen-Induced Doping Spiro-MeOTAD in Solid-State Dye-Sensitized Solar Cells and its Impact on Device Performance," Nano Letters, 12, pp. 4925-4931, 2012.
Chiang et al., "Electrical Conductivity in Doped Polyacetylene," Physical Review Letters, 39(17), pp. 1098-1101, 1977.
Coakley et al., "Conjugated Polymer Photovoltaic Cells," Chemistry of Materials, 16, pp. 4533-4542, 2004.
Cole et al., "Novel Bronsted Acidic Ionic Liquids and Their Use as Dual Solvent-Catalysts," J. Am. Chem. Soc., 124, pp. 5962-5963, 2002.
D'Andrade et al., "Operational stability of electrophosphorescent devices containing p and n doped transport layers," Applied physics letters, 83, pp. 3858-3860, 2003.
dos Santos et al., Protonic Doping Effects on the Electronic Behavior of Poly(P-Phenylene-CO-2, 5-Pyrazine), Solid State Communications, 74(4), pp. 215-217, 1990.
Fabregat-Santiago et al., "Cyclic Voltammetry Studies of Nanoporous Semiconductors. Capacitive and Reactive Properties of Nanocrystalline $TiO_2$ Electrodes in Aqueous Electrolyte," The Journal of Physical Chemistry B, 107, pp. 758-768, 2003.
Fantacci et al., "Electronic and Optical Properties of the Spiro-MeOTAD Hole Conductor in its Neutral and Oxidized Forms: A DFT/TDDFT Investigation," The Journal of Physical Chemistry C, 115, pp. 2316-23133, 2011.
Fredin et al., "The influence of cations on charge accumulation in dye-sensitized solar cells," Journal of Electroanalytical Chemistry, 609, pp. 55-60, 2007.
Greaves et al, "Protic Ionic Liquids: Properties and Applications," Chem. Rev. 108, pp. 206-237, 2008.
Greenham et al., "Efficient Light-Emitting Diodes Based on Polymers with High Electron Affinities," Nature, 365, pp. 628-630, 1993.
Greiner et al., "Universal energy-level alignment of molecules on metal oxides," Nature materials, 11, pp. 76-81, 2011.
Gregg et al., "Coulomb Forces and Doping in Organic Semiconductors," Chem. Mater., 16, pp. 4586-4599, 2004.
Han et al., "Protonic Acids: Generally Applicable Dopants for Conducting Polymers," Synthetic metals, 30, pp. 123-131, 1989.
Hodes et al., "All-Solid-State, Semiconductor-Sensitized Nanoporous Solar Cells," Accounts of Chemical Research 45(5), pp. 705-713, 2012.
Horiuchi et al., "High Efficiency of Dye-Sensitized Solar Cells Based on Metal-Free Indoline Dyes," J. Am. Chem. Soc. 126, pp. 12218-12219, 2004.
Horiuchi et al., "Highly-efficient metal-free organic dyes for dye-sensitized solar cells,", Chemical Communications, pp. 3036-3037, 2003.
Horowitz, "Organic Field-Effect Transistors," Advanced Materials, 10(5), pp. 365-377, 1998.
Hu et al., "A Multilevel Memory Based on Proton-Doped Polyazomethine with an Excellent Uniformity in Resistive Switching," Journal of the American Chemical Society, 134, pp. 17408-17411, 2012.
Jiang et al., "Doping-Induced Change of Carrier Mobilities in poly(3-hexylthiophene) Films with Different Stacking Structures," Chemical Physics Letters, 364, pp. 616-620, Oct. 16, 2002.
Kamat, "Quantum Dot Solar Cells. Semiconductor Nanocrystals as Light Harvesters," J. Phys. Chem. C, 112, pp. 18737-18753, 2008.
Kelly et al., "Cation-Controlled Interfacial Charge Injection in Sensitized Nanocrystalline $TiO_2$," Langmuir, 15, pp. 7047-7054, 1999.

(56) References Cited

OTHER PUBLICATIONS

Koops et al., "Parameters Influencing the Efficiency of Electron Injection in Dye-Sensitized Solar Cells," Journal of the American Chemical Society, 131, pp. 4808-4818, 2009.

Kopidakis et al., "Transport-Limited Recombination of Photocarriers in Dye-Sensitized Nanocrystalline $TiO_2$ Solar Cells," The Journal of Physical Chemistry B, 107, pp. 11307-11315, 2003.

Kroeze et al., "Parameters Influencing Charge Separation in Solid-State Dye-Sensitized Solar Cells Using Novel Hole Conductors," Advanced Functional Materials, 16, pp. 1832-1838, 2006.

Kruger et al., "High efficiency solid-state photovoltaic device due to inhibition of interface charge recombination," Applied Physics Letters, 79, 2085-2087, 2001.

Lee, et al., "Efficient Hybrid Solar Cells Based on Meso-Superstructured Organometal Halide Perovskites," Science, 338, pp. 643-647, 2012.

Leijtens et al., "Hole Transport Materials with Low Glass Transition Temperatures and High Solubility for Application in Solid-State Dye-Sensitized Solar Cells," ACS Nano, 6(2), pp. 1455-1462, 2012.

Lunell et al., "Li and Na Diffusion in $TiO_2$ from Quantum Chemical Theory versus Electrochemical Experiment," Journal of the American Chemical Society, 119, pp. 7374-7380, 1997.

MacDiarmid, "Synthetic Metals": A Novel Role for Organic Polymers (Nobel Lecture), Angewandte Chemie International Edition, 40, pp. 2581-2590, 2001.

MacDiarmid et al., "Organic Metals and Semicondutors: The Chemistry of Polyacetylene, $(CH)_x$, and its Derivatives," Synthetic metals, Advanced Study Institute on the Physics and Chemistry of Low-Dimensional Solids, Tomar, Portugal, 1979.

Margaretta et al., "Doped Polyaniline in Bronsted Acid Ionic Liquid 1-butyl-3-methylimidazolium bis[trifluoromethyl(sulfonyl)]imide/bis[trifluoromethyl (sulfonyl)imide," Journal of Applied Polymer Science, 127(4) pp. 2453-2457, 2012.

Mosconi et al., "Cobalt Electrolyte/Dye Interactions in Dye-Sensitized Solar Cells: A Combined Computational and Experimental Study," J. Am. Chem. Soc., 134, pp. 19438-19453, 2012.

Nam et al., "Doping Effect of Organosulfonic Acid in Poly(3-hexylthiophene) Films for Organic Field Transistors," ACS Applied Materials & Interfaces, 4, pp. 1281-1288, 2012.

Nazeeruddin et al., "Investigation of Sensitizer Adsorption and the Influence of Protons on Current and Voltage of a Dye-Sensitized Nanocrystalline $TiO_2$ Solar Cell," The Journal of Physical Chemistry B, 107, pp. 8981-8987, 2003.

Nicolai et al., "Unification of trap-limited electron transport in semiconducting polymers," Nature materials, 11, pp. 882-887, 2012.

Ott et al., "Nanoclusters in Ionic Liquids: Evidence for N-Heterocyclic Carbene Formation from Imidazolium-Based Ionic Liquids Detected by $^2$H NMR," Journal of the American Chemical Society, 127, pp. 5758-5759, 2005.

Pfeiffer et al., "Doped organic semiconductors: Physics and application in light emitting diodes," Organic Electronics, 4, pp. 89-103, 2003.

Planells et al, "Diacetylene Bridged Triphenylamines as Hole Transport Materials for Solid State Dye Sensitized Solar Cells," J. Mater. Chem. A, 1, pp. 6949-6960, 2013.

Poplayskyy et al., "Nondispersive hole transport in amorphous films of methoxy-spirofluorene-arylamine organic compound," Journal of Applied Physics, 93, pp. 341-346, 2003.

Riede et al., "Efficient Organic Tandem Solar Cells based on Small Molecules," Advanced Functional Materials, 21, pp. 3019-3028, 2011.

Schölin et al., "Energy Level Shifts in Spiro-OMeTAD Molecular Thin Films When Adding Li-TFSI," The Journal of Physical Chemistry C, 116, pp. 26300-26305, 2012.

Schmidt-Mende et al., "Organic Dye for Highly Efficient Solid State Dye-Sensitized Solar Cells," Advanced Materials, 17, pp. 813-815, 2005.

Shen et al., "How to Make Ohmic Contacts to Organic Semiconductors," ChemPhysChem, 5, pp. 16-25, 2004.

Sirringhaus et al., "Integrated Optoelectronic Devices Based on Conjugated Polymers," Science, 280, pp. 1741-1744, 1998.

Snaith et al., "Enhanced Charge Mobility in a Molecular Hole Transporter via Addition of Redox Inactive Ionic Dopant: Implication to Dye-Sensitized Solar Cells," Applied Physics Letters, 89, p. 262114-1-262114-3, 2006.

Snaith et al., "Optically-Pumped Lasing in Hybrid Organic-Inorganic Light-Emitting Diodes," Advanced Functional Materials, 19, pp. 2130-2136, 2009.

Snaith, "How should you measure your excitonic solar cells?" Energy & Environmental Science, 5, pp. 6513-6520, 2012.

Snaith et al., "Dye-Sensitized Solar Cells Incorporating a "Liquid" Hole-Transporting Material," Nano Letters, 6(9), pp. 2000-2003, 2006.

Spangler et al., "Protonic Doping of Bis-thienylpolyenes and Oligomers of Poly(2,5-thienylenevinylene): Comparison to Oxidative Chemical Doping," J. Chem. Soc., Chem. Commun., pp. 253-254, 1992.

Unger et al., "Hysteresis and transient behavior in current-voltage measurements of hybrid-perovskite absorber solar cells," Energy and Environmental Science, pp. 1-10, 2013.

Vaddiraju et al., "Radical Salt-Doped Hole Transporters in Organic Photovoltaic Devices," Chemistry of Materials, 19, pp. 4049-4055, 2007.

Vasilopoulou et al., "The Influence of Hydrogenation and Oxygen Vacancies on Molybdenum Oxides Work Function and Gap States for Application in Organic Optoelectronics," Journal of the American Chemical Society, 134, pp. 16178-16187, 2012.

Wang et al., "A Comparison of Different Methods to Determine the Electron Diffusion Length in Dye-Sensitized Solar Cells," The Journal of Physical Chemistry C, 113, pp. 18125-18133, 2009.

Wei, et al., "Use of a 1H-Benzoimidazole Derivative as an n-Type Dopant and to Enable Air-Stable Solution-Processed n-Channel Organic Thin-Film Transistors," Journal of the American Chemical Society, 132, pp. 8852-8853, 2010.

Wren et al., "C—H Bond Strengths and Acidities in Aromatic Systems: Effects of Nitrogen Incorporation in Mono-, Di-, and Triazines," Journal of the American Chemical Society, 134, pp. 6584-6596, 2012.

Xia et al., "Influence of Doped Anions on Poly(3,4-ethylenedioxythiophene) as Hole Conductors for Iodine-Free Solid-State Dye-Sensitized Solar Cells," Journal of the American Chemical Society, 130, pp. 1258-1263, 2008.

Yanagida et al., "Iodine/Iodide-Free Dye-Sensitized Solar Cells," Accounts of Chemical Research, 42(11), pp. 1827-1838, 2009.

Yu et al., "Conductivity and Spectroscopic Investigation of Bis(trifluoromethanesulfonyl)imide Solution in Ionic Liquid 1-Butyl-3-Methylimidazolium Bis(trifluoromethanesulfonyl)imide," J. Phys. Chem. B, 116, pp. 6553-6560, 2012.

Zeng, et al., "Efficient Dye-Sensitized Solar Cells with an Organic Photosensitizer Featuring Orderly Conjugated Ethylenedioxythiophene and Dithienosilole Blocks," Chem. Mater., 22, pp. 1915-1925, 2010.

Zhang et al, "Thermoelectric energy from flexible P3HT films doped with a ferric salt of triflimide anions", Energy Environ Sci, pp. 1-6, 2012.

Zhu et al., "Hydride, Hydrogen Atom, Proton, and Electron Transfer Driving Forces of Various Five-Membered Heterocyclic Organic Hydrides and Their Reaction Intermediates in Acetonitrile," Journal of the American Chemical Society, 130, pp. 2501-2516, 2008.

ORGANIC SEMICONDUCTOR DOPING PROCESS

This invention was made with Government support under Grant No. N00014-11-1-0244, awarded by the Office of Naval Research. The Government has certain rights in this invention.

FIELD OF THE INVENTION

The present invention relates to processes for the production of p-doped organic semiconductors. The invention also relates to a process for producing layers of p-doped organic semiconductors. Processes for producing devices comprising p-doped organic semiconductors and layers thereof are also disclosed, along with compositions, layers and devices.

The work leading to this invention has received funding from the European Research Council under the European Union's Seventh Framework Programme (FP7/2007-2013)/ERC grant agreement No. 279881.

BACKGROUND OF THE INVENTION

Organic semiconductors (OSs) are now controlling the electronics market in different stages of development for a wide range of applications and are expected to dominate over the next few decades. Key factors driving penetration of organic electronics in the mainstream market are their low cost for fabrication and high degree of flexibility. Since their sensational discovery in 1977 several studies have shown the possibility to modulate their properties for the specific application using chemical doping. Conceptually similar to inorganic semiconductors, chemical doping introduces impurities into the organic semiconductors which increase the density of mobile charge carriers and thus conductivity. In reality, chemical doping can involve several different mechanisms depending on both the semiconductor and the dopant. One of the first described mechanisms was the protonic acid (H) doping of polyacetylene. This was accomplished by immersing polyacetylene in an aqueous hydrochloric acid solution. Drying the polymer leaves residual $H_3O^+$ groups in the organic matrix which increase the density of mobile charge carriers by partially withdrawing electrons from the conjugated chains. The resulting p-doped organic semiconductor shows an increase in conductivity of around 10 orders of magnitude. Following this, $H^+$ treatment has been reported as a general doping route for many conjugated polymers. Recently, several heterocyclic organic hydrides have been reported as efficient n-type dopants by releasing hydride ($H^-$) or hydrogen atoms (H.) (P. Wei, J. H. Oh, G. Dong and Z. Bao, Journal of the American Chemical Society, 2010, 132, 8852-8853). In particular, 1,3-dimethyl-2-phenyl-2,3-dihydro-1H-benzoimidazole derivatives (DMBI) can increase the conductivity of [6,6]-phenyl $C_{61}$ butyric acid methyl ester (PCBM) by more than 4 order of magnitude. After the H. release, the highly energetic DMBI radicals can inject electrons in the PCBM increasing the density of mobile charge carriers in the organic semiconductor matrix. The stability of this doping mechanism depends on the rate of back electron transfer from the doped PCBM to the DMBI cation, which can be stabilized by electron-rich substituent on DMBI core. This mechanism has been effectively applied to prepare air stable organic thin film transistors. Many other organic electronic applications can benefit from chemical doping: e.g., triphenylamine-based organic semiconductors have been p-doped with Co(III) complexes in solid-state dye-sensitized solar cells (ss-DSSCs) (J. Burschka, A. Dualeh, F. Kessler, E. Baranoff, N. L. Cevey-Ha, C. Yi, M. K. Nazeeruddin and M. Grätzel, Journal of the American Chemical Society, 2011) and tetracyano-quinoline derivatives in organic light emitting diodes (B. W. DAndrade, S. R. Forrest and A. B. Chwang, Applied physics letters, 2003, 83, 3858-3860). Both applications benefit from the introduction of a p-doped transport layer since it reduces the charge transport resistance in series with the p-n junction and helps to achieve ohmic contacts. Furthermore, chemical doping also enables the fabrication of tandem structures for efficient organic solar cells using a versatile recombination contact.

However, most of the dopants reported in scientific literature have never been effectively applied in electronic device, since they are incompatible with solution-processed materials or they demonstrate weak doping effects, which makes the device unstable in working conditions. Due to the beneficial characteristics of protic ionic liquids (PILs), such as good solvation and strong acidity, solution-processable and effective doping techniques have been found using PILs.

Organic semiconductors (OSs) are commonly employed in photovoltaics, organic light emitting diodes (LEDs), and organic transistors. One family of commonly employed organic semiconductors as hole transporting materials (HTMs) are triphenylamines (also known as triarylamines) and their derivatives. These have been successfully employed in dye-sensitized solar cells (U. Bach, D. Lupo, P. Comte, J. E. Moser, F. Weissortel, J. Salbeck, H. Spreitzer and M. Gratzel, Nature, 1998, 395, 583-585). Triphenylamine derivatives often benefit from wide bandgaps and easily tunable HOMO levels, making them especially promising as HTMs for solid-state dye-sensitized solar cells (ss-DSSCs) where the light is absorbed by a sensitizing dye. However, this class of HTMs suffers from low hole mobilities, with one of the most commonly employed triphenylamine HTM (spiro-OMeTAD) having mobilities between $10^{-5}$ and $10^{-4}$ $cm^2 V^{-1}s^{-1}$ in working device conditions. As a result, these materials have been doped by a variety of molecular oxidants in attempts to minimize the resistance to charge transport in the HTM component of ss-DSSCs (U. Bach, EPFL, 2000; H. J. Snaith et al., Nano Letters, 2006, 6, 2000-2003).

However, these "in situ" doping approaches have several drawbacks. It is difficult to establish the efficiency of the oxidation, and it is difficult to distinguish what degree of oxidation occurs in the initial HTM spin-coating solution compared to in the final film. The long-term stability of the oxidised product in the final device structure is often poor, or may even vary with ambient conditions such as humidity, temperature and light exposure. Moreover, these approaches to doping result in the oxidation products staying in the film, so that the final device incorporates impurities that do not serve any beneficial function and may even hinder device performance and long-term stability. As can be expected, these in-situ doping processes result in a great deal of variability in final device performance.

SUMMARY OF THE INVENTION

The invention provides effective methods to p-dope organic semiconductors that can be employed in semiconducting devices, and which are typically employed as HTM's in dye-sensitized solar cells (DSSCs) and meso-super structured solar cells (MSSCs). The inventors have found that doping such organic semiconductors with an oxidised salt of the organic semiconductor, or with a protic ionic liquid, can be extremely effective.

To bypass the aforementioned problems associated with doping by molecular dopants, the present inventors have introduced a pure, oxidised salt of the organic semiconductor directly into the HTM in order to "p-dope" the HTM. As described in the experimental Examples, the HTM is initially oxidised to the first oxidised state with close to 100% efficiency, the oxidation product is isolated, and an anion exchange is then performed to yield an oxidised salt of the HTM. The bis(trifluoro-methanesulfonyl)imide (TFSI) anion amongst others has been shown to be very effective, which is thought to be due to its large size and the delocalisation of its negative charge. The oxidised salt of the HTM is then used to directly and quantitatively "p-dope" the pure HTM by incorporation of a controlled charge carrier density without the addition of any inactive impurities.

Thus, novel techniques for doping organic semiconductors are provided herein which advantageously allow the extent of doping to be controlled independently of the addition of other additives and are compatible with solution-processed materials.

Accordingly, the invention provides a process for producing a p-doped organic semiconductor comprising treating an organic semiconductor with a composition comprising an oxidised salt of the organic semiconductor. Typically, the oxidised salt of the organic semiconductor is obtainable by a process comprising:

(a) treating the organic semiconductor with an oxidant to produce an oxidation product;

(b) isolating the oxidation product;

(c) performing an anion exchange with a suitable anion; and (d) isolating the oxidised salt of the organic semiconductor.

The invention also provides a process for producing a p-doped organic semiconductor comprising treating an organic semiconductor other than polyaniline with a protic ionic liquid.

Typically, the organic semiconductor which is treated with the protic ionic liquid is an organic semiconductor comprising a triarylamine moiety, an organic semiconductor comprising a conjugated polymer other than polyaniline, an organic semiconductor comprising a conjugated oligomer, or an organic semiconductor comprising a polycyclic aromatic hydrocarbon.

The organic semiconductor which is treated with the protic ionic liquid may for instance comprise a compound of formula (V), (I), (II), (III), (IV), (VI) or (VII):

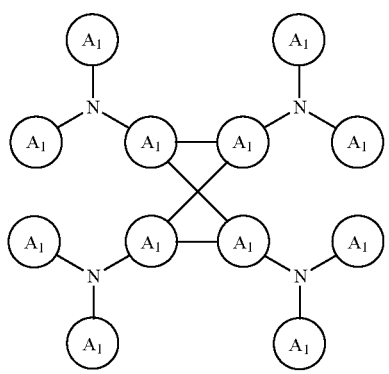

(V)

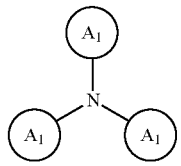

(I)

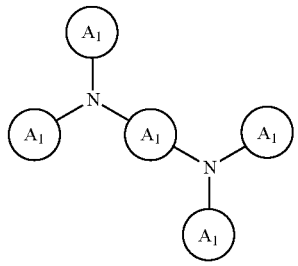

(II)

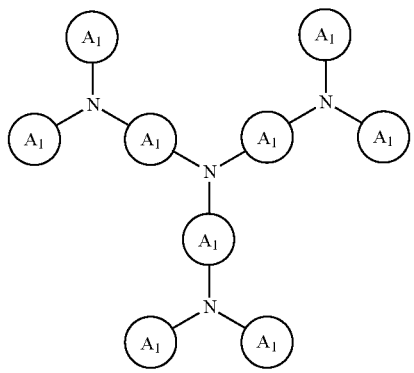

(III)

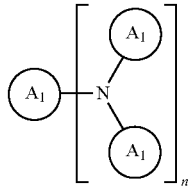

(IV)

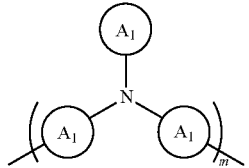

(VI)

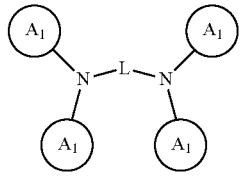

(VII)

wherein:
each $A_1$ is the same or different and is an unsubstituted or substituted aryl ring or an unsubstituted or substituted heteroaryl ring;
L is a conjugated linker;
n is 3 or 4; and
m is an integer of 2 or more.

Alternatively, for instance, the organic semiconductor which is treated with the protic ionic liquid may comprise unsubstituted or substituted polythiophene, such as poly(3- hexylthiophene), or an unsubstituted or substituted oligothiophene, such as sexithiophene.

The invention also provides a process for producing a layer of a p-doped organic semiconductor comprising disposing on a substrate an organic semiconductor and a protic ionic liquid.

Further, the invention provides a layer of a p-doped organic semiconductor comprising an organic semiconductor and a protic ionic liquid.

Also provided is a process for producing a semiconductor device comprising
a step of producing a p-doped organic semiconductor by a process according to the invention; or
a step of producing a layer of a p-doped organic semiconductor by a process according to the invention.

The process for producing a semiconductor device according to the invention may comprise:

(a) disposing on a first electrode material at least one layer of a semiconductor material to produce a resulting substrate comprising a first electrode material and at least one layer of a semiconductor material;

(b) sensitizing the resulting substrate to produce a sensitized substrate; and (c) producing a layer of a p-doped organic semiconductor on the sensitized substrate by a process according to the invention.

Also provided is a semiconductor device which comprises a layer of a p-doped organic semiconductor wherein the layer of a p-doped semiconductor comprises an organic semiconductor and a protic ionic liquid.

The invention also provides a composition which comprises from 50 to 100 wt % of an oxidised salt of an organic semiconductor according to formula (VIII)

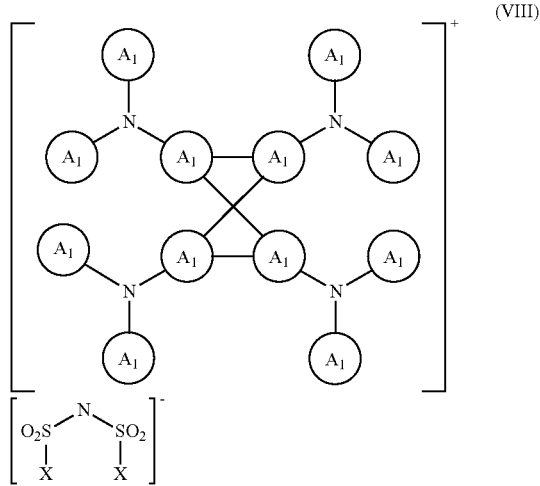

wherein each $A_1$ is the same or different and is an unsubstituted or substituted aryl ring or an unsubstituted or substituted heteroaryl ring; and X is a $C_{1-8}$-haloalkyl group. Typically, the $C_{1-8}$-haloalkyl group, X, is a $C_{1-8}$-perhaloalkyl group.

DETAILED DESCRIPTION OF THE INVENTION

Figure 1:
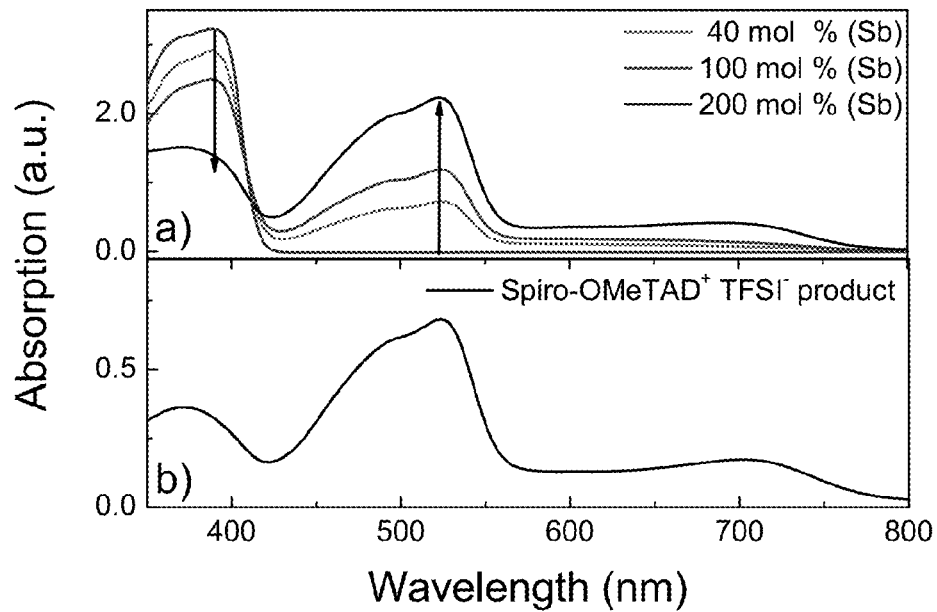
FIG. 1 shows (a) UV-vis spectra of Spiro-OMeTAD in chlorobenzene at varying oxidant (Sb) concentrations. (b) UV-vis spectrum of the Spiro-OMeTAD$^+$ TFSI$^-$ product in chlorobenzene.

The inventors have found that by doping an organic semiconductor either by treating it with an oxidised salt of the organic semiconductor or by treating it with a protic ionic liquid, the high conductivities required for effective semiconductor device performance may be achieved without the need for the addition of any extraneous additives. Furthermore, methods using oxidised organic semiconductor salts or protic ionic liquids produce doped organic semiconductors which show improved long-term atmospheric stability. Methods using PILS are generally solution-processable due to the solubility of PILs.

In particular, the methods described herein allow the effects of p-doping the hole transport material/organic semiconductor to be separated from the effects of ionic additives on charge generation, separation and collection. This is a novel concept.

The invention provides a process for producing a p-doped organic semiconductor comprising treating the organic semiconductor with a composition comprising an oxidised salt of the organic semiconductor.

Here, the organic semiconductor referred to in the term "oxidised salt of the organic semiconductor" is the same as or similar to the organic semiconductor to be treated and thence doped. Typically the oxidised salt comprises an organic semiconductor (generally in a cationic form) which is the same as the organic semiconductor to be doped. If the oxidised salt of the organic semiconductor comprises a cationic/oxidised form of an organic semiconductor which is similar to the organic semiconductor to be doped, this means that the structures of the two organic semiconductors differ in only a small number of aspects, for example they might differ in from 1 to 10 aspects or from 2 to 8 aspects. An aspect may be the identity, presence or absence of a substituent. Or an aspect may be the presence or absence of a heteroatom in place of a carbon or vice versa.

The term "doping", as used herein, refers to a process of introducing impurities into a semiconductor in order to alter the electronic properties of the semiconductor. Often, impurities are introduced to increase the conductivity of the semiconductor. Doping alters the charge carrier concentration in the semiconductor. The term "p-doping", as used herein, refers to a doping process in which the impurities introduced increase the number of charge carriers which are holes or charge acceptors. When a semiconductor is p-doped it forms a semiconductor in a p-type region. P-doping introduces electron acceptors into the semiconductor. This is in contrast to n-doping which introduces electron donors into the semiconductor. Cationic forms of organic semiconductor molecules, be they protonated or ionised, may act as p-dopants by accepting electrons from the organic semiconductor. P-doped organic semiconductors are useful as they may act as hole transport materials (HTMs). The terms "p-doped organic semiconductor" and "hole transport material" may be used interchangeably herein.

The term "organic semiconductor", as used herein, refers to an organic material with electrical conductivity intermediate in magnitude between that of a conductor and an insulator. Typically, an organic semiconductor is an organic material that has a conductivity of from $10^3$ to $10^{-8}$ Scm$^{-1}$. Standard techniques such as a 4-point probe conductivity measurement may be used to measure conductivity. The term "organic material", as used herein, refers to a material which comprises mostly (e.g. greater than 50 wt % or greater than 80 wt %) of one or more organic compounds. Typically an organic semiconductor will comprise greater than 90 wt % of one or more organic compounds. Materials used as semiconductors are often of high purity and accordingly an organic semiconductor may be a semiconducting material which consists essentially of an organic compound with semiconducting properties. Organic semiconductors may comprise one or more organic compounds with semiconducting properties, but often comprise or consist essentially of a single organic compound.

The term "oxidised salt of an organic semiconductor", as used herein, refers to a salt which comprises an oxidised form of an organic semiconductor. In most cases this means that the salt comprises a cation which is derived from an organic semiconductor, typically by the loss of one or more electrons from (i.e. the oxidation of) the organic semiconductor. Accordingly, often the oxidised salt of the organic semiconductor is a salt which comprises as a cation a positively charged form of molecules of the organic semiconductor. As is described below, this oxidised salt may be obtained by treating the organic semiconductor with an oxidant and then performing an anion exchange. The oxidised salt of the organic semiconductor acts as a p-dopant.

The oxidised salt of the organic semiconductor will comprise an anion suitable for use in a doped organic semiconductor. For example, the anion may be as defined for A below.

The process of the invention allows accurate, air stable doping to be carried out as the amount of dopant can be controlled with ease. Often, the oxidised salt of the organic semiconductor will be isolated at a reasonably high purity as this will allow control over the extent of doping. Accordingly, the process for p-doping the organic semiconductor may comprise treating the organic semiconductor with a composition comprising from 80 to 100 wt % of the oxidised salt of the organic semiconductor. Occasionally, the process comprises treating the organic semiconductor with a composition comprising from 90 to 100 wt %, from 95 to 100 wt % or from 98 to 100 wt % of the oxidised salt of the organic semiconductor. Thus, in some embodiments, the composition consists only of the oxidised salt of the organic semiconductor. Typically, however, the composition comprises the oxidised salt of the organic semiconductor and one or more further components. Generally, the one or more further components may be unreacted reagents from the process for producing the oxidised salt. For instance, the composition may further comprise residual solvent, unreacted oxidant and/or unoxidised organic semiconductor. In some cases a composition consisting essentially of the oxidised salt of the organic semiconductor may be used to treat the organic semiconductor. The term "consisting essentially of", as used herein, refers to a composition consisting of the given components together with any other components which are not specified provided that these additional components do not have a material affect on the functioning of the composition and are present in an amount of less than 2 wt %.

Any organic semiconductor may be treated by the process of the invention. In one embodiment, the organic semiconductor comprises an organic semiconductor comprising a triarylamine moiety, an organic semiconductor comprising a conjugated polymer, an organic semiconductor comprising a conjugated oligomer, or an organic semiconductor comprising a polycyclic aromatic hydrocarbon. Preferably, the organic semiconductor comprises a triarylamine moeity. Semiconductors comprising a triarylamine moiety are occasionally known as triarylamine semiconductors or triphenylamine semiconductors.

The term "organic semiconductor comprising a triarylamine moiety", as used herein, refers to an organic semiconductor which comprises one or more moieties which are a nitrogen atom substituted with three substituted or unsubstituted aryl or heteroaryl rings. The simplest such semiconductor is triphenylamine, $N(C_6H_5)_3$. There are many forms of triarylamine semiconductors. Some may have the form of a central nitrogen atom substituted with three substituted or unsubstituted aryl or heteroaryl groups.

Often, the organic semiconductor comprises a compound of formula (V), (I), (II), (III) (IV), (VI) or (VII):

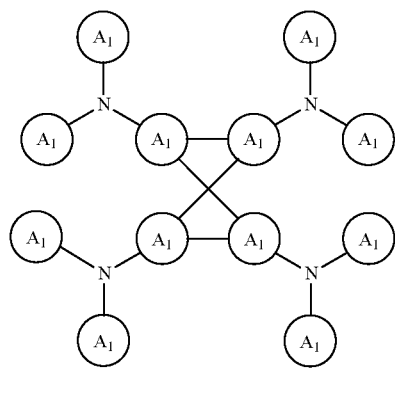
(V)

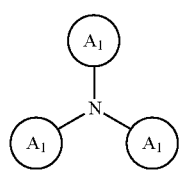
(I)

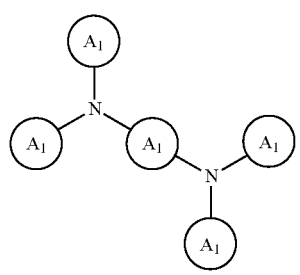
(II)

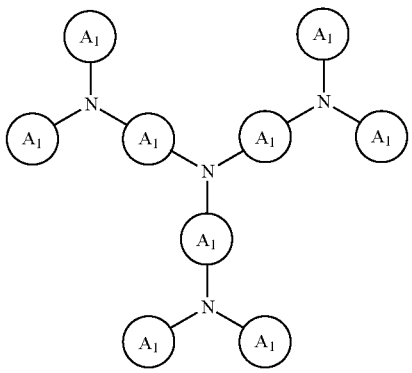
(III)

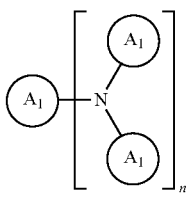
(IV)

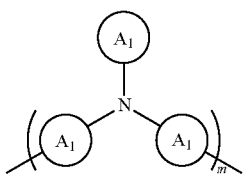
(VI)

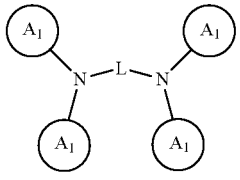
(VII)

wherein:
each $A_1$ is the same or different and is an unsubstituted or substituted aryl ring or an unsubstituted or substituted heteroaryl ring;
L is a conjugated linker;
n is 3 or 4; and
m is an integer of 2 or more.

In some embodiments, the organic semiconductor comprises a compound of formula (V), (I), (II), (III), (IV) or (VI) as defined above. In some embodiments, for instance, the organic semiconductor comprises a compound of formula (V), (I), (II), (III) or (IV) as defined above.

In some cases, two aryl or heteroaryl rings which are adjacent or bonded to the same nitrogen may be bonded to each other (for example to form a carbazole moiety).

$A_1$ may be any aryl or heteroaryl ring as defined below, and may, for example, be selected from unsubstituted or substituted benzene, unsubstituted or substituted naphthalene, unsubstituted or substituted anthracene, unsubstituted or substituted pyrene, unsubstituted or substituted pyridine, unsubstituted or substituted pyrrole, or unsubstituted or substituted thiophene. These rings may be bonded through any atom in the aromatic ring (and typically through a carbon atom in the case of heteroaryl rings).

Examples of triarylamine semiconductors include triphenylamine, tri(4-methylphenyl)amine, 1,4-bis(diphenylamino)benzene, 1,3-bis(N-carbazolyl)benzene, 4,4'-bis (N-carbazolyl)-1,1'-biphenyl, 4,4'-bis(3-ethyl-N-carbazolyl)-1,1'-biphenyl, N,N'-bis(3-methylphenyl)-N,N'-diphenylbenzidine, N,N'-bis(phenanthren-9-yl)-N,N'-diphenylbenzidine, 4,4'-cyclohexylidenebis[N,N-bis(4-methylphenyl)benzenamine], 2,2'-dimethyl-N,N'-di-[(1-naphthyl)-N,N'-diphenyl]-1,1'-biphenyl-4,4'-diamine, 9,9-dimethyl-N,N'-di(1-naphthyl)-N,N'-diphenyl-9H-fluorene-2,7-diamine, N,N,N',N'-tetrakis(4-methoxyphenyl)benzidine, N,N,N,N'-tetrakis(3-methylphenyl)-3,3'-dimethylbenzidine, 4-(diphenylamino)benzaldehyde diphenylhydrazone, N,N,N',N'-tetraphenylnaphthalene-2,6-diamine, tris(4-carbazoyl-9-ylphenyl)amine, tris[4-(diethylamino)phenyl]amine, 1,3,5-tris(diphenylamino)benzene, 1,3,5-tris[(3-methylphenyl)phenylamino]benzene, 2,7-bis(carbazol-9-yl)-9,9'-spirobifluorene, 2,2',7,7'-tetrakis(N,N-diphenylamino)-9,9-spirobifluorene, 2,2',7,7'-tetrakis[N,N-di(4-methoxyphenyl)amino]-9,9-spirobifluorene and poly[N,N-diphenyl-4-methoxyphenylamine-4',4''-diyl] (PMeOTPA). Preferably the organic semiconductor is 2,2',7,7'-tetrakis[N,N-di(4-methoxyphenyl)amino]-9,9-spirobifluorene which is also known as spiro-OMeTAD. The term "conjugated polymer", as used herein, refers to a polymeric compound which is conjugated. The term "conjugated", as used herein, refers to molecules comprising a delocalised system of π-electrons. Conjugated molecules will generally have higher electron mobility than non-conjugated molecules. Examples of semiconductors comprising conjugated polymers include polyacetylenes, polyphenylenes, polyparaphenylenes, polyparaphenylene vinylenes, polyparaphenylene acetylenes, polyazulenes, polynaphthalenes, polypyrenes, polyanilines, polyparaphenylene sulphides, polyfluorenes, polypyrroles, polythiophenes, polythieno[3,2-b]thiophene, polycarbazoles, polyazepines and polyindoles or a mixture thereof. The term "mixtures thereof", as used in the context of conjugated polymers and oligomers herein, refers to conjugated polymers comprising repeating units selected from one or more of the conjugated polymers listed. Such a polymer could comprise alternating repeating units of phenylene and thiophene for example. Such polymers are known as co-polymers. The conjugated polymers can be derivatives of the base polymer. Therefore, polyacetylenes include derivatives of the base polymer polyacetylene and polythiophenes include derivatives of the base polymer polythiophene. The term "derivative", as used herein, refers to molecules which have been substituted by other groups. These substituents may be any of those as defined below. If a polymer is a derivative, it will typically have 1, 2 or 3 substituents per monomer in the polymer. Poly(triarylamine) semiconductors are examples of conjugated polymer semiconductors, and organic semiconductors of this type include poly[bis(4-phenyl)(2,4,6-trimethylphenyl)amine]. In one embodiment, the organic semiconductor is selected from any of those polymers listed above. In another embodiment, the organic semiconductor is selected from polythiophenes, polyanilines, polycarbazoles, polyazepines, polyindoles and poly(triphenylamine)s (or poly(triarylamine)s). Optionally, the organic semiconductor may be selected from polyacetylenes, polyphenylenes, polyparaphenylene vinylenes, or polynaphthalenes.

In one embodiment, the organic semiconductor is selected from unsubstituted or substituted polythiophene or an unsubstituted or substituted oligothiophene. The substituents may be as defined herein for aryl or heteroaryl rings. Substituted polythiophenes include poly(alkylthiophenes), such as for instance poly(3-hexylthiophene). Sexithiophene is an example of an unsubstituted oligothiophene.

Thus, the organic semiconductor can be a polymer or an oligomer of unsubstituted or substituted thiophene. The organic semiconductor may, for example, be poly(3-hexylthiophene) or poly(3,4-ethylenedioxythiophene). Alternatively, the organic semiconductor may be an oligomer of thiophene, for instance di-, tri-, tetra-, penta- or sexithiophene which may be unsubstituted or substituted. The organic semiconductor may, for instance, be sexithiophene or substituted sexithiophene. The substituents may be as defined herein for aryl or heteroaryl rings.

Often, if the organic semiconductor comprises a conjugated polymer semiconductor, it is selected from poly[N,N-diphenyl-4-methoxyphenylamine-4',4''-diyl] (PMeOTPA), polythiophene, polyalkylthiophene, poly(3-hexylthiophene) or PEDOT.

The organic semiconductor may comprise a conjugated polymer semiconductor of formula (VI) as defined above. Typically the rings $A_1$, in formula (VI), are independently selected from substituted or unsubstituted phenyl rings, wherein the substituents may be as defined herein for aryl or heteroaryl rings. Usually, m is an integer of from 2 to 1000, more typically from 2 to 100, or for instance from 2 to 50. The integer m may for instance be from 2 to 20, for instance from 2 to 15. Poly[N,N-diphenyl-4-methoxyphenylamine-4',4''-diyl] (PMeOTPA) is an example of a polymer of formula (VI) as defined above.

The organic semiconductor may comprise a semiconductor of formula (VII) as defined above. Typically, L in the compound of formula (VII) is a conjugated linker which comprises at least one aryl or heteroaryl ring, for instance from 1 to 5 aryl or heteroaryl rings. The at least one aryl or heteroaryl rings in the linker L may for example, be independently selected from unsubstituted or substituted benzene, unsubstituted or substituted fluorene, unsubstituted or substituted naphthalene, unsubstituted or substituted anthracene, unsubstituted or substituted pyrene, unsubstituted or substituted pyridine, unsubstituted or substituted pyrrole, or unsubstituted or substituted thiophene. These rings may be bonded through any atom in the aromatic ring (and typically through a carbon atom in the case of heteroaryl rings). Usually, L in the compound of formula (VII) is a linker which comprises 1 to 5 such aryl or heteroaryl rings. L may for instance be thiophene, bithiophene, phenyl, biphenyl or fluorene. In some embodiments, the linker L in the compound of formula (VII) comprises one or more $C_2$-$C_4$ alkenylene or $C_2$-$C_4$ alkynylene linker groups, for instance one or more ethenylene or ethynylene (acetylenyl) groups, either in addition to, or as an alternative to, said at least one aryl or heteroaryl ring. In some embodiments, the conjugated linker L in the compound of formula (VII) comprises from 1 to 4 ethenylene or ethynylene groups, and from 1 to 5 aryl or heteroaryl rings. For instance, the linker L in the compound of formula (VII) may comprise two ethynylene (acetylenyl) groups, and two aryl rings. The compound of formula (VII) may for instance be a semiconductor of formula (VIIa):

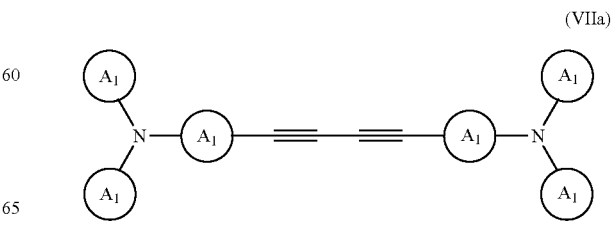

(VIIa)

wherein each $A_1$ is the same or different and is an unsubstituted or substituted aryl ring or an unsubstituted or substituted heteroaryl ring. Typically, each $A_1$ is independently an unsubstituted or substituted aryl ring, for instance an unsubstituted or substituted phenyl ring. Examples of organic semiconductors of formula (VII) and (VIIa) are provided in J. Mater. Chem. A, 2013, 1, 6949-6960, and include the following:

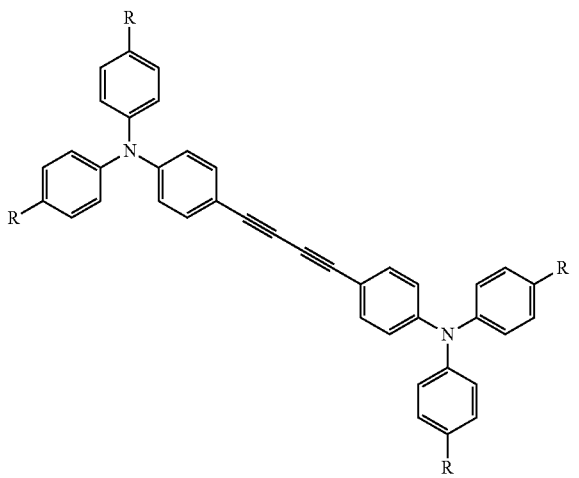

H—DATPA; R = H
Me—DATPA; R = Me
MeS—DATPA; R = SMe
MeO—DATPA; R = OMe

Some organic semiconductors are polymeric, yet not strictly conjugated. Examples include poly(vinylnaphthalene)s and poly(vinylcarbazole)s. The organic semiconductor may for instance be selected from these poly(vinylarene)s and poly(vinylheteroarene)s, where the arene group or heteroarene group may be as defined for aryl or heteroaryl rings below.

The term "conjugated oligomer", as used herein, refers to an oligomeric compound which is conjugated. Whereas a polymeric compound typically comprises more than 8 repeating units, an oligomeric compound may comprise from 2 to 7 repeating units. If the organic semiconductor is a conjugated oligomer organic semiconductor it may comprise from 2 to 7 repeating units as defined for the polymeric compounds above. Occasionally, the organic semiconductor is selected from tetrathiafulvalene, tetraselenafulvalene, dithiophene-tetrafulvalene, tetrathiatetracene, sexithiophene, trimethoxybenzene, 9,9-spirobifluorene and 2,7-dibromo-9,9'-spirobifluorene. Any oligomer may be substituted or unsubstituted as defined below.

The term "polycyclic aromatic hydrocarbon", as used herein, refers to semiconducting compounds which comprise two or more fused aromatic rings. Typically they comprise from 2 to 10 fused rings. Examples include indene, naphthene, azulene, anthracene, phenanthrene, pyrene, acenaphthylene, benz[a]anthracene, benzo[a]pyrene, benzo[e]pyrene, benzo[b]fluoranthene, benzo[ghi]perylene, benzo[j]fluoranthene, benzo[k]fluoranthene, chrysene, coronene, dibenz(a,h)anthracene, fluoranthene, indeno(1,2,3-cd)pyrene, tetracene, pentacene and heptacene. The polycyclic aromatic hydrocarbon may be substituted or unsubstituted as defined below. Typically, a substituted polycyclic aromatic hydrocarbon may bear 0, 1, 2, 3, 4, 5 or 6 substitutents.

In some embodiments, the organic semiconductor comprises a compound of formula (V):

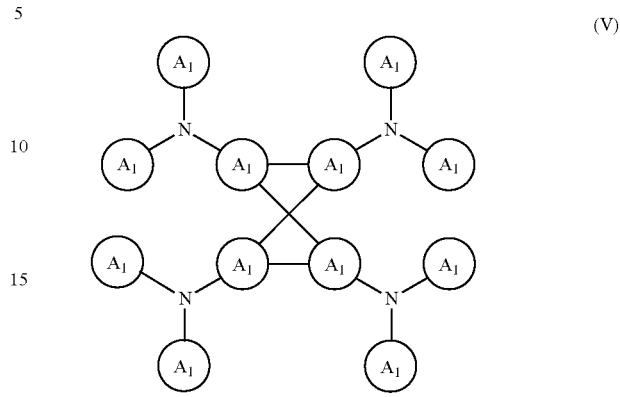

wherein each $A_1$ is the same or different and is an unsubstituted or substituted aryl ring or an unsubstituted or substituted heteroaryl ring.

In some embodiments, the organic semiconductor comprises a compound of formula (Va)

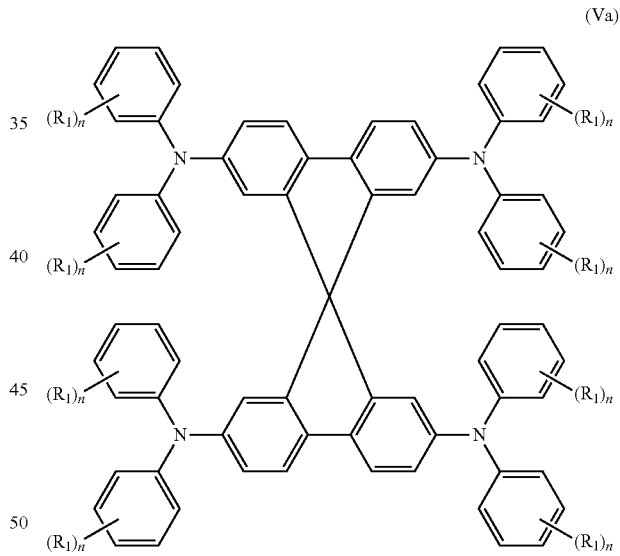

wherein each $R_1$ is the same or different and is a group selected from hydrogen, $C_{1-8}$ alkyl, $C_{2-8}$ alkenyl, $C_{2-8}$ alkynyl, $C_{1-8}$ alkoxy, hydroxyl, mono-$C_{1-8}$ alkylamino, di-$C_{1-8}$ alkylamino, amino, halide, cyano, nitro, and thiol; and n is an integer from 1 to 5.

Usually n is 1. Typically, $R_1$ is selected from hydrogen, $C_{1-8}$ alkyl, or $C_{1-8}$ alkoxy. Often, $R_1$ is selected from methyl or methyloxy.

In some cases, the organic semiconductor comprises a compound of formula (Vb)

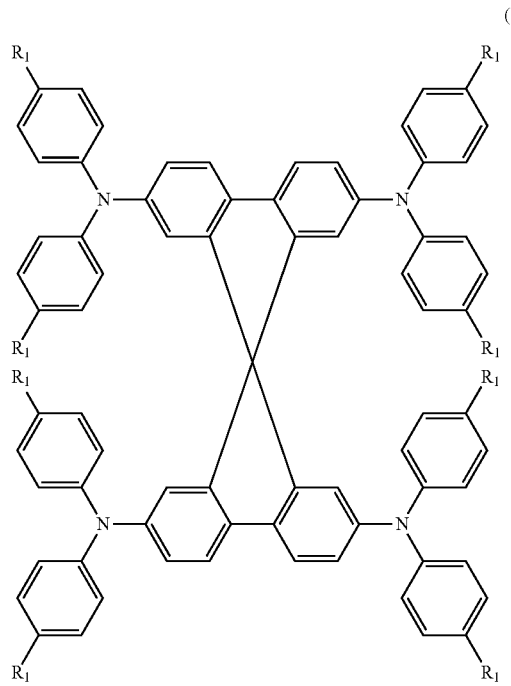

(Vb)

wherein each $R_1$ is the same or different and is a group selected from hydrogen, $C_{1-8}$ alkyl, $C_{2-8}$ alkenyl, $C_{2-8}$ alkynyl, $C_{1-8}$ alkoxy, hydroxyl, mono-$C_{1-8}$ alkylamino, di-$C_{1-8}$ alkylamino, amino, halide, cyano, nitro, and thiol. Typically, $R_1$ is selected from hydrogen, $C_{1-8}$ alkyl, or $C_{1-8}$ alkoxy. Preferably, $R_1$ is methyloxy (OMe).

Other examples of organic semiconductors which may be doped by processes according to the invention include poly(3-hexylthiophene), poly[N,N-diphenyl-4-methoxyphenylamine-4',4"-diyl], sexithiophene, 9,10-bis(phenylethynyl)anthracene, 5,12-bis(phenylethynyl)naphtacene, diindenoperylene, 9,10-diphenylanthracene, PEDOT-TMA, PEDOT:PSS, perfluoropentacene, perylene, poly(p-phenylene oxide), poly(p-phenylene sulfide), quinacridone, rubrene, 4-(dimethylamino)benzaldehyde diphenylhydrazone, 4-(dibenzylamino)benzaldehyde-N,N-diphenylhydrazone or phthalocyanines.

The term "aryl ring", used herein, refers to any monocyclic or polycyclic hydrocarbon compound, at least one ring of which is an aromatic ring. An aryl ring has from 6 to 30 carbons. Examples of aryl rings aromatic hydrocarbon compound such as benzene, indene, naphthene, azulene, fluorene, anthracene, phenanthrene, pyrene, acenaphthylene, benz[a]anthracene, benzo[a]pyrene, benzo[e]pyrene, benzo[b]fluoranthene, benzo[ghi]perylene, benzo[j]fluoranthene, benzo[k]fluoranthene, chrysene, coronene, dibenz(a,h)anthracene, fluoranthene, indeno(1,2,3-cd)pyrene, and biphenyl. When an aryl ring appears in a formula, each bond coming off the ring will be formed to a carbon in the ring. An unsubstituted or substituted aryl ring may be unsubstituted or substituted benzene, unsubstituted or substituted naphthalene, unsubstituted or substituted anthracene, unsubstituted or substituted pyrene, or unsubstituted or substituted biphenyl.

The term "heteroaryl ring", used herein, refers to any monocyclic or polycyclic aryl compound, at least one ring of which is an aromatic ring containing a heteroatom. Heteroatoms include N, O, S and P. Often, the heteroatom is N. A heteroaryl ring has from 6 to 30 carbons and 1 or more, often 1 to 10, heteroatoms which may each be the same or different heteroatom. Examples of heteroaryl rings include compounds such as benzene, indene, naphthene, azulene, fluorene, anthracene, phenanthrene, pyrene, acenaphthylene, benz[a]anthracene, benzo[a]pyrene, benzo[e]pyrene, benzo[b]fluoranthene, benzo[ghi]perylene, benzo[j]fluoranthene, benzo[k]fluoranthene, chrysene, coronene, dibenz(a,h)anthracene, fluoranthene, indeno(1,2,3-cd)pyrene, and biphenyl in which one or more carbon atom has been replaced with a heteroatom. Examples of unsubstituted or substituted heteroaryl rings include rings derived from unsubstituted or substituted furan, thiophene, pyrrole, oxazole, thiazole, imidazole, pyrazole, isoxazole, isothiazole, pyridine, 2,2-bipyridine, pyridazine, pyrimidine, pyrazine, indolizine, indole, isoindole, benzo[b]furan, benzo[b]thiophene, purine, quinolizine, quinoline, isoquinoline, carbazole, acridine, phenazine, phenothiazine, or phenoxazine. In particular, heteroaryl rings pyridine, pyrrole and thiophene.

When an aryl or heteroaryl ring as defined above is substituted it typically bears one or more substituents selected from $C_1$-$C_8$ alkyl, $C_2$-$C_8$ alkenyl, $C_2$-$C_8$ alkynyl, $C_{3-8}$ cycloalkyl, $C_{3-8}$ heterocycloalkyl, aryl, heteroaryl, cyano, amino, azide, $C_{1-8}$ alkylamino, di($C_{1-8}$)alkylamino, arylamino, diarylamino, arylalkylamino, amido, acylamido, hydroxy, halo, carboxy, ester, acyl, acyloxy, $C_{1-8}$ alkoxy, aryloxy, haloalkyl, thiol, $C_{1-8}$ alkylthio, arylthio, sulfonic acid, phosphoric acid, phosphate ester, phosphonic acid, phosphonate ester and sulfonyl. Typically it carries 0, 1, 2 or 3 substituents. A substituted aryl or heteroaryl ring may be substituted in two positions with a single $C_{1-7}$ alkylene group, or with a bidentate group represented by the formula —X—$C_{1-7}$ alkylene, or —X—$C_{1-7}$ alkylene-X—, wherein X is selected from O, S and NR, and wherein R is H, aryl or $C_{1-6}$ alkyl. Thus a substituted aryl ring may be an aryl ring fused with a cycloalkyl group or with a heterocyclyl group. The term aralkyl as used herein, pertains to an aryl group in which at least one hydrogen atom (e.g., 1, 2, or 3) has been substituted with a $C_{1-6}$ alkyl group. Examples of such groups include, but are not limited to, tolyl (from toluene), xylyl (from xylene), mesityl (from mesitylene), and cumenyl (or cumyl, from cumene), and duryl (from durene). The term "aryl group", as used herein, refers to a group derived from an aryl ring as defined herein. The term "heteroaryl group", as used herein, refers to a group derived from a heteroaryl ring as defined herein.

When a group is substituted it typically bears one or more substituents selected from $C_1$-$C_8$ alkyl, $C_2$-$C_8$ alkenyl, $C_2$-$C_8$ alkynyl, $C_{3-8}$ cycloalkyl, $C_{3-8}$ heterocycloalkyl, aryl, heteroaryl, cyano, amino, azide, $C_{1-8}$ alkylamino, di($C_{1-8}$)alkylamino, arylamino, diarylamino, arylalkylamino, amido, acylamido, hydroxy, halo, carboxy, ester, acyl, acyloxy, $C_{1-8}$ alkoxy, aryloxy, haloalkyl, sulfhydryl, $C_{1-8}$ alkylthio, arylthio, sulfonic acid, phosphoric acid, phosphate ester, phosphonic acid, phosphonate ester and sulfonyl. Typically it carries 0, 1, 2 or 3 substituents.

The term "$C_{1-8}$ alkyl group", as used herein, refers to a straight or branched chain saturated hydrocarbon group. Typically it is methyl, ethyl, propyl, butyl, pentyl, hexyl, heptyl, or octyl, or $C_{1-6}$ alkyl, for example methyl, ethyl, propyl, butyl, pentyl or hexyl, or $C_{1-4}$ alkyl, for example methyl, ethyl, i-propyl, n-propyl, t-butyl, s-butyl or n-butyl.

When an alkyl group is substituted it typically bears one or more substituents selected from those described above for substituted aryl or heteroaryl rings, wherein the substituents are optionally unsubstituted.

The term "$C_{2-8}$ alkenyl group", as used herein, refers to a $C_{2-8}$ alkyl group as defined above, wherein the group contains one or more double bonds. The term "$C_{2-8}$ alkynyl group", as used herein, refers to a $C_{2-8}$ alkyl group as defined above, wherein the group contains one or more triple bonds. Typically a substituted alkyl group, alkenyl group or alkynyl group carries 1, 2 or 3 substituents, for instance 1 or 2.

A $C_{3-8}$ cycloalkyl group is an unsubstituted or substituted alkyl group which is also a cyclyl group; that is, a monovalent moiety obtained by removing a hydrogen atom from an alicyclic ring atom of a carbocyclic ring of a carbocyclic compound, which moiety has from 3 to 8 carbon atoms, including from 3 to 8 ring atoms. Thus, the term "cycloalkyl" includes the sub-classes cycloalkyenyl and cycloalkynyl. Examples of $C_{3-8}$ cycloalkyl groups include, but are not limited to, those derived from saturated monocyclic hydrocarbon compounds, which $C_{3-8}$ cycloalkyl groups are unsubstituted or substituted as defined above for aryl or heteroaryl groups:

cyclopropane ($C_3$), cyclobutane ($C_4$), cyclopentane ($C_5$), cyclohexane ($C_6$), cycloheptane ($C_7$), methylcyclopropane ($C_4$), dimethylcyclopropane ($C_5$), methylcyclobutane ($C_5$), dimethylcyclobutane ($C_6$), methylcyclopentane ($C_6$), dimethylcyclopentane ($C_7$), methylcyclohexane ($C_7$), dimethylcyclohexane ($C_8$);

unsaturated monocyclic hydrocarbon compounds:

cyclopropene ($C_3$), cyclobutene ($C_4$), cyclopentene ($C_5$), cyclohexene ($C_6$), methylcyclopropene ($C_4$), dimethylcyclopropene ($C_5$), methylcyclobutene ($C_5$), dimethylcyclobutene ($C_6$), methylcyclopentene ($C_6$), dimethylcyclopentene ($C_7$), methylcyclohexene ($C_7$), dimethylcyclohexene ($C_8$).

A $C_{3-8}$ heterocyclyl group is an unsubstituted or substituted monovalent moiety obtained by removing a hydrogen atom from a ring atom of a heterocyclic compound, which moiety has from 3 to 8 ring atoms, of which from 1 to 5 are ring heteroatoms.

Examples of (non-aromatic) monocyclic $C_{3-8}$ heterocyclyl groups include, but are not limited to, those derived from:

$N_1$: aziridine ($C_3$), azetidine ($C_4$), pyrrolidine (tetrahydropyrrole) ($C_5$), pyrroline (e.g., 3-pyrroline, 2,5-dihydropyrrole) ($C_5$), 2H-pyrrole or 3H-pyrrole (isopyrrole, isoazole) ($C_5$), piperidine ($C_6$), dihydropyridine ($C_6$), tetrahydropyridine ($C_6$), azepine ($C_7$); $O_1$: oxirane ($C_3$), oxetane ($C_4$), oxolane (tetrahydrofuran) ($C_5$), oxole (dihydrofuran) ($C_5$), oxane (tetrahydropyran) ($C_6$), dihydropyran ($C_6$), pyran ($C_6$), oxepin ($C_7$);
$S_1$: thiirane ($C_3$), thietane ($C_4$), thiolane (tetrahydrothiophene) ($C_5$), thiane (tetrahydrothiopyran) ($C_6$), thiepane ($C_7$);
$O_2$: dioxolane ($C_5$), dioxane ($C_6$), and dioxepane ($C_7$);
$O_3$: trioxane ($C_6$);
$N_2$: imidazolidine ($C_5$), pyrazolidine (diazolidine) ($C_5$), imidazoline ($C_5$), pyrazoline (dihydropyrazole) ($C_5$), piperazine ($C_6$);
$N_1O_1$: tetrahydrooxazole ($C_5$), dihydrooxazole ($C_5$), tetrahydroisoxazole ($C_5$), dihydroisoxazole ($C_5$), morpholine ($C_6$), tetrahydrooxazine ($C_6$), dihydrooxazine ($C_6$), oxazine ($C_6$);
$N_1S_1$: thiazoline ($C_5$), thiazolidine ($C_5$), thiomorpholine ($C_6$); $N_2O_1$: oxadiazine ($C_6$);
$O_1S_1$: oxathiole ($C_5$) and oxathiane (thioxane) ($C_6$); and, $N_1O_1S_1$: oxathiazine ($C_6$).

Examples of linear saturated $C_{1-7}$ alkylene groups include, but are not limited to, —$(CH_2)_n$— where n is an integer from 1 to 7, for example, —$CH_2$— (methylene), —$CH_2CH_2$— (ethylene), —$CH_2CH_2CH_2$— (propylene), and —$CH_2CH_2CH_2CH_2$— (butylene).

Examples of branched saturated $C_{1-7}$ alkylene groups include, but are not limited to, —$CH(CH_3)$—, —$CH(CH_3)CH_2$—, —$CH(CH_3)CH_2CH_2$—, —$CH(CH_3)CH_2CH_2CH_2$—, —$CH_2CH(CH_3)CH_2$—, —$CH_2CH(CH_3)CH_2CH_2$—, —$CH(CH_2CH_3)$—, —$CH(CH_2CH_3)CH_2$—, and —$CH_2CH(CH_2CH_3)CH_2$—.

Examples of linear partially unsaturated $C_{1-7}$ alkylene groups include, but is not limited to, —CH=CH— (vinylene), —CH=CH—$CH_2$—, —$CH_2$—CH=$CH_2$—, —CH=CH—$CH_2$—$CH_2$—, —CH=CH—$CH_2$—$CH_2$—$CH_2$—, —CH=CH—CH=CH—, —CH=CH—CH=CH—$CH_2$—, —CH=CH—CH=CH—$CH_2$—$CH_2$—, —CH=CH—$CH_2$—CH=CH—, and —CH=CH—$CH_2$—$CH_2$—CH=CH—.

Examples of branched partially unsaturated $C_{1-7}$ alkylene groups include, but is not limited to, —C($CH_3$)=CH—, —C($CH_3$)=CH—$CH_2$—, and —CH=CH—CH($CH_3$)—. Examples of alicyclic saturated $C_{1-7}$ alkylene groups include, but are not limited to, cyclopentylene (e.g., cyclopent-1,3-ylene), and cyclohexylene (e.g., cyclohex-1,4-ylene). Examples of alicyclic partially unsaturated $C_{1-7}$ alkylene groups include, but are not limited to, cyclopentenylene (e.g., 4-cyclopenten-1,3-ylene), cyclohexenylene (e.g., 2-cyclohexen-1,4-ylene; 3-cyclohexen-1,2-ylene; 2,5-cyclohexadien-1,4-ylene).

In this context, the prefixes (e.g., $C_{1-6}$, $C_{3-8}$ etc.) denote the number of ring atoms, or range of number of ring atoms, whether carbon atoms or heteroatoms.

As used herein the term "oxo" represents a group of formula: =O

As used herein the term "acyl" represents a group of formula: —C(=O)R, wherein R is an acyl substituent, for example, a substituted or unsubstituted $C_{1-8}$ alkyl group, a substituted or unsubstituted $C_{3-8}$ heterocyclyl group, or a substituted or unsubstituted aryl group. Examples of acyl groups include, but are not limited to, —C(=O)$CH_3$ (acetyl), —C(=O)$CH_2CH_3$ (propionyl), —C(=O)C($CH_3$)$_3$ (t-butyryl), and —C(=O)Ph (benzoyl, phenone). As used herein the term "acyloxy" represents a group of formula: —OC(=O)R, wherein R is an acyloxy substituent, for example, substituted or unsubstituted $C_{1-8}$ alkyl group, a substituted or unsubstituted $C_{3-8}$ heterocyclyl group, or a substituted or unsubstituted aryl group, typically a $C_{1-6}$ alkyl group. Examples of acyloxy groups include, but are not limited to, —OC(=O)$CH_3$ (acetoxy), —OC(=O)$CH_2CH_3$, —OC(=O)C($CH_3$)$_3$, —OC(=O)Ph, and —OC(=O)$CH_2$Ph.

As used herein the term "ester" (or "carboxylate", "carboxylic acid ester" or "oxycarbonyl") represents a group of formula: —C(=O)OR, wherein R is an ester substituent, for example, a substituted or unsubstituted $C_{1-8}$ alkyl group, a substituted or unsubstituted $C_{3-8}$ heterocyclyl group, or a substituted or unsubstituted aryl group (typically a phenyl group). Examples of ester groups include, but are not limited to, —C(=O)O$CH_3$, —C(=O)O$CH_2CH_3$, —C(=O)OC($CH_3$)$_3$, and —C(=O)OPh.

As used herein the term "amino" represents a group of formula —$NH_2$. The "term $C_1$-$C_8$ alkylamino" represents a group of formula —NHR' wherein R' is a $C_{1-8}$ alkyl group, preferably a $C_{1-6}$ alkyl group, as defined previously. The term "di($C_{1-8}$)alkylamino" represents a group of formula —NR'R" wherein R' and R" are the same or different and represent $C_{1-8}$ alkyl groups, preferably $C_{1-6}$ alkyl groups, as defined previously. The term "arylamino" represents a group of formula —NHR' wherein R' is an aryl group, preferably a phenyl group, as defined previously. The term "diarylamino" represents a group of formula —NR'R" wherein R' and R" are the same or different and represent aryl groups, preferably phenyl groups, as defined previously. The term "arylalkylamino" represents a group of formula —NR'R" wherein R' is a $C_{1-8}$ alkyl group, preferably a $C_{1-6}$ alkyl group, and R" is an aryl group, preferably a phenyl group.

A halo group is chlorine, fluorine, bromine or iodine (a chloro group, a fluoro group, a bromo group or an iodo group). It is typically chlorine, fluorine or bromine.

As used herein the term "amido" represents a group of formula: —C(=O)NR'R", wherein R' and R" are independently amino substituents, as defined for di($C_{1-8}$)alkylamino groups. Examples of amido groups include, but are not limited to, —C(=O)NH$_2$, —C(=O)NHCH$_3$, —C(=O)N(CH$_3$)$_2$, —C(=O)NHCH$_2$CH$_3$, and —C(=O)N(CH$_2$CH$_3$)$_2$, as well as amido groups in which R' and R", together with the nitrogen atom to which they are attached, form a heterocyclic structure as in, for example, piperidinocarbonyl, morpholinocarbonyl, thiomorpholinocarbonyl, and piperazinocarbonyl.

As used herein the term "acylamido" represents a group of formula: —NR$^1$C(=O)R$^2$, wherein R$^1$ is an amide substituent, for example, hydrogen, a $C_{1-8}$ alkyl group, a $C_{3-8}$ heterocyclyl group, an aryl group, preferably hydrogen or a $C_{1-8}$ alkyl group, and R$^2$ is an acyl substituent, for example, a $C_{1-8}$ alkyl group, a $C_{3-8}$ heterocyclyl group, or an aryl group, preferably hydrogen or a $C_{1-8}$ alkyl group. Examples of acylamide groups include, but are not limited to, —NHC(=O)CH$_3$, —NHC(=O)CH$_2$CH$_3$, —NHC(=O)Ph, and —NHC(=O)C$_4$H$_9$. Thus, a substituted $C_{1-8}$ alkyl group may comprise an acylamido substituent defined by the formula —NHC(=O)—$C_{1-8}$ alkyl, such as —NHC(=O)C$_2$H$_5$. R$^1$ and R$^2$ may together form a cyclic structure, as in, for example, succinimidyl, maleimidyl, and phthalimidyl:

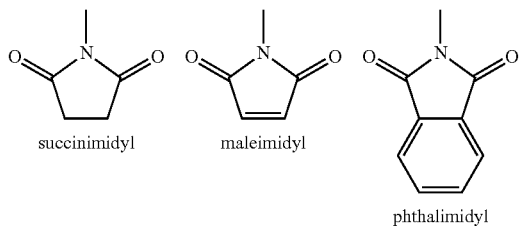

succinimidyl  maleimidyl  phthalimidyl

A $C_{1-8}$ alkylthio group is a said $C_{1-8}$ alkyl group, preferably a $C_{1-6}$ alkyl group, attached to a thio group. An arylthio group is an aryl group, preferably a phenyl group, attached to a thio group.

A $C_{1-8}$ alkoxy group is a said substituted or unsubstituted $C_{1-8}$ alkyl group attached to an oxygen atom. A $C_{1-6}$ alkoxy group is a said substituted or unsubstituted $C_{1-6}$ alkyl group attached to an oxygen atom. A $C_{1-4}$ alkoxy group is a substituted or unsubstituted $C_{1-4}$ alkyl group attached to an oxygen atom. Examples of $C_{1-4}$ alkoxy groups include, —OMe (methoxy), -OEt (ethoxy), —O(nPr) (n-propoxy), —O(iPr) (isopropoxy), —O(nBu) (n-butoxy), —O(sBu) (sec-butoxy), —O(iBu) (isobutoxy), and —O(tBu) (tert-butoxy). An aryloxy group is a substituted or unsubstituted aryl group, as defined herein, attached to an oxygen atom. An example of an aryloxy group is —OPh (phenoxy).

If a defined group is substituted with A, and A is substituted with B, then the substituent B is typically unsubstituted.

The term "treating", as used herein, refers to any process in which one compound is allowed to react or interact with another. This may be done through any appropriate process. Treating includes, inter alia, exposing two or more reagents to each other, mixing two or more reagents in their solid state, adding a solution of one or more reagents to a solid form of the other, adding a solid of one or more reagents to a solution of another, mixing solutions of two or more reagents, or mixing solutions of two or more reagents and then adding a solid of a third and optionally further reagents. One of the listed reagents by which another is treated may be added as the reagent itself, or may be added as a precursor that converts by some process to the reagent itself. Therefore, treating a compound A with a compound B includes treating compound A with a precursor to compound B which converts to compound B by any method, including, inter alia, converting to B when dissolved, converting to B due to exposure to A, converting to B under basic or acidic conditions, and converting to B over time in a decomposition type process. Treating with a compound also includes any process wherein the process comprises adding that compound, regardless of whether that compound converts to another compound before undergoing a reaction.

Generally, the oxidised salt of the organic semiconductor is a salt of formula [OS][A] wherein OS is a cation of an organic semiconductor as defined anywhere above and A is an anion. The identity of the anion will affect the properties of the organic semiconductor when it is doped. The anion needs to be a suitable anion. An ion will generally be suitable if it is a "soft" anion with a highly delocalised negative charge. If the anion has a large size, it will not disrupt the movement of charge through the organic semiconductor as much as it would if the negative charge was localised to a small area. This is because a more localised charge will lead to a deeper coulombic well which will be more likely to trap charge carriers.

The notation "[OS][A]" encompasses salts with a cation: anion stoichiometry of either 1:1 or another value. In particular, the cation:anion stoichiometry may be 1:1, 1:2, 2:1, 2:3, 3:2, 1:3, 3:1, 1:4 or 4:1. The stoichiometry will be based on the charge of each ion such that the salt is neutrally charged. For instance, if OS is a dication, OS$^{2+}$, and A is a monocation, A$^-$, then the cation:anion stoichiometry will be 1:2 and [OS][A] will correspond to the salt OSA$_2$. Typically, OS will be a mono cation and A will be a monoanion and the cation:anion stoichiometry will be 1:1. The notation [OS][A] also includes those salts which are binary, ternary or otherwise. For example, [OS][A] also includes the ternary salt [OS][A][B] where B is a third ion which may be a cation or an anion. If a third or further ion is present, it will preferably be an ion which would not have an electronic effect when present in a doped semiconductor. In view of the desire for controlled doping, [OS][A] is preferably a binary salt which does not contain any further ions.

Accordingly, [OS][A] includes salts of formula OS$_p^{m+}$ A$_q^{n-}$ wherein mp=nq. If the cation:anion stoichiometry is 1:1, [OS][A] is OS$^+$A$^-$ (or OS$^{2+}$A$^{2-}$ etc.), also written as OSA.

Preferably, the anion A is ClO$_4^-$, NO$_3^-$ or an anion of formula (i), (ii), (iii) or (iv):

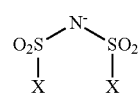

(i)

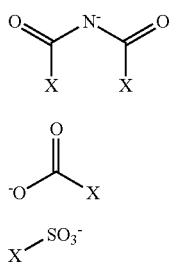

(ii)

(iii)

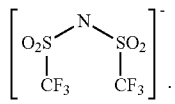

(iv)

wherein each X is the same or different and is an electron withdrawing group.

The term "electron withdrawing group" (EWG), as used herein, refers to a group which will reduce the electron density on the moiety to which it is bonded by drawing electrons away. An EWG may withdraw electrons through pi-conjugation, or by containing atoms with a higher electronegativity than the atoms to which they are bonded. Examples of electron withdrawing groups include halogen atoms (F, Cl, Br or I), groups comprising halogen atoms (e.g. $CY_3$ or $C_2Y_5$ where each Y is a halogen atom), carbonyl groups (e.g. —C(O)—R) or cyano groups (—CN). If two X groups are present, they may be bonded to each other to form a ring. In one embodiment X is a $C_{1-8}$-haloalkyl group, preferably wherein the proximal carbon atom bears one or two halogen atoms. Preferably, when X is a $C_{1-8}$-haloalkyl group it is a $C_{1-8}$ perhaloalkyl group. A $C_{1-8}$ perhaloalkyl group is a $C_{1-8}$-haloalkyl group in which all of the hydrogen atoms have been replaced with halogen atoms, typically fluorine atoms. Often, X is a group selected from Y, $CH_2Y$, $CHY_2$, $CY_3$, $CY_2CY_3$, $CY_2CY_2CY_3$ or $CY_2CY_2CY_2CY_3$ and each Y is the same or different and is F or Cl. X may be $CF_3$, $CF_2CF_3$ or $CF_2CF_2CF_3$. Preferably, X is $CF_3$ or $CF_2CF_3$.

Often it is preferred that the anion A is an anion of formula (i) wherein X is an EWG. Typically, A is an anion of formula (i) wherein X is a $C_{1-8}$-perhaloalkyl group. Often, A is an anion of formula (i) wherein X is $CF_3$ or $CF_2CF_3$. Therefore, preferably, A is bis(trifluoromethanesulfonyl)imide (TFSI) or bis(pentafluoroethanesulfonyl)imide (BETI). Alternatively, A is an anion selected from trifluoroacetate, trifluoromethanesulfonate, bis(trifluoromethanesulfonyl)imide, bis(pentafluoroethanesulfonyl)imide, or bis(perfluoropropanesulfonyl)imide. In one embodiment, A is bis(trifluoromethanesulfonyl)imide, bis(pentafluoroethanesulfonyl)imide, bis(perfluoropropanesulfonyl)imide, trifluoroacetate, or trifluoromethanesulfonate. The bis(trifluoromethanesulfonyl)imide anion has the following formula:

$$\left[ \begin{array}{c} \phantom{O_2S}N\phantom{SO_2} \\ O_2S \phantom{xx} SO_2 \\ | \phantom{xxx} | \\ CF_3 \phantom{xx} CF_3 \end{array} \right]^-.$$

In a preferred embodiment, the oxidised salt of the organic semiconductor is obtainable by a process comprising:
(a) treating the organic semiconductor with an oxidant to produce an oxidation product;
(b) isolating the oxidation product;
(c) performing an anion exchange with the anion A on the oxidation product to produce an oxidised salt of the organic semiconductor comprising A, wherein A is as defined anywhere above; and
(d) isolating the oxidised salt of the organic semiconductor.

Accordingly, the process may further comprise producing the oxidised salt of the organic semiconductor by a process comprising:
(a) treating the organic semiconductor with an oxidant to produce an oxidation product;
(b) isolating the oxidation product;
(c) performing an anion exchange with the anion A on the oxidation product to produce an oxidised salt of the organic semiconductor comprising A, wherein A is as defined anywhere above; and
(d) isolating the oxidised salt of the organic semiconductor.

This process can be used to produce high purity oxidised salts of the organic semiconductor which allows accurate and controlled doping to be performed. And, as discussed above, the control of the p-dopant in this manner allows the doping affect of the dopant to be separated from other electronic effects which may be introduced by traditional, known dopants.

The first component of the process for producing the oxidised salt of the organic semiconductor, (a), may comprise treating the organic semiconductor with an oxidant by any means, as defined above for "treating". Typically, (a) will comprise dissolving the organic semiconductor in a solvent, and then adding the oxidant to the solution comprising the organic semiconductor. The oxidant may be added as a solid comprising the oxidant, as a solid consisting of the oxidant, as a liquid form of the oxidant, or as a solution comprising the oxidant. The oxidant may be added dropwise. Alternatively, (a) may comprise treating a solid composition comprising the organic semiconductor with the oxidant. The oxidant may be added as defined above. If solvents are used, they are usually organic solvents. In one embodiment, (a) comprises treating a composition comprising a first solvent and the organic semiconductor with a composition comprising a second solvent and the oxidant. The organic semiconductor and the oxidant will typically be dissolved in the first and second solvents respectively. Accordingly, the first solvent may be any solvent in which the organic semiconductor is soluble and the second solvent may be any solvent in which the oxidant is soluble. Solubility data is commonly available. Often the first and second solvents are both organic solvents. The oxidant or organic semiconductor may also in some cases be insoluble in the solvent and will be dispersed or suspended in the solvent.

The term "organic solvent", as used herein, refers to a solvent the molecules of which comprise at least one carbon atom and typically at least one hydrogen atom. The term is well known. The organic solvent may be an alcohol, a thiol, an ether, a ketone, an aldehyde, an alkane, a cycloalkane, an aromatic hydrocarbon, a halogenated aromatic hydrocarbon, a heterocyclic compound, an aromatic heterocyclic compound, a halogenated hydrocarbon, a nitrile or an amine. The term "alcohol", as used herein, refers to a compound which comprises one or more hydroxyl groups. Examples of such compounds include $C_1$-$C_8$-alcohols, for instance methanol or ethanol. Di-, tri- and poly-ols are also included (e.g. ethylene glycol or propylene glycol). The term "thiol", as used herein, refers to a compound which comprises one or more thiol (—SH) groups. Examples of such compounds include $C_1$-$C_8$-alkylthiols. The term "ether", as used herein, refers to a compound which comprises one more ether groups (i.e. those comprising the moiety C—O—C).

Examples of such compounds include di-$C_1$-$C_8$-alkylethers such as diethylether and saturated heterocycles containing an oxygen atom between two carbon atoms such as tetrahydrofuran, THF. The term "ketone", as used herein, refers to a compound which comprises one or more oxo groups (>C=O) at least one of which is not on a terminal carbon. Examples of such compounds include acetone, butanone and acetoacetone. The term "aldehyde", as used herein, refers to compounds comprising a formyl (—CHO) group. Examples of such compounds include formaldehyde and ethanal. The term "alkane", as used herein, refers to a linear or branched saturated hydrocarbon. Typically the alkane is a $C_5$-$C_{10}$-alkane. Examples of such alkane organic solvents are pentane, hexane and heptane. The term "cycloalkane", as used herein, refers to a cyclic alkane molecule, typically cyclopentane or cyclohexane. The term "aromatic hydrocarbon", as used herein, refers to a compound comprising an aromatic hydrocarbon ring, typically a benzene ring. Examples of such compounds include benzene, toluene, and xylene. The term "halogenated aromatic hydrocarbon", as used herein, refers to an aromatic hydrocarbon wherein one or more of the hydrogen atoms have been replaced with a halogen atom, wherein the halogen atom may be selected from F, Cl, Br and I. Preferably a halogenated aromatic hydrocarbon is a chlorinated aromatic hydrocarbon. The term "heterocyclic compound", as used herein, refers to a cyclic compound comprising one or more heteroatom (i.e. an atom which is not carbon). Examples of heterocyclic compounds include tetrahydrofuran, pyrollidine and aromatic heterocyclic compounds. The term "aromatic heterocyclic compound", as used herein, refers to aromatic compounds comprising at least one heteroatom in the aromatic ring. Examples of aromatic heterocyclic compounds include pyrrole and pyridine. The term "halogenated hydrocarbon", as used herein, refers to a hydrocarbon compound (i.e. a compound consisting of only carbon and hydrogen) in which one or more hydrogen atoms have been replaced with halogen atoms. Typically the halogenated hydrocarbon will have between 1 and 8 carbons. Examples of such compounds include chloroform. The term "nitrile", as used herein, refers to a compound comprising a cyano (—CN) group. For example, a nitrile solvent may be acetonitrile. The term "amine", as used herein, refers to an organic compound which comprises at least one saturated nitrogen atom. Examples of such compounds include tri-$C_1$-$C_8$-alkylamines, such as triethylamine.

Therefore, in the step of treating a composition comprising a first solvent and the organic semiconductor with a composition comprising a second solvent and the oxidant, typically the first solvent comprises a halogenated hydrocarbon such as, for instance, chloroform, or a halogenated aromatic hydrocarbon, or an ether. Typically the second solvent comprises a nitrile or an alcohol. Often, the first solvent is chloroform, chlorobenzene, dichlorobenzene, chlorobenzyl or tetrahydrofuran. The first solvent is preferably chlorobenzene. The second solvent is typically acetonitrile or n-butanol.

The oxidant used may be any suitable oxidant which is capable of accepting an electron. Typically, the oxidant comprises a compound selected from percyanocarbon compounds, quinone compounds, chloroquinone compounds, halogen compounds or interhalogen compounds;

a cation selected from triarylaluminium radical cations, heterocyclic radical cations, triarylcarbenium cations, tropylium cations, complex cations of metals or nitrosonium cation; or an anion selected from a hexacyanotrimethylenecyclopropane radical anion $[C_3\{C(CN)_2\}_3]^-$, or a hexachloroplatinate anion $[PtCl_6]^{2-}$.

The term "percyanocarbon compound" refers to an organic compound which comprises 2 or more, preferably 4 or more, cyano (—CN) groups. Examples of these compounds include tetracyanoethylene (TCNE), tetracyanoquinodimethane (TCNQ) and octacyanoquinodimethane. The term "quinone compound" refers to any compound which comprises a 1,2-benzoquinone or 1,4-benzoquinone moiety, including 1,4-naphthoquinone and 9,10-anthraquinone compounds and lawsone. Choloroquinone compounds are compounds derived by replacing one or more hydrogen atoms on a quinone compound with chlorine atoms. Examples include chloranil (tetrachloro-1,4-benzoquinone) and DDQ (2,3-Dichloro-5,6-dicyano-1,4-benzoquinone). Halogen compounds include $F_2$, $Cl_2$, $Br_2$ and $I_2$. Interhalogen compounds include compounds of formulae XY, $XY_3$, $XY_5$ and $XY_7$ where X and Y are different halogen atoms.

If the oxidant comprises a cation or an anion as listed above, it will comprise a counterion. Typically the counter ion will be an unreactive species.

Preferably, the oxidant comprises a compound selected from TCNE, TCNQ, F4TCNQ, DDQ, 1,2-benzoquinone, 1,4-benzoquinone, 1,4-napthoquinone, dichlorobenzoquinone, chloranil, fluorine, chlorine, bromine, or iodine; or a cation selected from $[NAr_3]^+$, thianthrene cation, phenoxathiin cation, phenothiazine cation, N-methylphenothiazine cation, N-phenylphenothiazine cation, $[CAr_3]^+$, [Ru(phen)$_3$]$^{3+}$, [Fe(bipy)$_3$]$^{3+}$, [Fe($\eta$-$C_5H_4$COMe)$_2$]$^+$, [Fe($\eta$-$C_5H_4$COMe)Cp]$^+$, or [FeCp$_2$]$^+$;

wherein Ar is an unsubstituted or substituted aryl group. Optionally Ar may be an unsubstituted or substituted aryl or heteroaryl group. The aryl or heteroaryl group in the oxidant may be any aryl or heteroaryl group derived from an aryl or heteroaryl ring as defined above for the organic semiconductor.

The oxidant may alternatively consist of a compound as described or consist of a compound comprising a cation as defined.

Preferably, the oxidant comprises a cation selected from $[N(4-C_6H_4Br)_3]^+$, $[N(2,4-C_6H_3Br_2)_3]^+$, $[N(2,4,6-C_6H_2Br_3)_3]^+$, $N(4-C_6H_4Cl)_3]^+$, $[N(2,4-C_6H_3Cl_2)_3]^+$, $[N(2,4,6-C_6H_2Cl_3)_3]^+$, $[N(C_6Cl_5)_3]^+$, $[N(4C_6H_4-CN)_3]^+$, $[N(4-C_6H_4CO_2Me)_3]^+$, $[N(4-C_6H_4Me)_3]^+$, $[N(4-C_6H_4OMe)_3]^+$, or $[N(4-C_6H_4NO_2)_3]^+$. These are triarylamminium radical cations. $[NAr_3]^+$ could also be written as $[NAr_3]^{.+}$. They act as oxidants by accepting an electron and forming a neutral amine species. This amine species will often be soluble.

If the oxidant comprises a cation as given above, the oxidant will typically further comprise a (counter)anion selected from $[SbCl_6]^-$, $[BCl_4]^-$, $[AlCl_4]^-$, $[PF_6]^-$, $[SbF_6]^-$, $[BF_4]^-$, $[AlF_4]^-$, $[ClO_4]^-$, or $[NO_3]^-$. Preferably the oxidant will be a salt comprising a cation selected from $[N(4-C_6H_4Br)_3]^+$, $[N(2,4-C_6H_3Br_2)_3]^+$, $[N(2,4,6-C_6H_2Br_3)_3]^+$, $N(4-C_6H_4Cl)_3]^+$, $[N(2,4-C_6H_3Cl_2)_3]^+$, $[N(2,4,6-C_6H_2Cl_3)_3]^+$, $[N(C_6Cl_5)_3]^+$, $[N(4C_6H_4-CN)_3]^+$, $[N(4-C_6H_4CO_2Me)_3]^+$, $[N(4-C_6H_4Me)_3]^+$, $[N(4-C_6H_4OMe)_3]^+$, or $[N(4-C_6H_4NO_2)_3]^+$ and an anion selected from $[SbCl_6]^-$, $[BCl_4]^-$, $[AlCl_4]^-$, $[PF_6]^-$, $[SbF_6]^-$, $[BF_4]^-$, $[AlF_4]^-$, $[ClO_4]^-$, or $[NO_3]^-$, preferably $[SbCl_6]^-$ or $[SbF_6]^-$.

In one embodiment, the oxidant comprises $[N(4-C_6H_4Br)_3][SbCl_6]$ or $[N(4-C_6H_4Br)_3][SbF_6]$. The oxidant may comprise 90 to 100 wt % of one or more, typically one, of any of the oxidants given above. In some cases it is desirable to use a pure form (greater than 95% purity) of the oxidant to avoid the introduction of impurities.

Any of the compounds, reagents or solvents used in a process according to the invention may preferably be of greater than 90%, or greater than 95% purity.

Usually, the amount of oxidant used will be more than one equivalent of the amount of the organic semiconductor. Here, "equivalent" means either an equivalent amount per mole of the organic semiconductor, provided the organic semiconductor is a monomeric or small molecule species, or alternatively, in the case of a polymeric organic semiconductor, an equivalent amount per mole of monomer in the polymeric organic semiconductor. 1 equivalent equates to 100 mol %. Typically, the amount of oxidant used in (a) is from 0.9 to 5 equivalents, from 0.9 to 3 equivalents, or from 0.9 to 2 equivalents. Typically, the amount of oxidant used in (a) is from 1 to 5 equivalents, from 1 to 3 equivalents, from 1 to 2 equivalents, or from 1 to 1.5 equivalents. In one embodiment, the amount of the oxidant is from 1 to 2 equivalents relative to the amount of the organic semiconductor. One equivalent or more of the oxidant is desirable as this allows all of the organic semiconductor molecules to be oxidised to a cationic species leading to the production of a pure salt substantially free from unreacted organic semiconductor. In some cases, two or more equivalents of oxidant may be used if the desired resulting salt comprises dications of the organic semiconductor.

For example, (a) may comprise:

dissolving pure (greater than 95% purity) organic semiconductor powder in a halogenated aromatic hydrocarbon solvent at a concentration of from 0.1 to 4 gml$^{-1}$;

dissolving from 90 to 200 mol %, or from 100 to 150 mol % of an oxidant in a nitrile solvent at a concentration of from 1 to 5 g ml$^{-1}$; and adding the solution of the oxidant dropwise to a stirring solution of the organic semiconductor.

Alternatively, (a) may comprise:

dissolving pure (greater than 95% purity) powder of an organic semiconductor according to formula (V), (Va) or (Vb) above in chlorobenzene at a concentration of from 0.5 to 1.5 gml$^{-1}$;

dissolving from 95 to 110 mol % of a triarylamminium cation oxidant in acetonitrile at a concentration of from 3 to 4 g ml$^{-1}$; and adding the solution of the oxidant dropwise to a stirring solution of the organic semiconductor.

The concentrations of the two solutions may vary and will depend on the solubility of the organic semiconductor and the oxidant.

Often, (a) will further comprise a step of leaving the composition resulting from treating the organic semiconductor with an oxidant for 1, 2 or 3 days to ensure completion of the reaction. Typically, (a) may further comprise leaving the composition comprising the organic semiconductor and the oxidant for 1 to 3 days following treatment of the organic semiconductor with the oxidant. Preferably the composition is left at a low temperature. For example, step (a) may further comprise leaving the composition comprising the organic semiconductor and the oxidant for 1 to 3 days at a temperature of from 0 to 10° C. following treatment of the organic semiconductor with the oxidant. Optionally the temperature may be from 1 to 5° C.

Typically, before an anion exchange can be performed on the oxidised organic semiconductor to obtain the oxidised salt of the organic semiconductor with a suitable anion, the oxidation product of (a) may need to be isolated. Preferably the oxidation product is obtained at a moderately high purity (e.g greater than 80%). Typically, (b) comprises isolating the oxidation product by filtration, evaporation or recrystallisation. Filtration, evaporation or recrystallisation may be performed by any method well known in the art. For example, filtration may be carried out by passing a solution comprising a precipitate through a filter of some form, for instance a sintered filter, filter paper or a membrane. Filtration may be performed using a PTFE membrane with a pore size of from 0.1 to 0.3 µm.

The product of (a), i.e. the oxidation product, will typically have precipitated out of solution. Accordingly, in one embodiment (b) comprises isolating the oxidation product by filtration.

Optionally (b) further comprises a step wherein the oxidation product is washed following the isolation of the oxidation product. Washing serves to remove reaction byproducts and excess reagents. The oxidation product may be washed once, twice or three or more times. Washing may occur by any method, but in particular washing may comprise either rinsing the filtrate with a solvent or stirring the filtrate in a solvent and then refiltering. Typically, (b) may further comprise (following isolation of the oxidation product) a washing step comprising rinsing the filtrate with an alcohol solvent. For example, (b) may further comprise rinsing the isolated oxidation product with cold methanol. A further washing step of stirring the filtrate in toluene and refiltering may also be carried out.

Optionally between (b) and (c) a step may be performed wherein the oxidation product is dissolved in an alcohol and placed in a sonicator bath for from 5 to 20 minutes. Typically the alcohol is methanol.

The anion exchange step (c) allows a desirable (preferred) anion to be paired with the oxidised organic semiconductor cation. As discussed above, preferable anions are those with diffuse negative charges. The anion exchange may be performed by any method. A preferred method for carrying out (c) is treating the oxidation product obtained from (a) and (b) with an excess of a salt comprising the suitable anion, A. Generally, an excess of a salt will be an amount from 5 to 40 equivalents, from 10 to 30 equivalents or from 15 to 25 equivalents of the salt comprising A relative to the amount of the organic semiconductor (wherein the amount of the organic semiconductor will refer either to the number of moles of the organic semiconductor in the case or a monomeric organic semiconductor, or the number of moles of the relevant monomers in a polymeric organic semiconductor as discussed above).

The anion exchange may alternatively be performed by any anion exchange method, for example by using ion exchange resins or by treating with a salt.

Typically, (c) comprises treating the oxidation product with a salt comprising A. In one embodiment, (c) comprises treating the oxidation product with from 10 to 30 equivalents of a salt comprising A to produce an oxidised salt of the organic semiconductor comprising A.

The anion A may be as described anywhere above. Preferably (c) comprises performing an anion exchange with A as defined in formula (i) above with X as an EWG, preferably $CF_3$ or $CF_2CF_3$. Preferably A is TFSI or BETI.

Often, (c) comprises treating a composition comprising the oxidation product and a solvent with a salt comprising the suitable anion, A. Step (c) may comprise treating a composition comprising the oxidation product and a first solvent with a composition comprising a second solvent and a salt, wherein the salt comprises A. The first and second solvents are typically organic solvents. Often, the first and second solvents will be alcohols, preferably ethanol or methanol.

In some cases the oxidation product will be treated with the salt comprising A by adding the salt as a solid to a solution comprising the oxidation product.

For example, (c) may comprise:
dissolving the oxidation product obtained in (a) and (b) in a solvent, or providing a solution of the oxidation product obtained in (a) and (b) in a solvent; and
treating the solution comprising the oxidation product obtained in (a) and (b) with from 10 to 30 equivalents of a salt comprising the anion A.

In particular, (c) may comprise:
dissolving the oxidation product obtained in (a) and (b) in a solvent, or providing a solution of the oxidation product obtained in (a) and (b) in a solvent; and
adding from 10 to 30 equivalents of a salt comprising A to the solution comprising the oxidation product obtained in (a) and (b).

Typically the oxidation product is treated with the salt comprising A for from 2 to 48 hours, from 6 to 24 hours, or from 8 to 16 hours. The treatment may occur at a temperature of from 0 to 10° C. or from 0 to 5° C. The composition may be stirred for this time. (c) may comprise leaving the composition comprising a solvent, the oxidation product and the excess of a salt comprising A at from 0 to 5° C. for from 6 to 24 hours, or from 8 to 16 hours.

For instance, (c) may comprise dissolving the oxidation product in methanol, optionally sonicating the solution, adding 20 equivalents of a salt comprising A and leaving the resulting solution for from 8 to 16 hours at from 0 to 5° C.

The salt comprising A for use in the anion exchange of (b) will typically be of formula [M][A] (where the square bracket notation has the same meaning regarding stoichiometry and the presence of additional ions as above for [OS][A]) wherein M is any suitable cation. A suitable cation is one which does not react with the oxidation product in an undesirable manner, or does not react all. M is generally a spectator cation. In one embodiment, (c) comprises treating the oxidation product with a salt of formula [M][A], wherein M is a cation selected from a metal cation, an ammonium cation or a sulfonium cation.

A metal cation is a cation obtained from the ionisation of a metal atom. The cation may be of any metal selected from groups 1 to 16 of the Periodic Table of the Elements. These metals include Li, Be, Na, Mg, Al, K, Ca, Sc, Ti, V, Cr, Mn, Fe, Co, Ni, Cu, Zn, Ga, Rb, Sr, Y, ZR, Nb, Mo, Ru, Rh, Pd, Ag, Cd, In, Sn, Cs, Ba, Lu, Hf, Ta, W, Re, Os, Ir, Pt, Au, Hg, Tl, Pb or Bi or any of the non-radioactive lanthanides. M may be a metal cation of any of these metals. In one embodiment, M is selected from $Li^+$, $Na^+$, $K^+$, $Rb^+$, $Cs^+$, $Be^{2+}$, $Mg^{2+}$, $Ca^{2+}$, $Sr^{2+}$, $Ba^{2+}$, $Ag^+$ or $Zn^{2+}$, preferably $Li^+$ or $Ag^+$.

Ammonium cations include any cations comprising a nitrogen atom on which a positive charge is at least partially localised. For example, this includes quaternary ammonium cations ($NR_4^+$, $NHR_3^+$, $NH_2R_2^+$, $NH_3R^+$ or $NH_4^+$, where each R is a $C_{1-8}$ alkyl group or aryl group) and pyridinium cations. If M is an ammonium cation it may be as defined below for the organic cation in the semiconducting perovskite. Sulfonium cations include trialkyl sulfonium cations where each alkyl group is the same or different and is a $C_{1-8}$-alkyl group, and each group may be optionally joined to each other to form a ring.

[M][A] may be a salt of formula LiTFSI, NaTFSI, KTFSI, AgTFSI, $Zn(TFSI)_2$, LiBETI, NaBETI, KBETI, AgBETI, $Zn(BETI)_2$. Accordingly, (c) may comprise treating the oxidation product with a salt selected from LiTFSI, NaTFSI, KTFSI, AgTFSI, $Zn(TFSI)_2$, LiBETI, NaBETI, KBETI, AgBETI, $Zn(BETI)_2$. Optionally, (c) may comprise treating the oxidation product with a salt selected from LiTFSI, or AgTFSI. The salt may be added as a powder or in solution as described above. Typically, (c) comprises treating the oxidation product with 10 to 30 equivalents of a salt comprising the anion A, such as those described above.

Once the anion exchange has occurred, the oxidised salt of the organic semiconductor comprising A will have been produced. Next, (d) comprises isolating the oxidised salt of the organic semiconductor. The oxidised salt of the organic semiconductor may be isolated by filtration, evaporation or recrystallisation. If the oxidised salt of the organic semiconductor is insoluble and has precipitated out of solution following anion exchange, the oxidised salt of the organic semiconductor is preferably isolated by filtration. The isolation step may be as described anywhere herein. For example, filtration may be carried out by passing a solution comprising a precipitate through a filter of some form, for instance a sintered filter, filter paper or a membrane (such as a PTFE membrane with a pore size of from 0.1 to 0.3 µm).

Following isolation of the oxidised salt of the organic semiconductor, it is optionally washed. The washing may be as described above for washing the oxidation product. Preferably the oxidised salt of the organic semiconductor is washed using an alcohol, for instance methanol, e.g. cold methanol. Cold methanol may have a temperature of less than 15° C., or of less than 10° C., for example from −10 to 10° C. The resulting washed product, which may be a powder, is then optionally dried. It may be dried by heating or by vacuum.

The resulting oxidised salt of an organic semiconductor may then be used as a p-dopant in a process according to the invention.

In one embodiment, treating the organic semiconductor with a composition comprising the oxidised salt of the organic semiconductor comprises: mixing the organic semiconductor with a composition comprising the oxidised salt of the organic semiconductor.

The organic semiconductor is typically a solid, and is usually in the form of a powder. The composition comprising the oxidised salt of the organic semiconductor (which usually comprises from 80 to 100 wt % of the oxidised salt of the organic semiconductor) is also typically a powder. In other embodiments, however, the composition comprising the oxidised salt of the organic semiconductor may be in a melt or liquid phase at room temperature. Often, however, both the organic semiconductor and the composition comprising the oxidised salt of the organic semiconductor are both solids. Typically, they are both powders. Usually, the powders are weighed out separately and dispensed into a single container (e.g. vial) where they can be shaken or stirred. The resulting dry mixed powder is then optionally heated, which may melt it.

Thus, the process of treating the organic semiconductor with a composition comprising the oxidised salt of the organic semiconductor usually comprises mixing a powder of the composition comprising the oxidised salt of the organic semiconductor with a powder of the organic semiconductor. The process may optionally further comprise heating the resulting mixture, for instance heating and consequently melting the resulting mixture. The melted mixture may then be allowed to cool.

Alternatively, a composition comprising a first solvent and the oxidised salt of the organic semiconductor may be mixed with a composition comprising a second solvent and the organic semiconductor. The oxidised salt of the organic semiconductor and the organic semiconductor may each independently be dissolved or suspended in their respective solvents. The solvent or solvents may then be removed (as described anywhere herein) to produce a doped organic semiconductor. The first solvent and second solvent are both typically organic solvents as described above.

The amount of the oxidised salt of the organic semiconductor used to dope the organic semiconductor may vary, and is preferably less than or equal to 60 mol % or less than or equal to 50 mol %. Typically, the organic semiconductor is treated with from 0.01 to 50 mol %, or from 0.1 to 50 mol % of the oxidised salt of the organic semiconductor relative to the amount of the organic semiconductor. Occasionally the amount of the oxidised salt of the organic semiconductor may be from 10 to 40 mol %.

The invention also provides a process for producing a p-doped organic semiconductor comprising treating an organic semiconductor other than polyaniline with a protic ionic liquid.

Typically, the organic semiconductor other than polyaniline which is treated with the protic ionic liquid is an organic semiconductor comprising a triarylamine moiety, an organic semiconductor comprising a conjugated polymer other than polyaniline, an organic semiconductor comprising a conjugated oligomer, or an organic semiconductor comprising a polycyclic aromatic hydrocarbon.

The organic semiconductor which is treated with the protic ionic liquid may for instance comprise a compound of formula (V), (I), (II), (III), (IV), (VI) or (VII):

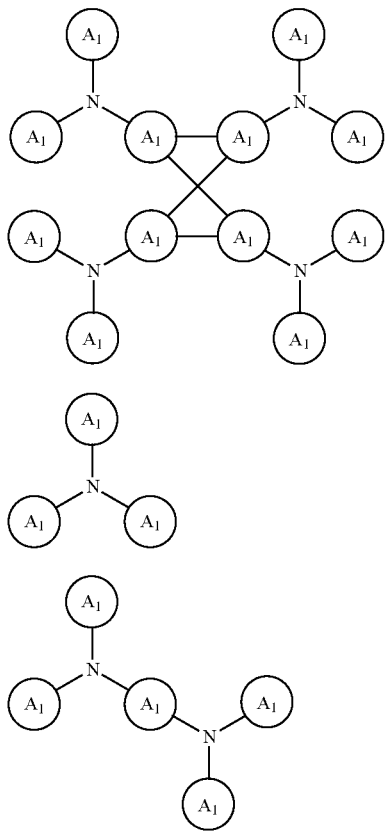

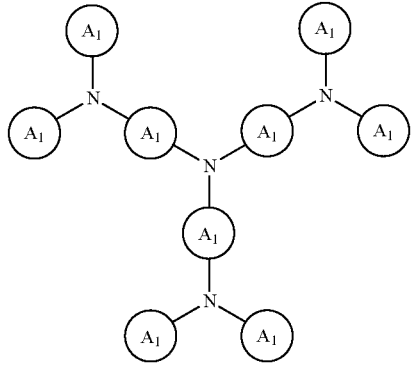

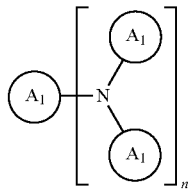

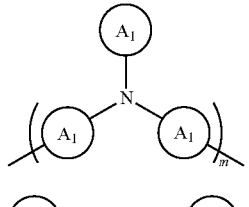

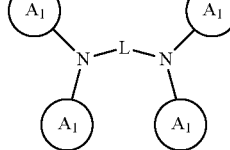

wherein:
each $A_1$ is the same or different and is an unsubstituted or substituted aryl ring or an unsubstituted or substituted heteroaryl ring;
L is a conjugated linker;
n is 3 or 4; and
m is an integer of 2 or more.

This process may be as further defined for any of the processes of the invention wherein an organic semiconductor is treated with an oxidised salt of an organic semiconductor where applicable, except that the oxidised salt is replaced with the protic ionic liquid. For example, the organic semiconductor may comprise a compound of formula (V). The protic ionic liquid may be selected from any protic ionic liquid given herein. Often the protic ionic liquid will be selected from HTFSI or Himi-TFSI. The organic semiconductor may be as further described anywhere herein and or the protic ionic liquid may be as described anywhere herein (above or below).

The organic semiconductor which is treated with the protic ionic liquid may for instance comprise unsubstituted or substituted polythiophene, such as poly(3-hexylthiophene), or an unsubstituted or substituted oligothiophene, such as sexithiophene.

The organic semiconductor which is treated with the protic ionic liquid may for instance comprise a compound of formula (V), (Va) or (Vb) as defined herein or poly(3- hexylthiophene), poly[N,N-diphenyl-4-methoxyphenylamine-4',4"-diyl] or sexithiophene. Usually, the organic semiconductor which is treated with the protic ionic liquid comprises a compound of formula (V), (Va) or (Vb) as defined herein.

Typically, the protic ionic liquid is a compound of formula PA wherein P is a cation selected from $H^+$, $H_3O^+$, an ammonium cation, an imidazolium cation, a pyridinium cation, a pyrrolidonium cation or an indolium cation; and wherein A is as defined in anywhere herein.

Often, P is a cation selected from $H^+$, $H_3O^+$, $NR_4^+$, $NHR_3^+$, $NH_2R_2^+$, $NH_3R^+$ or $NH_4^+$,

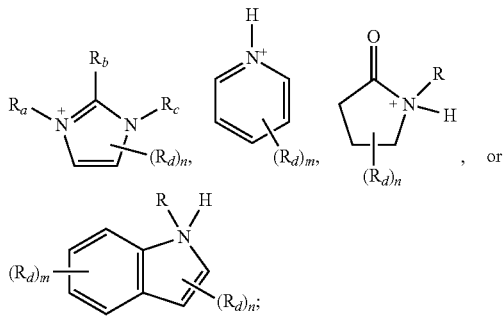

wherein R is independently selected from $C_{1-8}$ alkyl, $C_{2-8}$ alkenyl or aryl;

wherein $R_a$, $R_b$, and $R_c$ are independently selected from H, $C_{1-8}$-alkyl, $C_{2-8}$-alkenyl or aryl, and at least one of $R_a$, $R_b$, and $R_c$ is H;

$R_d$ is independently a substitutent selected from those described above;

n is an integer from 0 to 2; and m is an integer from 0 to 4.

Often, P is a cation selected from $H^+$, $H_3O^+$, $NR_4^+$, $NHR_3^+$, $NH_2R_2^+$, $NH_3R^+$ or $NH_4^+$,

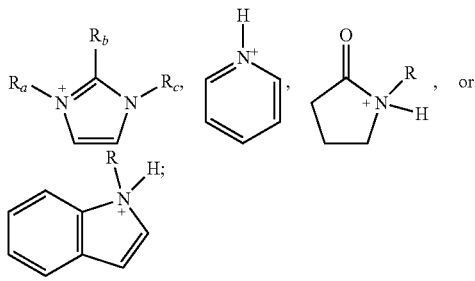

wherein R is independently selected from $C_{1-8}$ alkyl, $C_{2-8}$ alkenyl or aryl; and wherein $R_a$, $R_b$, and $R_c$ are independently selected from H, $C_{1-8}$-alkyl, $C_{2-8}$-alkenyl or aryl, and at least one of $R_a$, $R_b$, and $R_c$ is H.

R may optionally be selected from methyl, ethyl or phenyl.

Sometimes, P is a cation of formula

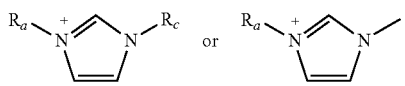

wherein $R_a$ and $R_c$ are independently selected from H, $C_{1-8}$-alkyl, $C_{2-8}$-alkenyl or aryl, and preferably H or $C_{1-8}$-alkyl.

The anion is an anion as defined anywhere herein for the oxidised salt of the organic semiconductor. The anion may be an anion A of formula (i), (ii), (iii) and (iv) above, for example it may be an anion of formula (i).

Preferably, the protic ionic liquid is selected from HTFSI, 1-alkyl-3-methylimidazolium-TFSI, HBETI, and 1-alkyl-3-methylimidazolium-BETI. Here, alkyl may be any $C_{1-8}$alkyl group, which may be substituted or unsubstituted, but is preferably unsubstituted. The alkyl group may be selected from methyl, ethyl, propyl, isopropyl, butyl, sec-butyl, pentyl or hexyl. In one embodiment, the protic ionic liquid is selected from HTFSI, 1-methyl-3-methylimidazolium-TFSI, 1-ethyl-3-methylimidazolium-TFSI, 1-propyl-3-methylimidazolium-TFSI and 1-butyl-3-methylimidazolium-TFSI.

The invention also provides a process for producing a layer of p-doped organic semiconductor comprising:

(a) producing a p-doped organic semiconductor by a process as described anywhere above;

(b) disposing on a substrate a solvent and the p-doped organic semiconductor; and (c) removing the solvent.

Step (b) may for instance comprise disposing on a substrate a composition comprising a solvent and the p-doped organic semiconductor.

The term "disposing", as used herein, refers to the placing or making available of a component in a specified location, in this case on, in or near a surface of a substrate. The disposition of a component onto a substrate does not necessarily imply that the component is disposed directly onto the substrate, there may be an intervening layer or intervening layers (between the substrate and the layer disposed or being disposed). Typically, the disposing of a component will involve the deposition of the component on a surface of the substrate. The disposition may be performed on more than one surface of the substrate.

The disposition of a component, composition, solution or dispersion on the substrate may occur by any appropriate process. For instance by spin-coating, spray-coating, slot-die-coating, screen-printing, doctor blade coating, Gravure printing, inkjet printing, thermal evaporation, sputter coating, or any other vapour deposition. Preferably the disposition of a component occurs by spin-coating, slot-die-coating or spray coating.

Here, the solvent may be any solvent as described above. Preferably the solvent is a halogenated solvent such as a halogenated aromatic hydrocarbon solvent. The solvent may be chlorobenzene.

Part (a) may comprise: mixing the organic semiconductor with a composition comprising an oxidised salt of the organic semiconductor. As mentioned above, the organic semiconductor is typically a solid, and is usually in the form of a powder. The composition comprising the oxidised salt of the organic semiconductor (which usually comprises from 80 to 100 wt % of the oxidised salt of the organic semiconductor) is also typically a powder. However, the composition comprising the oxidised salt of the organic semiconductor may alternatively be in a melt or liquid phase. Often, however, both the organic semiconductor and the composition comprising the oxidised salt of the organic semiconductor are both solids. Usually, they are both powders. The two powders are typically weighed out separately and dispensed into a single container (e.g. vial) where they can be shaken or stirred. The resulting dry mixed powder is then optionally heated, which may melt it.

Thus, step (a) usually comprises mixing a powder of the composition comprising the oxidised salt of the organic semiconductor with a powder of the organic semiconductor. The process may optionally further comprise heating the resulting mixture, for instance heating and consequently melting the resulting mixture. The mixture may be heated for example at a temperature from 50 to 400° C. The melted mixture may then be allowed to cool.

The mixture may then be dissolved in a solvent, for example an aromatic hydrocarbon solvent or a halogenated aromatic hydrocarbon solvent such as chlorobenzene. Alternatively (a) may involve mixing a composition comprising a first solvent and the oxidised salt of the organic semiconductor may be mixed with a composition comprising a second solvent and the organic semiconductor. The first and second solvents may be as defined anywhere herein. For instance the first and second solvents may be halogenated hydrocarbon solvents, such as chlorobenzene or chlorobenzyl.

Alternatively, step (a) may comprise treating an organic semiconductor with a protic ionic liquid, wherein the organic semiconductor and the protic ionic liquid may be as further defined herein.

The substrate upon which the layer of the p-doped organic semiconductor is produced by the process of the invention may be any substrate. The substrate may be composed of a single material or a mixture of materials, and may be homogeneous or inhomogeneous, planar or curved, smooth or rough. The substrate may be conducting, semiconducting or insulating.

In one embodiment, the substrate will be a substrate suitable for use in a semiconductor device. The term "substrate suitable for use in a semiconductor device", as used herein, refers to any substrate that may be used as a material within a semiconductor device without preventing the functioning of the device. The substrate suitable for use in a semiconductor device may be a component which serves a functional purpose within a semiconductor device. The substrate may be a layer of an electrode material, an insulating layer, an electron transporter layer, a hole transporter layer or a semiconducting layer. In one embodiment, the substrate comprises an electrode material or a compact layer of a semiconductor material. The term "electrode material", as used herein, refers to an electrically conducting material which may be in contact with another material such as a semiconductor material or an electrolyte. Electrode materials may comprise a range of materials. In particular the substrate may be an electrode material comprising a metal or mixture of metals (e.g. Al, Steel, Mo, Cu, Ag, Au or Pt, or a metal selected from any of those described above), graphite or a transparent conducting oxide (e.g. ITO (indium tin oxide), FTO (fluorine doped tin oxide) or AZO (aluminium doped zinc oxide)). The substrate may also be, in particular, a compact layer of a semiconductor material. The term "compact layer", as used herein, refers to a layer of substantially a single thickness of a material wherein the space occupied by the layer consists essentially of the material comprised in the layer (i.e. there are substantially no spaces within the layer). A compact layer may have low porosity (e.g. less than 10% porosity and preferably less than 1%). A compact layer may be essentially homogeneous. A compact layer may be crystalline, or may comprise microcrystalline, nanocrystalline or amorphous material. A compact layer may be an oxide, or a hydrated oxide.

In particular, the substrate upon which the composition comprising the p-doped organic semiconductor is disposed may be a layer of a semiconductor material or a sensitized layer of a semiconductor material. The semiconductor may in particular be an electron transport material. For instance the substrate may comprise a layer of an electron transport material and a layer of a sensitizing material such as a dye or a semiconducting perovskite.

The term "semiconductor material", as used herein, refers to a material with electrical conductivity intermediate in magnitude between that of a conductor and an insulator. Typically, a semiconductor material is a material that has a conductivity of from $10^3$ to $10^{-8}$ Scm$^{-1}$. Standard techniques such as a 4-point probe conductivity measurement may be used to measure conductivity. Examples of semiconductor materials include an oxide or chalcogenide of a metal or metalloid element; a group IV compound; a compound comprising a group III element and a group V element; a compound comprising a group II element and a group VI element; a compound comprising a group I element and a group VII element; a compound comprising a group IV element and a group VI element; a compound comprising a group V element and a group VI element; a compound comprising a group II element and a group V element; a ternary or quaternary compound semiconductor; a perovskite semiconductor or an organic semiconductor. Typical examples of semiconductor materials include oxides of titanium, niobium, tin, zinc, cadmium, copper or lead; chalcogenides of antimony or bismuth; copper zinc tin sulphide; copper zinc tin selenide, copper zinc tin selenide sulphide, copper indium gallium selenide; and copper indium gallium diselenide. Further examples are group IV compound semiconductors (e.g. silicon carbide); group III-V semiconductors (e.g. gallium arsenide); group II-VI semiconductors (e.g. cadmium selenide); group I-VII semiconductors (e.g. cuprous chloride); group IV-VI semiconductors (e.g. lead selenide); group V-VI semiconductors (e.g. bismuth telluride); and group II-V semiconductors (e.g. cadmium arsenide); ternary or quaternary semiconductors (eg. copper indium selenide, copper indium gallium diselenide, or copper zinc tin sulphide); perovskite semiconductor materials (e.g. $CH_3NH_3PbI_3$ and $CH_3NH_3PbI_2Cl$); and organic semiconductor materials (e.g. conjugated polymeric compounds including polymers such as polyacetylenes, polyphenylenes and polythiophenes). Examples of organic semiconductors include poly(3,4-ethylenedioxythiophene), 2,2-7,7-tetrakis-N,N-di-p-methoxyphenylamine-9,9-spirobifluorene (spiro-OMeTAD) and conjugated organic polymers such as polyacetylenes, polyphenylenes, polythiophenes or polyanilines. Examples of materials which are not semiconductor materials include, for instance elemental metals, which are of course conductors, and electrical insulators or dielectrics such as silica or calcite.

Preferably the substrate on which the layer of p-doped semiconductor is disposed will comprise an electrode material and a layer of sensitized semiconductor material. Typically this layer of sensitized semiconductor material will comprise an inorganic semiconductor material. This layer may be sensitized by a dye or semiconducting perovskite. Possible dyes and perovskites are those as described below (for dye-sensitized or perovskite-sensitized solar cells).

The terms "removing the solvent" or "removing the solvents", as used herein, refer to removal of all or a part of the solvent or solvents from a composition. Preferably, all solvent present is removed, although traces (e.g. less than 1 wt %) of solvent may remain without necessarily affecting the performance of the resulting semiconductor layer. If part of the solvent is removed, it is preferably a substantial part of the solvent (e.g. greater than 90%) which is removed. If more than one solvent is present, removal of the solvent may refer to removal to all of, or a substantial part of, both solvents.

The solvent may be removed by any process, such as allowing the solvent to evaporate, by heating or by vacuum evaporation. Preferably the solvent is removed by heating. The heating may involve heating the solvent at a temperature from 50° C. to 300° C. Typically, the removal of the solvent by heating comprises heating the solvent at a temperature from 100° C. to 200° C.

The removal of the solvent or solvents can occur over any period of time. Typically, it will occur over from 10 minutes to 24 hours. If the solvent or solvents are removed by heating or vacuum evaporation, this may be undertaken over from 10 minutes to 24 hours, from 10 minutes to 10 hours, from 15 minutes to 5 hours or from 20 minutes to 2 hours.

The term "heating", as used herein, refers to the heating of the whole or part of the system in which the process of the invention is performed. In some cases, the substrate and the composition disposed on the substrate will be heated. In some cases, the solvent or solvents will be heated. The solvent may be heated by heating the substrate.

The invention also provides a process for producing a layer of a p-doped organic semiconductor comprising disposing on a substrate an organic semiconductor and a protic ionic liquid.

Often, the process comprises
(a) disposing on a substrate a solvent, an organic semiconductor and a protic ionic liquid; and
(b) removing the solvent.

The organic semiconductor may be as defined anywhere herein for any of the aspects of the invention. Preferably the organic semiconductor comprises a basic heteroatom, for example an N atom. Often the organic semiconductor is an organic semiconductor comprising a triarylamine moiety, such as those defined in formulae (I) to (VI) above. Sometimes the organic semiconductor is as defined for formula (V) or formula (Va) or formula (Vb) above. In one embodiment the organic semiconductor is Spiro-OMeTAD.

Methods of disposition may be as described anywhere above. The solvent may comprise a solvent as described anywhere above. The solvent may comprise two or more solvents, each as described above.

In one embodiment, the disposition of the components in part (a) of the process on the substrate comprises disposing on the substrate: 1) a composition comprising the solvent and the organic semiconductor; and 2) the protic ionic liquid. These may be disposed either simultaneously, or one after the other. Typically, the organic semiconductor will be dissolved in the solvent, but it may be dispersed or suspended in the solvent. Optionally, the protic ionic liquid is disposed on the surface first, and then the composition comprising the solvent and the organic semiconductor is disposed on the surface second.

In another embodiment, the disposition of the components in part (a) of the process on the substrate comprises disposing on the substrate: 1) a composition comprising the solvent and the protic ionic liquid; and 2) the organic semiconductor. These may be disposed either simultaneously, or one after the other. Typically, the protic ionic liquid will be dissolved in the solvent.

In another embodiment, the disposition of the components in part (a) of the process on the substrate comprises disposing on the substrate: 1) a composition comprising the organic semiconductor and the protic ionic liquid; 2) and the solvent. These may be disposed either simultaneously, or one after the other. Typically, the organic semiconductor and the protic ionic liquid will be disposed as a mixture of the two components.

Preferably, the disposition of the components in part (a) of the process the substrate comprises disposing on the substrate a composition comprising the solvent, the organic semiconductor and the protic ionic liquid. Typically the composition will be a homogeneous composition in which the protic ionic liquid is dissolved in or mixed with the solvent and the organic semiconductor will be dissolved, dispersed or suspended in the solvent. Preferably both the protic ionic liquid and the organic semiconductor are dissolved in the solvent. Preferably the solvent comprises chlorobenzene, chlorobenzyl, acetonitrile or both chlorobenzene and acetonitrile. The composition comprising the solvent, the organic semiconductor and the protic ionic liquid may be produced first by combining the components, and then allowed to react for some time (say from 5 to 30 minutes) before disposition on the substrate.

A composition comprising the solvent, the organic semiconductor and the protic ionic liquid may be formed by mixing a composition comprising a first solvent and the organic semiconductor with a composition comprising a second solvent and the protic ionic liquid. The first solvent may comprise any organic solvent, and may optionally comprise chlorobenzene. The second solvent may comprise any organic solvent, and may optionally comprise acetonitrile. It is possible that the protic ionic liquid itself acts as a solvent. Accordingly, sometimes the solvent and the protic ionic liquid may be the same species.

In one embodiment, the process according to the invention comprises:
a) disposing on the substrate
  i) a first composition comprising the protic ionic liquid, and
  ii) a second composition comprising the organic semiconductor, wherein at least one of the first and the second composition also comprises the solvent; and
b) removing the solvent.

Here, the first composition typically further comprises the solvent which is a first solvent, and the second composition further comprises a second solvent, wherein the first and second solvents are the same or different and where part (b) comprises removing the first and second solvents. Preferably, the first composition comprises the protic ionic liquid dissolved in the first solvent, and the second composition comprises the organic semiconductor dissolved in the second solvent. The first solvent may comprise any organic solvent, and may optionally comprise chlorobenzene. The second solvent may comprise any organic solvent, and may optionally comprise acetonitrile.

Protic ionic liquids (PIL's) are known in the art and are discussed in the review article Chem. Rev. 2008, 108, 206-237, the contents of which are incorporated herein by reference in their entirety. "Protic ionic liquid" and "PIL" are therefore terms of art.

A protic ionic liquid (PIL) is generally a Brønsted acid-base combination of an anion and cation in which a proton transfer from acid to base creates two molecular ions. The archetypal PIL is bis(trifluoromethanesulfonyl)-imide (H-TFSI), in which the cation coincides with the proton and the anion is the bis(trifluoromethylsulphonyl)amide $(CF_3SO_2-N-SO_2CF_3)^-$. The extremely electron-withdrawing $CF_3SO_2^-$ groups reduce the basic character of the imide nitrogen, delocalizing the negative charge all over the anion. As consequence, in solution at low concentration, the self-dissociation of H-TFSI produces "free" protons in the organic solution similar to an aqueous HCl solution. In presence of organic bases, a proton-transfer process can results in a protonated molecular cation associated with the TFSI anion. Equation (1) describes the proton-transfer process, where the base could be a small molecule organic semiconductor (OS). These dissociation and protonation are the keys to understanding the PIL doping mechanism, which will be described subsequently.

$$H^+TFSI^- + OS \leftrightarrow OS{-}H^+TFSI^- \tag{1}$$

The equilibrium described in equation (1) depends on the basic character of the organic semiconductor. Stronger bases lead to a greater driving force for the proton transfer. The acidic character of the PIL may also be varied to control the proton transfer rate. Indeed, in addition to H-TFSI, several N-heterocyclic ionic liquids have been reported as weak Brønsted acid, which can release protons in presence of bases. In particular, 1-alkyl-3-methylimidazolium bis(trifluoromethylsulphonyl)amide (Himi-TFSI) has been shown to lead to stable carbenes by means of a proton release from the aromatic ring. For molecules with low ionization energy, as the case of organic semiconductors, the protonated cations (OS—H$^+$) associated with this particular counterion (TFSI$^-$) can oxidise the neutral species (p-doping), as described in the Equation 2:

$$OS{-}H^+TFSI^- + OS \leftrightarrow OS\text{-}H^- + OS^+TFSI^- \tag{2}$$

Protic ionic liquids show remarkable properties including negligible vapour pressures, low melting points, non-flammability and good solvation of many organic or inorganic chemicals. The good solvation and solubility is in contrast to mineral acids such as HCl and $H_2SO_4$ which have poor solubility in organic solvents. This allows PILs to acid dope more "cleanly". PILs typically have a melting point of less than 100° C. or less than 80° C. In some cases the melting point of a PIL may be less than 50° C. Generally a PIL will have a melting point of greater than −50° C. A PIL is usually therefore a salt comprising an ion capable of donating a proton, wherein the salt has a melting point of less than or equal to 100° C., or of less than or equal to 50° C. (and generally greater than −50° C.).

The protic ionic liquid may be a compound of formula PA wherein P is a cation selected from H$^+$, $H_3O^+$, $NH_4^+$ or an organic cation with a molecular mass of less than 200 gmol$^{-1}$, wherein the organic cation is capable of donating a proton; and wherein A is as defined anywhere above. PA may be referred to as a compound or a salt, a salt being an ionic compound.

Typically, the protic ionic liquid is a compound of formula PA wherein P is a cation selected from H$^+$, $H_3O^+$, an ammonium cation, an imidazolium cation, a pyridinium cation, a pyrrolidonium cation or an indolium cation; and wherein A is as defined in anywhere herein.

Often, P is a cation selected from H$^+$, $H_3O^+$, $NR_4^+$, $NHR_3^+$, $NH_2R_2^+$, $NH_3R^+$ or $NH_4^+$,

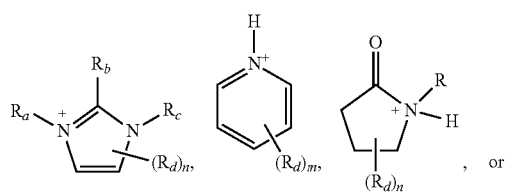
, or

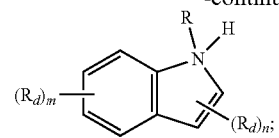

wherein R is independently selected from $C_{1-8}$ alkyl, $C_{2-8}$ alkenyl or aryl;

wherein $R_a$, $R_b$, and $R_c$ are independently selected from H, $C_{1-8}$-alkyl, $C_{2-8}$-alkenyl or aryl, and at least one of $R_a$, $R_b$, and $R_c$ is H;

$R_d$ is independently a substitutent selected from those described above;

n is an integer from 0 to 2; and m is an integer from 0 to 4.

Often, P is a cation selected from H$^+$, $H_3O^+$, $NR_4^+$, $NHR_3^+$, $NH_2R_2^+$, $NH_3R^+$ or $NH_4^+$,

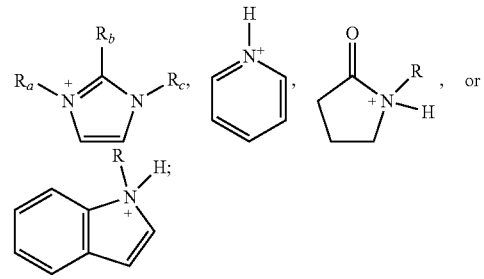

wherein R is independently selected from $C_{1-8}$ alkyl, $C_{2-8}$ alkenyl or aryl; and wherein $R_a$, $R_b$, and $R_c$ are independently selected from H, $C_{1-8}$-alkyl, $C_{2-8}$-alkenyl or aryl, and at least one of $R_a$, $R_b$, and $R_c$ is H.

R may optionally be selected from methyl, ethyl or phenyl.

Sometimes, P is a cation of formula

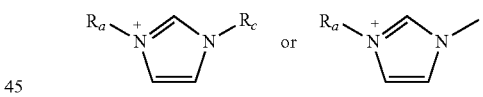

wherein $R_a$ and $R_c$ are independently selected from H, $C_{1-8}$-alkyl, $C_{2-8}$-alkenyl or aryl, and preferably H or $C_{1-8}$-alkyl.

The anion is an anion as defined anywhere herein for the oxidised salt of the organic semiconductor. The anion may be an anion A of formula (i), (ii), (iii) and (iv) above, for example it may be an anion of formula (i).

Preferably, the protic ionic liquid is selected from HTFSI, 1-alkyl-3-methylimidazolium-TFSI, HBETI, and 1-alkyl-3-methylimidazolium-BETI. Here, alkyl may be any $C_{1-8}$alkyl group, which may be substituted or unsubstituted, but is preferably unsubstituted. The alkyl group may be selected from methyl, ethyl, propyl, isopropyl, butyl, sec-butyl, pentyl or hexyl. In one embodiment, the protic ionic liquid is selected from HTFSI, 1-methyl-3-methylimidazolium-TFSI, 1-ethyl-3-methylimidazolium-TFSI, 1-propyl-3-methylimidazolium-TFSI and 1-butyl-3-methylimidazolium-TFSI. The abbreviation "TFSI", as used herein, refers to bis(trifluoromethanesulfonyl)imide and the abbreviation "BETI", as used herein, refers to bis(pentafluoroethanesulfonyl)imide.

The composition disposed may comprise two or more protic ionic liquids. Typically the composition comprises a single protic ionic liquid.

In some cases, the composition comprising a solvent, the organic semiconductor and a protic ionic liquid may be obtainable by treating a composition comprising the organic semiconductor and a first solvent with a composition comprising the protic ionic liquid and a second solvent. For example, the process may further comprise producing the composition comprising a solvent, the organic semiconductor and a protic ionic liquid by treating a composition comprising the organic semiconductor and a first solvent with a composition comprising the protic ionic liquid and a second solvent. Optionally the first solvent is chlorobenzene and second solvent is acetonitrile.

The amount of the PIL relative to the amount of the organic semiconductor is typically less than or equal to 50 mol %. Usually, it is less than 50 mol %.

Typically, the amount of the protic ionic liquid is from 0.0001 to 50 mol % relative to the amount of the organic semiconductor. Often, the amount of the protic ionic liquid is from 0.01 to 50 mol % relative to the amount of the organic semiconductor. Occasionally, the amount of the protic ionic liquid is from 0.1 to 40 mol %, from 1 to 35 mol %, or from 5 to 30 mol % relative to the amount of the organic semiconductor.

Any reagent, reactant or process condition in the process for p-doping using a protic ionic liquid may be as described anywhere above for any process of the invention.

The substrate may be any suitable substrate as defined above. In particular the substrate may comprises an electrode material as defined above or a semiconductor material as defined above. The substrate may comprise a mesoporous layer of a semiconductor material, for example mesoporous $TiO_2$ or a mesoporous layer of a dielectric material, for example mesoporous $Al_2O_3$. The substrate may be sensitized with a dye or a semiconducting perovskite.

Typically, (a) is performed in an inert atmosphere, i.e. the absence of oxygen and water. Solvents used in (a) may optionally be degassed before use by bubbling an inert gas, such as nitrogen, through them. The degassing may be performed for from 1 to 3 hours. Preferably the PILs obtained are substantially free of water.

Often (a) may comprise one or more of the following:
(i) preparing a solution of an organic semiconductor at a concentration of from 1 to 500 mM, or from 10 to 200 mM in a first solvent;
(ii) stirring the solution at a temperature of from 50 to 100° C., or from 60 to 80° C. for a time of from 6 to 24 hours, or from 8 to 12 hours;
(iii) preparing a solution of a PIL at a concentration of from 5 to 20% by volume of the final composition in a second solvent;
(iv) adding the PIL solution to the solution comprising the organic semiconductor;
(v) stirring the solution comprising the organic semiconductor, the PIL and the first and second solvents at a temperature of from 90 to 150° C., or from 110 to 130° C. for a time of from 6 to 24 hours, or from 8 to 12 hours;
(vi) cooling the solution to from 15 to 30° C.;
(vii) filtering the reaction mixture; and
(viii) disposing the resulting composition on a substrate.

Typically (a) comprises (i) to (viii), or (a) comprises (i), (iii), (iv) and (viii).

The filtering in (vii) (an elsewhere in processes of the invention) optionally comprises filtering using a PTFE membrane with a pore size of from 0.1 to 0.3 μm, preferably around 0.2 μm (e.g. from 0.19 to 0.21 μm).

Optionally an additive such as tBP may be added at a volume of from 0.5 to 2 μL per mL of solution. Alternatively, as the process of the invention can obviate the need for extra additives, it is possible that the process does not involve a further step of adding tBP.

In one embodiment, the PIL is HTFSI or Himi-TFSI and the organic semiconductor is a triarylamine organic semiconductor. In particular, the PIL may be HTFSI or Himi-TFSI and the organic semiconductor may be Spiro-OMeTAD, or the PIL may be HTFSI and the organic semiconductor may be Spiro-OMeTAD.

The solvent or solvents may be removed as described above. For example, the solvent can removed by allowing the solvent to evaporate, by vacuum evaporation, or by heating. Often, the solvent or solvents are removed by heating. For example by heating the substrate at a temperature of from 50 to 200° C., or from 50 to 150° C.

The invention also provides a layer of a p-doped organic semiconductor obtainable by a process for producing a layer of a p-doped organic semiconductor according to the invention. The organic semiconductor may be doped using a oxidised salt of the organic semiconductor as described or a protic ionic liquid as described.

The invention also provides a layer of a p-doped organic semiconductor wherein the layer comprises an organic semiconductor and a protic ionic liquid. The organic may be any organic semiconductor as defined herein and/or the protic ionic liquid may be as defined anywhere herein. The organic semiconductor is typically a triarylamine semiconductor. In particular, the organic semiconductor may comprise a compound according to formula (V) above. The PIL may be selected from HTFSI or Himi-TFSI as defined above.

Any layer or layer produced by a process according to the invention may be of any thickness. Typically a layer will have a thickness of from 5 nm to 1 mm, from 10 nm to 100 μm or from 500 nm to 10 μm.

The invention also provides a process for producing a semiconductor device comprising
a step of producing a p-doped organic semiconductor by a process as described anywhere herein; or
a step of producing a layer of a p-doped organic semiconductor by a process as described anywhere herein.

The process for producing a semiconductor device may comprise a step of producing a p-doped organic semiconductor comprising treating the organic semiconductor with a composition comprising an oxidised salt of the organic semiconductor. It one embodiment, it may comprise treating the organic semiconductor with a composition comprising from 80 to 100 wt % of the oxidised salt of the organic semiconductor. Each and any of the features of this process may be as described anywhere herein.

The process for producing a semiconductor device may comprise a step of producing a layer of a p-doped organic semiconductor comprising:
(a) disposing a composition comprising a solvent, the organic semiconductor and a protic ionic liquid on a substrate; and
(b) removing the solvent.
Each and any of the features of this process may be as described anywhere herein.

In one embodiment, the process comprises:
(a) disposing on a first electrode material at least one layer of a semiconductor material to produce a resulting substrate comprising a first electrode material and at least one layer of a semiconductor material;

(b) sensitizing the resulting substrate to produce a sensitized substrate; and (c) producing a layer of a p-doped organic semiconductor by a process as described anywhere herein on the sensitized substrate, or producing a p-doped organic semiconductor by a process as described anywhere herein and forming a layer of the p-doped semiconductor thus produced on the sensitized substrate.

Often, (a) comprises disposing a compact layer of a semiconductor material and/or a mesoporous layer of a semiconductor material on a first electrode material. Preferably the semiconductor material is an electron transport material. A compact layer or a semiconductor material is a layer of a semiconductor material which is substantially non-porous, for example having less than 10% or less than 5% porosity. The compact layer may be a compact layer of titania. Preferably, the mesoporous layer of a semiconductor material comprises titania. Titania is titanium dioxide, $TiO_2$. Sometimes (a) comprises disposing a mesoporous layer of a dielectric material (for example alumina) on a first electrode material.

Usually, the first electrode material comprises a transparent conducting oxide. If so, the first electrode material may be selected from ITO, FTO or AZO.

Often, the semiconducting device will be a sensitized semiconducting device such as a sensitized solar cell. The device may be a dye- or perovskite-sensitised semiconductor device. The sensitizing material (e.g. the dye or the perovskite) interacts with light.

In one embodiment, (b) comprises treating the resulting substrate comprising a first electrode material and a layer of a semiconductor material with a dye or a semiconducting perovskite. Treating may be as defined above. In particular, treating the resulting substrate may comprise immersing the substrate in a solution comprising the dye or the perovskite. The dye or perovskite may be dissolved in any solvent, such as those described herein. The solvent may comprise tert-butanol and acetonitrile, optionally in a ratio of from 1:2 to 2:1. The concentration of the dye or the perovskite may be from 0.1 to 0.3 mM. The dye is often D102. The perovskite is often a mixed halide perovskite which may be as described below. In one embodiment, the dye comprises indoline dye D102 or the perovskite comprises a mixed halide perovskite.

Indoline dye D102 has the following structure:

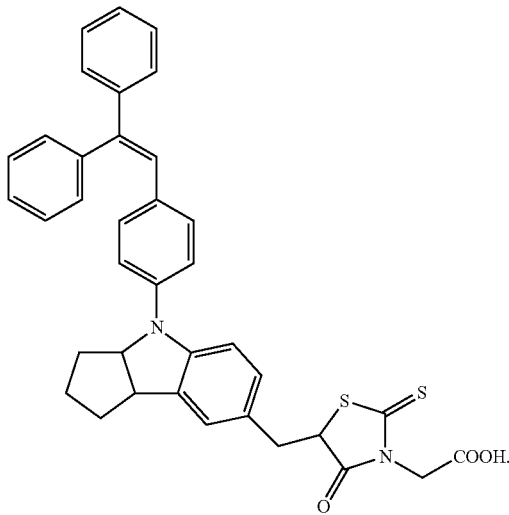 [SMILES: O=C(O)CN1C(=O)C(Cc2ccc3c(c2)C2CCCC2N3c2ccc(C=C(c3ccccc3)c3ccccc3)cc2)SC1=S]

Typically, a second electrode will be present in the semiconductor device which is produced. Accordingly, the process according to the invention for producing a semiconductor device may further comprise:

(d) disposing a second electrode material on the layer of a p-doped organic semiconductor.

The second electrode material may comprise any conductive material. The electrode material may be as described anywhere herein. In particular the second electrode material often comprises a metal. Preferably, the second electrode material comprises silver, gold or platinum.

The second electrode material may be disposed by thermal evaporation or sputtering, preferably by thermal evaporation. The thickness of the layer of the second electrode material is generally from 50 to 250 nm, from 100 to 200 nm, or from 120 to 180 nm.

Often the semiconductor device is an optoelectronic device. Typically, the semiconductor device is a photovoltaic device, a solar cell, a photo detector, a light-sensitive transistor, a phototransistor, a solid state triode, a battery, a battery electrode, a capacitor, a super-capacitor, a light-emitting device, or a light-emitting diode. The term "optoelectronic device", as used herein, refers to devices which source, control or detect light. Light is understood to include any electromagnetic radiation, but typically visible light. Examples of optoelectronic devices include photodiodes (including solar cells), phototransistors, photomultipliers, photoresistors, and light emitting diodes.

In one embodiment, the semiconductor device according to the invention is a dye-sensitized solar cell, a perovskite-sensitized solar cell, an extremely thin absorber cell (G. Hodes et al. "All-Solid-State, Semiconductor-Sensitized Nanoporous Solar Cells", Accounts of Chemical Research 45, 705-713 (2012)) or a quantum dot sensitized solar cell (Kamat, P. V. "Quantum Dot Solar Cells. Semiconductor Nanocrystals as Light Harvesters", J. Phys. Chem. C 112, 18737-18753 (2008)). Often, the semiconductor device is a dye-sensitized solar cell or a perovskite sensitized solar cell. A dye-sensitized or perovskite-sensitized solar cell according to the invention may be a solid state dye-sensitized or solid-state perovskite-sensitized solar cell. Dye-sensitized solar cells and perovskite-sensitized solar cells are examples of sensitized solar cells. In a sensitized solar cell there is a layer of a sensitizing material which interacts with photons such as a dye or a photoactive material (e.g. a semiconducting perovskite or semiconductor).

In a preferred embodiment, the device is a dye-sensitized solar cell, a perovskite-sensitized solar cell, a quantum dot sensitized solar cell, an extremely thin absorber cell or a meso-super structured solar cell. For example, the semiconductor device may be a dye-sensitized solar cell, a perovskite-sensitized solar cell or a meso-super structured solar cell.

The semiconductor device may be a photovoltaic device comprising a mesoporous alumina scaffold, an absorber layer and a hole transporting layer. For example, the semiconductor device may comprise a first electrode material, a mesoporous layer of alumina, an absorber layer (often comprising a perovskite as defined herein), a layer of a p-doped organic semiconductor material according to the invention, and a second electrode material. Any of the components of the device may be as defined anywhere herein.

The process may comprise (a) disposing on a first electrode material at least one mesoporous layer of alumina to produce a resulting substrate comprising a first electrode material and at least one mesoporous layer of alumina;

(b) sensitizing the resulting substrate to produce a sensitized substrate; and (c) producing a layer of a p-doped organic semiconductor by a process as described anywhere herein on the sensitized substrate, or producing a p-doped organic semiconductor by a process as described anywhere herein and forming a layer of the p-doped semiconductor thus produced on the sensitized substrate.

A sensitized solar cell typically comprises the following layers (and may comprise one or more further layers between each of the given layers):

I. a layer of a first electrode material;
II. optionally a compact layer of a semiconductor material;
III. optionally a layer of a semiconductor material (which is optionally mesoporous);
IV. a layer of a sensitizer (e.g. a dye or a semiconducting perovskite);
V. a hole transporter layer;
VI. optionally a further compact layer of a semiconductor material; and
VII. a layer of a second electrode material.

In a process for producing a semiconductor device according to the invention the hole transporter layer will be produced by a process for producing a layer of a p-doped organic semiconductor according to the invention.

The combined thickness of the layer of a semiconductor material (III) and the layer of a hole transporter material (V) is usually from 100 nm to 10 μm, from 500 nm to 5 μm. Preferably, the combined thickness is from 1 to 3 μm. The difference between the combined thickness of the layer of a semiconductor material and the layer of the hole transporter material and the thickness of the layer of a semiconductor material alone is typically from 10 to 500 nm, or preferably from 150 to 250 nm.

In a dye-sensitized solar cell, the dye may be selected from any dye suitable for use in a dye-sensitized solar cell. These are well known to the skilled person. An example of a suitable dye is the indolene dye D102, an organic "push-pull" dye such as those described in T. Horiuchi et al. ("High Efficiency of Dye-Sensitized Solar Cells Based on Metal-Free Indoline Dyes", J. Am. Chem. Soc. 126, 12218-12219 (2004)), a ruthenium complex dye, an organic dyes such as those described in W. Zeng, et al. ("Efficient Dye-Sensitized Solar Cells with an Organic Photosensitizer Featuring Orderly Conjugated Ethylenedioxythiophene and Dithienosilole Blocks", Chem. Mater. 22, 1915-1925 (2010)) or a rylene based dye such as those described in US 2012/0017995.

In a perovskite-sensitized solar cell, the perovskite will be a semiconducting perovskite. Usually, the perovskite is a light-absorbing material. The perovskite semiconductor employed may have a band gap of equal to or less than 3.0 eV. Often, the perovskite is a mixed halide perovskite compound of formula [A][B][X]$_3$ wherein: [A] is at least one organic cation; [B] is at least one metal cation; and [X] is at least one anion. The term "organic cation" refers to a cation comprising carbon. The cation may comprise further elements, for example, the cation may comprise hydrogen, nitrogen or oxygen. Typically, the cation will be a quaternary ammonium ion.

The perovskite may alternatively be a compound of formula AB[X]$_3$ wherein A is an organic cation, B is a metal cation and [X] is two or more different anions. Usually, [X] is two or more different halide anions. The perovskite may also be a compound of formula $ABX_{3-y}X'_y$ wherein A is an organic cation, B is a metal cation, X is a first halide anion, X' is a second halide anion which is different from the first halide anion, and y is from 0.05 to 2.95. For example, the perovskite may be a perovskite of formula $CH_3NH_3PbI_{3-y}Cl_y$.

In the cases of [A][B][X]$_3$, AB[X]$_3$, and $ABX_{3-y}X'_y$, the first cation (A) is an organic cation. The second cation (B) may be selected $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$ and $Eu^{2+}$. Usually, the second cation is selected from $Sn^{2+}$ and $Pb^{2+}$.

Usually, the organic cation has the formula $(R_1R_2R_3R_4N)^+$, wherein:

$R_1$ is hydrogen, unsubstituted or substituted $C_1$-$C_{20}$ alkyl, or unsubstituted or substituted aryl;

$R_2$ is hydrogen, unsubstituted or substituted $C_1$-$C_{20}$ alkyl, or unsubstituted or substituted aryl;

$R_3$ is hydrogen, unsubstituted or substituted $C_1$-$C_{20}$ alkyl, or unsubstituted or substituted aryl; and $R_4$ is hydrogen, unsubstituted or substituted $C_1$-$C_{20}$ alkyl, or unsubstituted or substituted aryl.

Mainly, in the organic cation, $R_1$ is hydrogen, methyl or ethyl, $R_2$ is hydrogen, methyl or ethyl, $R_3$ is hydrogen, methyl or ethyl, and $R_4$ is hydrogen, methyl or ethyl. For instance $R_1$ may be hydrogen or methyl, $R_2$ may be hydrogen or methyl, $R_3$ may be hydrogen or methyl, and $R_4$ may be hydrogen or methyl.

Alternatively, the organic cation may have the formula $(R_5NH_3)^+$, wherein: $R_5$ is hydrogen, or unsubstituted or substituted $C_1$-$C_{20}$ alkyl. For instance, $R_5$ may be methyl or ethyl. Typically, $R_5$ is methyl.

In some embodiments, the organic cation has the formula $(R_5R_6N=CH-NR_7R_8)^+$, wherein: $R_5$ is hydrogen, unsubstituted or substituted $C_1$-$C_{20}$ alkyl, or unsubstituted or substituted aryl; $R_6$ is hydrogen, unsubstituted or substituted $C_1$-$C_{20}$ alkyl, or unsubstituted or substituted aryl; $R_7$ is hydrogen, unsubstituted or substituted $C_1$-$C_{20}$ alkyl, or unsubstituted or substituted aryl; and $R_8$ is hydrogen, unsubstituted or substituted $C_1$-$C_{20}$ alkyl, or unsubstituted or substituted aryl.

Typically, $R_5$ in the cation $(R_5R_6N=CH-NR_7R_8)^+$ is hydrogen, methyl or ethyl, $R_6$ is hydrogen, methyl or ethyl, $R_7$ is hydrogen, methyl or ethyl, and $R_8$ is hydrogen, methyl or ethyl. For instance $R_5$ may be hydrogen or methyl, $R_6$ may be hydrogen or methyl, $R_7$ may be hydrogen or methyl, and $R_8$ may be hydrogen or methyl.

The organic cation may, for example, have the formula $(H_2N=CH-NH_2)^+$.

In the case of the organic cation, a $C_1$-$C_{20}$ alkyl group is an unsubstituted or substituted, straight or branched chain saturated hydrocarbon radical. Typically it is $C_1$-$C_{10}$ alkyl, for example methyl, ethyl, propyl, butyl, pentyl, hexyl, heptyl, octyl, nonyl or decyl, or $C_1$-$C_6$ alkyl, for example methyl, ethyl, propyl, butyl, pentyl or hexyl, or $C_1$-$C_4$ alkyl, for example methyl, ethyl, i-propyl, n-propyl, t-butyl, s-butyl or n-butyl.

When an alkyl group in the organic cation is substituted it typically bears one or more substituents selected from substituted or unsubstituted $C_1$-$C_{20}$ alkyl, substituted or unsubstituted aryl (as defined herein), cyano, amino, $C_1$-$C_{10}$ alkylamino, di($C_1$-$C_{10}$)alkylamino, arylamino, diarylamino, arylalkylamino, amido, acylamido, hydroxy, oxo, halo, carboxy, ester, acyl, acyloxy, $C_1$-$C_{20}$ alkoxy, aryloxy, haloalkyl, sulfonic acid, sulfhydryl (i.e. thiol, —SH), $C_1$-$C_{10}$ alkylthio, arylthio, sulfonyl, phosphoric acid, phosphate ester, phosphonic acid and phosphonate ester. Examples of substituted alkyl groups include haloalkyl, hydroxyalkyl, aminoalkyl, alkoxyalkyl and alkaryl groups. The term alkaryl, as used herein, pertains to a $C_1$-$C_{20}$ alkyl group in which at least one hydrogen atom has been replaced with an aryl group. Examples of such groups include, but are not limited to, benzyl (phenylmethyl, PhCH$_2$—), benzhydryl (Ph$_2$CH—), trityl (triphenylmethyl, Ph$_3$C—), phenethyl (phenylethyl, Ph-CH$_2$CH$_2$—), styryl (Ph-CH=CH—), cinnamyl (Ph-CH=CH—CH$_2$—).

Typically a substituted alkyl group carries 1, 2 or 3 substituents, for instance 1 or 2.

In the case of the organic cation, an aryl group is a substituted or unsubstituted, monocyclic or bicyclic aromatic group which typically contains from 6 to 14 carbon atoms, preferably from 6 to 10 carbon atoms in the ring portion. Examples include phenyl, naphthyl, indenyl and indanyl groups. An aryl group is unsubstituted or substituted. When an aryl group as defined above is substituted it typically bears one or more substituents selected from $C_1$-$C_6$ alkyl which is unsubstituted (to form an aralkyl group), aryl which is unsubstituted, cyano, amino, $C_1$-$C_{10}$ alkylamino, di($C_1$-$C_{10}$)alkylamino, arylamino, diarylamino, arylalkylamino, amido, acylamido, hydroxy, halo, carboxy, ester, acyl, acyloxy, $C_1$-$C_{20}$ alkoxy, aryloxy, haloalkyl, thiol, $C_{1-10}$ alkylthio, arylthio, sulfonic acid, phosphoric acid, phosphate ester, phosphonic acid and phosphonate ester and sulfonyl. Typically it carries 0, 1, 2 or 3 substituents. A substituted aryl group may be substituted in two positions with a single $C_1$-$C_6$ alkylene group, or with a bidentate group represented by the formula —X—($C_1$-$C_6$)alkylene, or —X—($C_1$-$C_6$)alkylene-X—, wherein X is selected from 0, S and NR, and wherein R is H, aryl or $C_1$-$C_6$ alkyl. Thus a substituted aryl group may be an aryl group fused with a cycloalkyl group or with a heterocyclyl group. The ring atoms of an aryl group may include one or more heteroatoms (as in a heteroaryl group). Such an aryl group (a heteroaryl group) is a substituted or unsubstituted mono- or bicyclic heteroaromatic group which typically contains from 6 to 10 atoms in the ring portion including one or more heteroatoms. It is generally a 5- or 6-membered ring, containing at least one heteroatom selected from O, S, N, P, Se and Si. It may contain, for example, 1, 2 or 3 heteroatoms. Examples of heteroaryl groups include pyridyl, pyrazinyl, pyrimidinyl, pyridazinyl, furanyl, thienyl, pyrazolidinyl, pyrrolyl, oxazolyl, oxadiazolyl, isoxazolyl, thiadiazolyl, thiazolyl, isothiazolyl, imidazolyl, pyrazolyl, quinolyl and isoquinolyl. A heteroaryl group may be unsubstituted or substituted, for instance, as specified above for aryl. Typically it carries 0, 1, 2 or 3 substituents. This definition may also apply for the term "aryl group" as used anywhere else herein.

In one embodiment, the perovskite is a perovskite compound selected from CH$_3$NH$_3$PbI$_3$, CH$_3$NH$_3$PbBr$_3$, CH$_3$NH$_3$PbCl$_3$, CH$_3$NH$_3$PbF$_3$, CH$_3$NH$_3$PbBrI$_2$, CH$_3$NH$_3$PbBrCl$_2$, CH$_3$NH$_3$PbIBr$_2$, CH$_3$NH$_3$PbICl$_2$, CH$_3$NH$_3$PbClBr$_2$, CH$_3$NH$_3$PbI$_2$Cl, CH$_3$N$^-$H$_3$ SnBrI$_2$, CH$_3$N$^-$H$_3$ SnBrCl$_2$, CH$_3$N$^-$H$_3$ SnF$_2$Br, CH$_3$N$^-$H$_3$ SnIBr$_2$, CH$_3$N$^-$H$_3$ SnICl$_2$, CH$_3$NH$_3$SnF$_2$I, CH$_3$NH$_3$SnClBr$_2$, CH$_3$NH$_3$SnI$_2$Cl and CH$_3$NH$_3$SnF$_2$Cl. The perovskite may be selected from CH$_3$NH$_3$PbBrI$_2$, CH$_3$NH$_3$PbBrCl$_2$, CH$_3$NH$_3$PbIBr$_2$, CH$_3$NH$_3$PbICl$_2$, CH$_3$NH$_3$PbClBr$_2$, CH$_3$NH$_3$PbI$_2$Cl, CH$_3$NH$_3$SnBrI$_2$, CH$_3$NH$_3$SnBrCl$_2$, CH$_3$NH$_3$SnF$_2$Br, CH$_3$NH$_3$SnIBr$_2$, CH$_3$NH$_3$SnICl$_2$, CH$_3$NH$_3$SnF$_2$I, CH$_3$NH$_3$SnClBr$_2$, CH$_3$NH$_3$SnI$_2$Cl and CH$_3$NH$_3$ SnF$_2$Cl.

Typically, the perovskite is selected from CH$_3$NH$_3$PbBrI$_2$, CH$_3$NH$_3$PbBrCl$_2$, CH$_3$NH$_3$PbIBr$_2$, CH$_3$NH$_3$PbICl$_2$, CH$_3$NH$_3$PbClBr$_2$, CH$_3$NH$_3$PbI$_2$Cl, CH$_3$NH$_3$SnF$_2$Br, CH$_3$NH$_3$SnICl$_2$, CH$_3$NH$_3$SnF$_2$I, CH$_3$NH$_3$SnI$_2$Cl and CH$_3$NH$_3$SnF$_2$Cl.

In some embodiments, the perovskite is a perovskite compound of formula (IIa):

$$ABX_{3z}X'_{3(1-z)} \tag{IIa}$$

wherein:

A is an organic cation of the formula $(R_5R_6N=CH—NR_7R_8)^+$, wherein: $R_5$ is hydrogen, unsubstituted or substituted $C_1$-$C_{20}$ alkyl, or unsubstituted or substituted aryl; $R_6$ is hydrogen, unsubstituted or substituted $C_1$-$C_{20}$ alkyl, or unsubstituted or substituted aryl; $R_7$ is hydrogen, unsubstituted or substituted $C_1$-$C_{20}$ alkyl, or unsubstituted or substituted aryl; and $R_8$ is hydrogen, unsubstituted or substituted $C_1$-$C_{20}$ alkyl, or unsubstituted or substituted aryl;

B is a metal cation;

X is a first halide anion;

X' is a second halide anion which is different from the first halide anion; and z is greater than 0 and less than 1.

Usually, z is from 0.05 to 0.95.

Usually, z is from 0.1 to 0.9. z may, for instance, be 0.1, 0.2, 0.3, 0.4, 0.5, 0.6, 0.7, 0.8 or 0.9, or z may be a range of from any one of these values to any other of these values (for instance, from 0.2 to 0.7, or from 0.1 to 0.8).

In some embodiments, the perovskite may be a perovskite of formula $(H_2N=CH—NH_2)PbI_{3z}Br_{3(1-z)}$, wherein z is greater than 0 or less than 1. z may be as further defined in the preceding paragraph.

The term "electrode material", as used herein, refers to an electrically conducting material which may be in contact with another material such as a semiconductor material or an electrolyte. Electrode materials may comprise a range of materials. In particular the substrate may be an electrode material comprising a metal or mixture of metals (e.g. Al, Steel, Mo, Cu, Ag, Au or Pt, or a metal selected from any of those described above), graphite or a transparent conducting oxide (e.g. ITO (indium tin oxide), FTO (fluorine doped tin oxide) or AZO (aluminium doped zinc oxide)).

Typically, in a process for producing a semiconductor device according to the invention the first electrode comprises a transparent conducting oxide, preferably ITO, FTO or AZO. Typically, in a process for producing a semiconductor device according to the invention the second electrode comprises a metal, preferably Ag, Au or Pt.

Generally, a process for producing a semiconductor device (for instance a sensitized solar cell) may include some or all of the following steps in any combination and in any order:

A. providing a transparent conducting oxide-coated glass sheet;
B. etching the sheets with zinc powder and HCl (2M) to obtain an electrode pattern;
C. washing the sheets (optionally with soap, deionized water, acetone, and/or methanol);
D. treating the sheets with an oxygen plasma (optionally for from 5 to 10 minutes);
E. optionally forming a compact layer of a semiconductor material, particularly TiO$_2$ (optionally wherein the layer is from 20 to 40 nm thick);
F. optionally heating the compact layer of a semiconductor material at from 200 to 600° C.;

G. forming a layer of a semiconductor material which is preferably an electron transport material and optionally mesoporous, and typically which may comprise $TiO_2$;
H. optionally heating the layer of a semiconductor material at from 100 to 600° C.;
I. sensitizing the layer of a semiconductor material by immersing it in a solution of a dye (optionally wherein the dye is at a concentration of from 0.1 to 0.3 mM in a 1:1 volume ratio of tertbutanol and acetonitrile; optionally wherein the immersion is carried out for from 5 minutes to 5 hours); or sensitizing the layer of a semiconductor material by disposing a layer of a photoactive material (optionally wherein the photoactive material is a photoactive perovskite as defined herein);
J. forming a layer of a p-doped organic semiconductor by a process according to the invention;
K. exposing the device to air (optionally for a minimum period of 4 hours);
L. drying the device by heating; and
M. depositing an electrode material by vacuum deposition (optionally wherein the electrode material is silver and the thickness of the electrode material is from 10 to 500 nm).

The semiconductor device may be a meso-super structured solar cell (MSSC). An MSSC may have a bilayer structure. MSSCs are described in Efficient hybrid solar cells based on meso-superstructured organometal halide perovskites, Snaith M. M. Lee et al., Vol. 338 no. 6107 pp. 643-647, Science (2012) and in J. M. Ball et al. "Low-temperature processed meso-superstructured to thin-film perovskite solar cells" DOI: 10.1039/c3ee40810h. An MSSC typically comprises:
I. a first electrode;
II. optionally a compact layer of a semiconductor material;
III. an mesoporous alumina scaffold, optionally from 50 to 500 nm thick;
IV. an absorber layer, comprising a dye, a perovskite or a semiconductor as described above;
V. a layer of a hole transporting material produced by a process according to the invention; and
VI. a second electrode.

Such devices may be produced by a process according to the invention for producing a semiconductor device.

Generally, a process for producing a semiconductor device (for instance a meso-super structured solar cell) may include some or all of the following steps in any combination and in any order:
A. providing a transparent conducting oxide-coated glass sheet;
B. etching the sheets with zinc powder and HCl (2M) to obtain an electrode pattern;
C. washing the sheets (optionally with soap, deionized water, acetone, and/or methanol);
D. treating the sheets with an oxygen plasma (optionally for from 5 to 10 minutes);
E. optionally forming a compact layer of a semiconductor material, particularly $TiO_2$ (optionally wherein the compact layer is formed by aerosol spray pyrolysis using oxygen as a carrier gas);
F. optionally sintering the compact layer of a semiconductor material at from 300 to 600° C.;
G. forming a layer from 100 to 300 nm thick of mesoporous $Al_2O_3$ optionally by spin-coating a dispersion of $Al_2O_3$ particles (optionally from 10 to 100 nm) in a solvent (optionally isopropanol);
H. optionally heating the layer of alumina at from 100 to 600° C., preferably from 100 to 200° C.;
I. sensitizing the layer of alumina by immersing it in a solution of a dye (optionally wherein the dye is at a concentration of from 0.1 to 0.3 mM in a 1:1 volume ratio of tertbutanol and acetonitrile; optionally wherein the immersion is carried out for from 5 minutes to 5 hours); or sensitizing the layer of a semiconductor material by disposing a layer of a photoactive material (optionally wherein the photoactive material is a photoactive perovskite as defined herein);
J. forming a layer of a p-doped organic semiconductor by a process according to the invention;
K. exposing the device to air (optionally for a minimum period of 4 hours);
L. drying the device by heating; and
M. depositing an electrode material by vacuum deposition (optionally wherein the electrode material is silver and the thickness of the electrode material is from 10 to 500 nm).

The invention also provides semiconductor devices obtainable by a process according to the invention.

The invention also provides a semiconductor device which comprises a layer of a p-doped organic semiconductor which comprises an organic semiconductor and a protic ionic liquid. The organic semiconductor, the protic ionic liquid and the semiconductor device may be as defined anywhere herein.

In some cases, in a process, layer or device according to the invention the amount of LiTFSI present is less than of equal to 5 mol % relative to the amount of the organic semiconductor, and/or the amount of tBP present is less than of equal to 20 mol % relative to the amount of the organic semiconductor.

In some cases, in a process, layer or device according to the invention the amount of LiTFSI present is less than of equal to 1 mol % relative to the amount of the organic semiconductor, and/or the amount of tBP present is less than of equal to 1 mol % relative to the amount of the organic semiconductor.

The inventors have developed a method for accurately p-doping organic semiconductors by isolating an oxidised salt of the organic semiconductor which may act as a dopant. High purity p-dopants of this type are unknown. Accordingly, the invention also provides a composition which comprises from 50 to 100 wt % of an oxidised salt of an organic semiconductor according to formula (VIII)

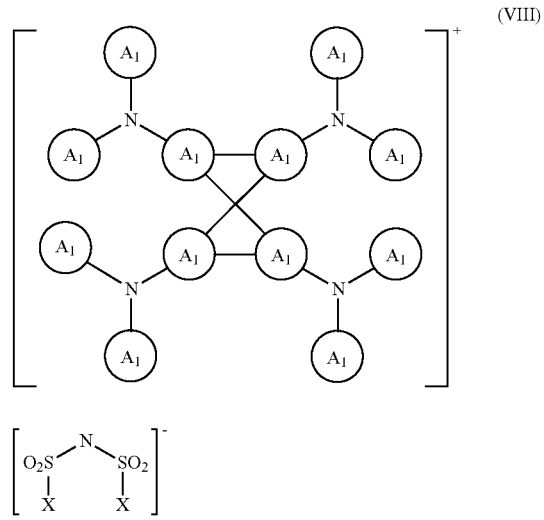

wherein each $A_1$ is the same or different and is an unsubstituted or substituted aryl ring or an unsubstituted or substituted heteroaryl ring; and X is a $C_{1-8}$-haloalkyl group.

$A_1$ and X may be as defined anywhere above.

Preferably each $A_1$ is a substituted or unsubstituted benzene ring. Any substituent is preferably OMe.

In one embodiment the composition comprises from 60 to 100 wt %, from 70 to 100 wt %, from 80 to 100 wt %, from 90 to 100 wt % of the oxidised salt of the organic semiconductor. Preferably the composition comprises from 95 to 100 wt % or more preferably from 98 to 100 wt of the oxidised salt of the organic semiconductor.

Often, the composition will comprise, as the oxidised salt of the organic semiconductor, [2,2-7,7-tetrakis(N,N-di-pmethoxyphenylamine)-9,9-spirobifluorene]$^+$[TFSI]$^-$ or [2,2-7,7-tetrakis(N,N-di-pmethoxyphenylamine)-9,9-spirobifluorene]$^+$[BETI]$^-$.

EXAMPLES

Example 1—Preparation of TFSI Salt of Spino-OMeTAD

Pure spiro-OMeTAD powder is dissolved at 1 g ml$^{-1}$ in chlorobenzene. 100 mol % of [N(p-C6H4Br)3][SbCl6] (dissolved at 3.5 mg ml$^{-1}$ in acetonitrile) is added dropwise to the stirring solution of spiro-OMeTAD in chlorobenzene. The resulting darkly coloured solution is left at 3° C. for 2 days, after which the precipitate is filtered and rinsed in methanol. The precipitate is stirred for 15 minutes in Toluene (10 mg ml$^{-1}$) and filtered again. The filtrate (the oxidation product) is retained and is dissolved in methanol and placed in a sonicator bath for 10 minutes. One of many TFSI salts, such as LiTFSI is added at a 20:1 molar ratio of TFSI to spirOMeTAD and the solution placed at 3° C. overnight. The precipitate ([Spiro]$^+$[TFSI]$^-$) is filtered and washed thoroughly in cold methanol. The powder is then dried.

Example 2—Effect of Oxidising Agent on Spiro-OMeTAD

The absorption spectra in FIG. 1a demonstrate the effect of addition of the oxidising agent [N(p-C$_6$H$_4$Br)$_3$][SbCl$_6$] to a solution of Spiro-OMeTAD in chlorobenzene. The disappearance of the ground-state absorption feature around 390 nm and the growth of features around 500 and 700 nm are all associated with the first and second oxidation states of the Spiro-OMeTAD, where we control the oxidation state by the molar ratio of oxidant to Spiro-OMeTAD in the solution. FIG. 1b shows the UV vis spectrum of the final [Spiro-OMeTAD]$^+$[TFSI]$^-$ powder in chlorobenzene, proving that we have isolated a stable and fully oxidised version of Spiro-OMeTAD with a TFSI counter anion. When employed as a dopant in the Spiro-OMeTAD HTM matrix, the doping will be irreversible, and completely independent of any atmospheric effects.

Example 3—p-Doping Using [Spiro-OMeTAD]$^+$ [TFSI]$^-$ Powder

Figure 2:
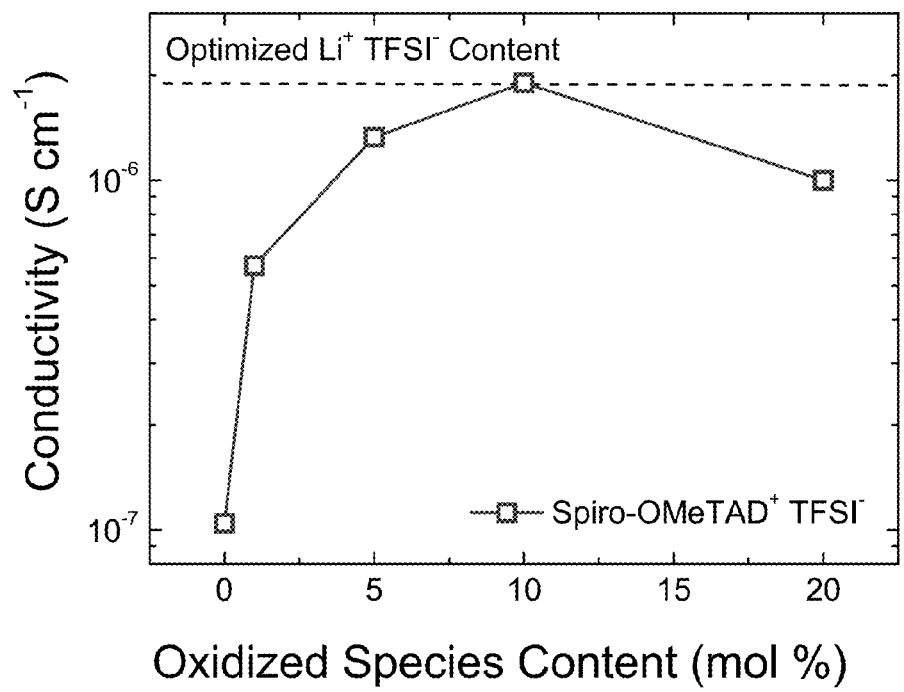
FIG. 2 shows the conductivity of Spiro-OMeTAD doped with varying mol % of Spiro-OMeTAD$^+$ TFSI$^-$. The dashed line indicates the conductivity of the commonly employed optimal HTM composition, with 20 mol % Li-TFSI as p-dopant.

Spiro-OMeTAD is p-doped by mixing a powder of pure Spiro-OMeTAD with the powdered oxidised salt of Spiro-OMeTAD produced by the method of Example 1. Mixture of the resultant powder with pure spiro-OMeTAD at varying concentrations results in changes in the conductivity of the material in the device configuration (FIG. 2). As expected, the conductivity of the Spiro-OMeTAD filled into a mesoporous TiO$_2$ structure increases and then decreases with increasing "doping" concentrations. It is evident that, while the baseline conductivities are low in this set of samples, an equal, if not higher, conductivity is reached with the [Spiro-OMeTAD]$^+$[TFSI]$^-$ salt as compared to the sample incorporating the commonly employed lithium TFSI dopant and tert-butyl pyridine (tBP) additive. Hence, it has been shown that the high conductivity required for effective solar cell performance can be achieved without the addition of any extraneous additives.

Figure 3:
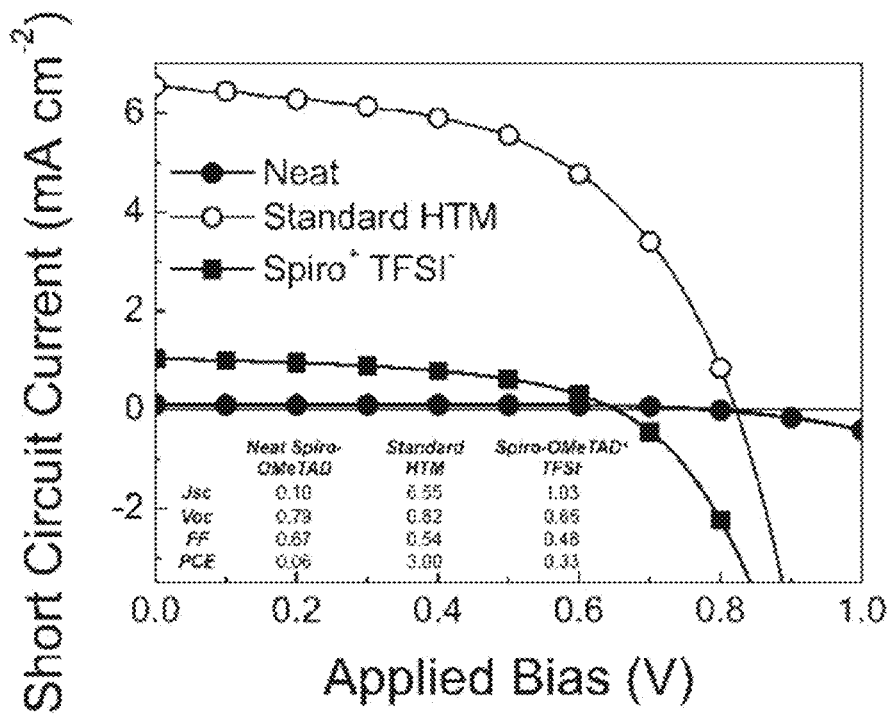
FIG. 3 shows current density-voltage (JV) curves for neat Spiro-OMeTAD (filled black circles), the standard HTM composition (open black circles), and 20 mol % Spiro$^+$ TFSI$^-$ doped HTM. Merit parameters are presented, where Jsc is the short circuit current (in mA cm$^{-2}$), Voc is the open circuit voltage (in V), FF is the fill factor, and PCE is the power conversion efficiency (in %).

Example 4—Solid State Dye Sensitized Solar Cell (Ss-DSSC) Device Characteristics This method is then applied to photovoltaic devices. However, the traditional configuration of ss-DSSCs requires the presence of lithium ions as well as tBP not only to p-dope the HTM, but also to facilitate charge generation, separation, and collection. This is due to the additives' effects at the TiO$_2$/dye/HTM interfaces. As a result, use of the oxidised salt of the HTM in this configuration will not obviate the requirement for the other additives, as exemplified in FIG. 3. Here, it is evident that addition of the oxidised salt as dopant does enhance the device performance compared to a device incorporating only pure Spiro-OMeTAD as HTM by reducing the series resistance of the device.

Example 5—Meso-Super Structured Solar Cell (MSSC) Device Characteristics

Recently however, a photovoltaic device in a "bilayer" structure comprised of a semiconducting absorber and an HTM layer, termed Meso-Super Structured Solar Cells (MSSCs) has been developed (M. M. Lee, J. Teuscher, T. Miyasaka, T. N. Murakami and H. J. Snaith, *Science*, 2012). The absorber layer is formed over a 100 nm thick mesoporous alumina scaffold, and the hole transporting layer is simply deposited on top of this via spin coating. As the interfacial area between HTM and absorber/electron transporter is considerably less in this configuration than in the traditional sDSSC, the additives are expected to be of far lesser importance at the interface. As a result, the only requirement of the HTM layer is that it have the appropriate HOMO level for hole transfer from the absorber, have a non-competing absorption, and have a high hole conductivity.

Figure 4:
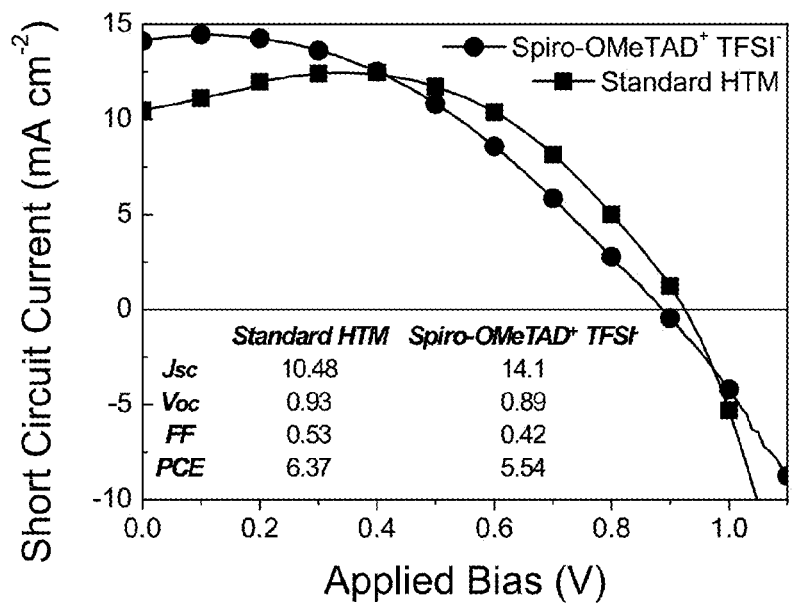
FIG. 4 shows JV curves of representative solar cells employing the mixed halide absorber on a 100 nm thin mesoporous alumina scaffold. Black squares represent the standard HTM composition using 20 mol % Li-TFSI and 0.08 M tBP (or 100 mol %), while red circles represent devices with the only HTM additive being 20 mol % of Spiro$^+$ TFSI$^-$. Merit parameters are presented, where Jsc is the short circuit current (in mA cm$^{-2}$), Voc is the open circuit voltage (in V), FF is the fill factor, and PCE is the power conversion efficiency (in %).
Figure 5:
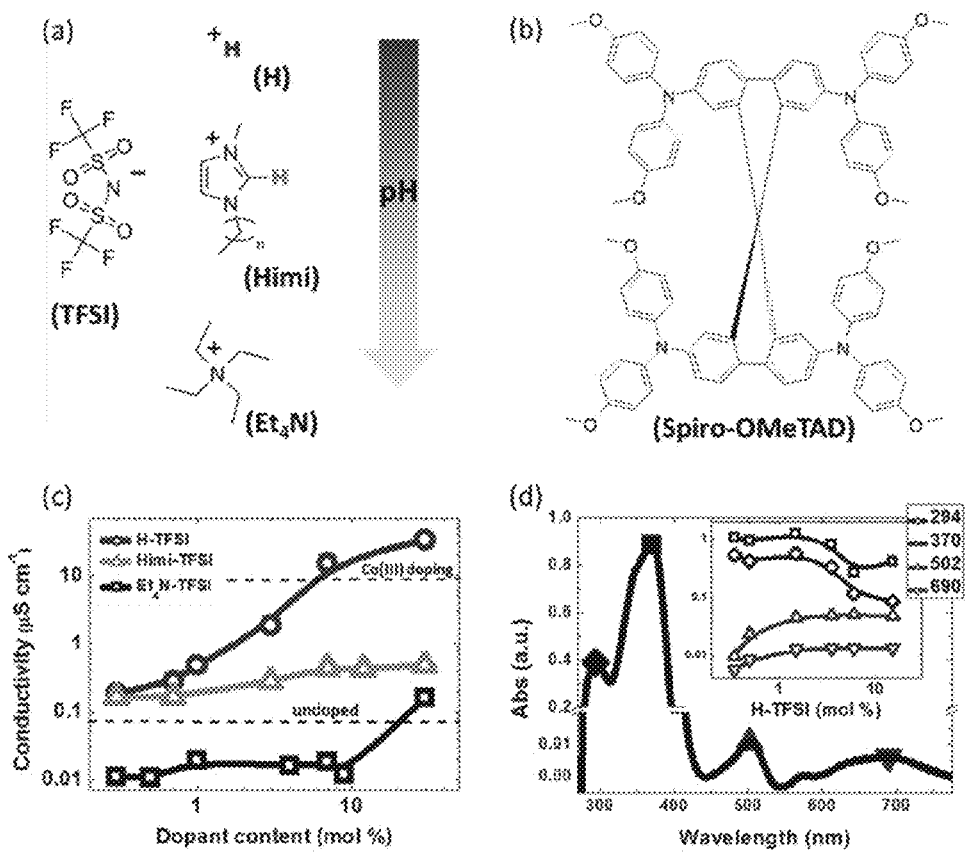
FIG. 5 shows (a) Chemical structure of ionic liquids relating to the invention, bis(trifluoromethanesulfonyl)imide (H-TFSI) and 1-alkyl-3-methylimidazolium bis(trifluoromethylsulphonyl)amide (Himi-TFSI) which are protic ionic liquids (PILs), with H-TFSI more acidic then Himi-TFSI, and bis(trifluoromethylsulfonyl)amide (Et$_4$N-TFSI) which is an aprotic ionic liquid, the pH scale may be considered as an indication of how strongly a proton will be transferred from the PIL to a base, though it must be noted that the pH is usually considered for aqueous solutions and may not be appropriate for the non-aqueous PILs; (b) chemical structure of the small molecule organic semiconductor 2,2',7,7'-tetrakis(N,N-di-p-methoxyphenyl-amine)9,9'-Spirobifluorene (Spiro-OMeTAD); (c) Conductivity for Spiro-OMeTAD against the content of different ionic liquids; (d) UV-Vis absorption spectra of Spiro-OMeTAD doped with H-TFSI and the absorption for the specific wavelengths as function of the H-TFSI concentration (inset).

FIG. 4 shows representative current density-voltage (JV) curves as well as the associated merit parameters of such solar cells prepared via the normal (LiTFSI and tbp) and "HTM salt only" (where 20 mol % spiro$^+$ TFSI$^-$ is used) routes. It is evident that the devices incorporating the spiro-OMeTAD$^+$ TFSI$^-$ perform similarly to those using the standard HTM composition. We expect that with further optimization, the results will continue to improve, and, as stated above, that the absence of extraneous additives such as Li-TFSI and tBP will aid in long-term stability.

Example 6—p-Doping Using Protic Ionic Liquids (PILs)

Figure 9:
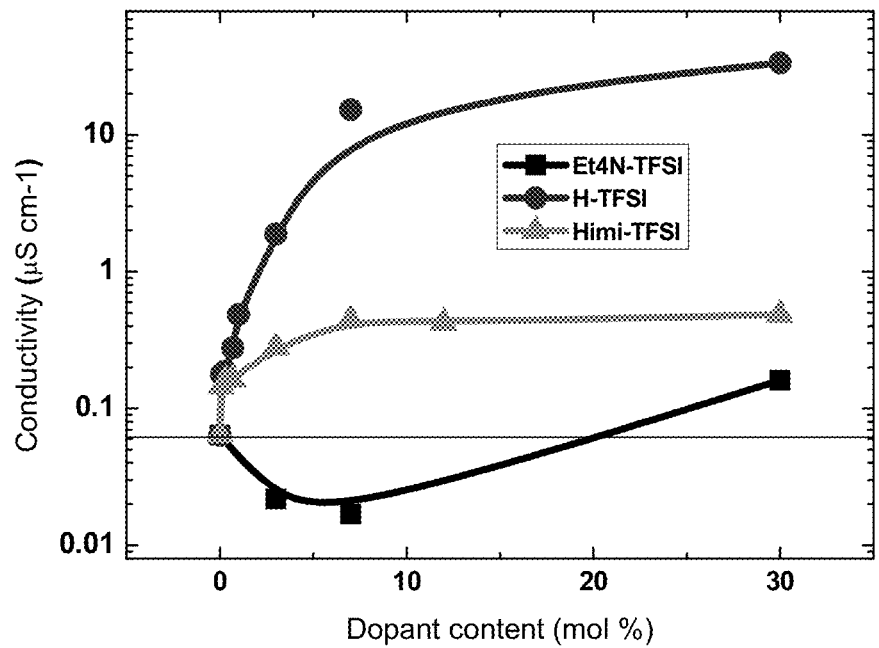
FIG. 9 shows conductivity of doped Spiro-OMeTAD.
Figure 10:
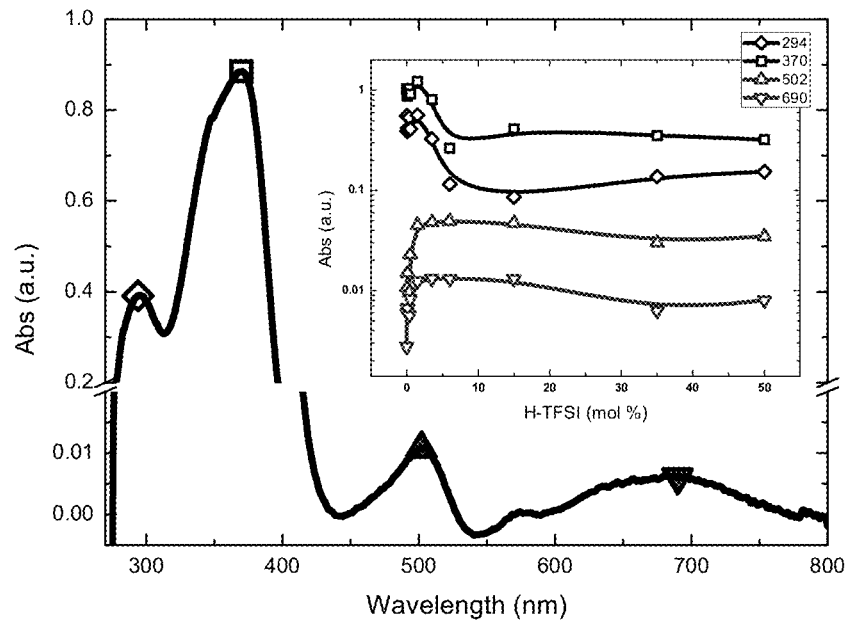
FIG. 10 shows UV-Vis absorption of Spiro-OMeTAD doped with H-TFSI.

To demonstrate the p-doping effect due to PILs, experiments were performed on the well-known small molecule organic semiconductor, Spiro-OMeTAD, which is the state-of-the-art hole transporting material in ss-DSSCs. FIG. 9 shows the conductivity of Spiro-OMeTAD as function of the ionic liquids content, as measured in inert atmosphere and dark condition. A fast growth is immediately visible for both H-TFSI and Himi-TFSI at low concentration, which reaches a plateau around 10 mol % with Spiro-OMeTAD. In the same figure, also reported is the curve related to an aprotic ionic liquid, tetraethyl bis(trifluoromethylsulfonyl)amide ($Et_4N$-TFSI). Otherwise observed for PILs, $Et_4N$-TFSI shows that the addition of inert ionic liquids in the organic matrix has a detrimental effect a low concentration. It should nevertheless be noted that there is a slight increase in conductivity at high concentration of $Et_4N$-TFSI. This effect, which occurs regardless the presence of "free" proton, could be ascribed to the electrostatic charge of the ionic species added into the organic matrix. To prove the diverse nature of these phenomena, in FIG. 10 we reported the UV-Vis absorption spectra for the Spiro-OMeTAD films doped with H-TFSI. There is a clear growth of an absorption bands around 510 nm and 690 nm and a simultaneous decrease of the bands around 294 nm and 370 nm, as the concentration of H-TFSI is increased. Notably, as already observed for the conductivity, the absorption changes very rapidly at low H-TFSI content, then it reaches a plateau around 10 mol % (see inset). For the Himi-TFSI, we could not get a clear trend, but observed absorption at 510 nm in addition to the bands at 510 and 690 nm. Otherwise detected for PILs, the same spectra for $Et_4N$-TFSI shown only the bands at 294 nm and 370 nm, without any indication of absorption at both 510 and 690 nm. These absorption modes in the Spiro-OMeTAD have been already assigned via both experimental and computational studies to the neutral (294 and 370 nm) and first oxidised state (510 and 690 nm). Thus, this provides evidence that ionic liquids can oxidise (p-dope) Spiro-OMeTAD depending on their ability to release proton.

Example 7—p-Doping Procedure

All the doping procedure was carried out in inert atmosphere (oxygen and water free). Chlorobenzyl and acetonitrile were purchased from Sigma-Aldrich in reagent grade and anhydrous. Before introducing the solvents in oxygen and water free glovebox environment, they were degassed bubbling the liquid with nitrogen for several hours. Spiro-OMeTAD was purchased from Lumetec and the ionic liquids (H-TFSI, Himi-TFSI and $Et_4N$-TFSI) and Li-TFSI from Aldrich. All the chemicals were got in their highest available purity and they were used without further purification. They have been delivered sealed in inert atmosphere and they were opened and stored directly in glovebox. In particular, H-TFSI is highly sensitive to the air moisture and just few minutes of air exposure could significantly hydrate it. Then, 90 mM solution of Spiro-OMeTAD in chlorobenzyl was prepared stirring the mixture overnight at 70° C. Solutions of ionic liquids (H-TFSI, Himi-TFSI and $Et_4N$-TFSI) and Li-TFSI in acetonitrile have been prepared varying the concentration in order to add always the same amount (1/10 of the final volume) of dopant solution (in acetonitrile) to the Spiro-OMeTAD solution (in chlorobenzyl). The solution Spiro-OMeTAD plus dopant (chlorobenzyl/acetonitrile 1/10 v/v) was left stirring at 120° C. overnight in glovebox. After cooling down to room temperature, the solution was filtered using PTFE membrane, pore size 0.2 μm (Aldrich). Then, where appropriate, tBP was added (10 μL each mL of solution) right before spin-coating the solution on the substrate.

Example 8—Conductivity Measurements

Spiro-OMeTAD solutions with differs amount of dopant were spin-coated at 2000 rpm into mesoporous $SiO_2$ layer prepared on glass slides (particle size 40 nm, mesoporous layer thickness 300 nm) and dried at 140° C. for 30 min in inert atmosphere. Silver contacts (150 nm thick) were applied via thermal evaporation through a shadow mask in $2\times10^{-6}$ Torr vacuum. The electrode pattern was designed for four point probe measurements with a force channel length (direction of current flow) of 1 mm and a width of 1 cm, and a sense channel length of 300 μm and width of 1 mm. The J-V characteristics of these samples were collected at room temperature with a Keithley 2420 Source Meter unit to extract both the bulk and the contact resistance. The contact resistance was found negligible compare to the bulk one at any doping level. All the samples were prepared and measured in inert atmosphere and filtered UV light. No relevant visible light dependence of conductivity was noted.

Example 9—UV-Vis Spectra

The sample preparation was identical to that described for the preparation of devices for conductivity measurements, with the exception that no silver electrodes were deposited on the top of the sample. All the samples were prepared in inert atmosphere and in filtered UV light condition. Absorbance measurements of the films were taken in air (about 1 min air exposure) using a commercial spectrophotometer (Varian Cary 300 UV-Vis, USA). Baseline measurements were performed on mesoporous $SiO_2$ substrate without Spiro-OMeTAD.

Example 10—Solid-State Dye-Sensitized Solar Cells (Ss-DSSCs) Fabrication

All solvents used for device fabrication were reagent grade and anhydrous. FTO substrates (7 ffsq, Pilkington US) were etched with zinc powder and HCl (2 M aqueous solution) to give the desired electrode patterning. The substrates were cleaned with Hellmanex (2% by volume in water, Aldrich), de-ionized water, acetone, and ethanol. The last traces of organic residues were removed by a 10 minutes oxygen plasma cleaning step. The FTO sheets were subsequently coated with a compact layer of $TiO_2$ (about 30 nm) by aerosol spray pyrolysis deposition at 275° C., using oxygen as the carrier gas. Films of 1.5 μm thick mesoporous $TiO_2$ were then deposited by screen-printing a commercial paste (Dyesol 18NR-T). The $TiO_2$ films were slowly heated to 500° C. and allowed to sinter for 30 min in air. Once cooled, the samples were immersed into a 15 mM $TiCl_4$ aqueous solution for 45 min at 70° C. and then heated to 500° C. for another sintering step of 45 min. After cooling to 70° C., the substrates were immersed in a 500 μM dye solution, in 1:1 v:v mixture of acetonitrile and tert-butyl alcohol, for one hour. The dye employed in this study was D102. After the dyed films were rinsed in acetonitrile, the Spiro-OMeTAD was applied by spin-coating at 1000 rpm for 45 s in air from solution prepared as previously described. After drying overnight, back contacts were applied by thermal evaporation of 150 nm of silver.

Example 11—Meso-Superstructures Solar Cells (MSSCs) Fabrication

All solvents used for device fabrication were reagent grade and anhydrous. FTO substrates (7 ffsq, Pilkington US) were etched with zinc powder and HCl (2 M aqueous solution) to give the desired electrode patterning. The substrates were cleaned with Hellmanex (2% by volume in water, Aldrich), de-ionized water, acetone, and ethanol. The last traces of organic residues were removed by a 10 min oxygen plasma cleaning step. The FTO sheets were subsequently coated with a compact layer of $TiO_2$ (about 30 nm) by aerosol spray pyrolysis deposition at 270° C., using oxygen as the carrier gas. The $TiO_2$ films were slowly heated to 500° C. and allowed to sinter for 30 min in air. Once cooled, films of 200 nm thick mesoporous $Al_2O_3$ were deposited on the top of the compact $TiO_2$ layer by spin-coating Aldrich isopropanol dispersion of 40 nm $Al_2O_3$ particles. Then the substrates were heated to 150° C. for 30 min and let cooling down to room temperature. Then, perovskite crystals $ABX_3$ ($A=CH_3NH_3$, $B=Pb$, and $X=I_{1-x}Cl_x$) were deposited. The Spiro-OMeTAD was applied by spin-coating at 2000 rpm for 45 s in air from solution prepared as previously described. After drying overnight, back contacts were applied by thermal evaporation of 150 nm of silver.

Example 12—Solar Cell Characterization

For measuring the device merit parameters, simulated AM 1.5 sunlight was generated with a class AAB ABET solar simulator calibrated to give simulated AM1.5, 100 mWcm$^{-2}$ irradiance, using an NREL-calibrated KG5 filtered silicon reference cell, with less than 1% mismatch factor; the current-voltage curves were recorded with a sourcemeter (Keithley 2400, USA). The solar cells were masked with a metal aperture defining the active area (0.08 cm$^2$) of the solar cells. MSSCs were measured immediately after the thermal evaporation of electrodes.

Example 13—Solid State Dye Sensitized Solar Cell (Ss-DSSC) Device Characteristics To demonstrate the application of the doping mechanism, PILs were used as additives in Spiro-OMeTAD based ss-DSSCs. The state-of-the art ss-DSSCs are assembled using lithium bis(trifluoromethylsulfonyl)-imide (Li-TFSI) as main additive in the Spiro-OMeTAD hole transporting layer. The lithium ion (Li$^+$) has been reported as essential for device operation, since it helps lowering the series resistances and enhancing the photocurrent generation. Recently it was demonstrated that Li$^+$ is redox active p-dopant, since it forms neutral lithium oxide species oxidising (p-doping) the Spiro-OMeTAD. This doping mechanism is still active during device operation, slowly consuming Li$^+$ in presence of oxygen. While the latter mechanism is needed to reduce the series resistance, the photocurrent generation dependents on the availability of Li$^+$ at the $TiO_2$ interface. The current "optimized" system is thus a compromise in as much as the Li$^+$ is required for two opposing processes, one which consumes it and another which is dependent on its presence at the $TiO_2$ interface. Here, we replace the Li-TFSI with PILs as additives in Spiro-OMeTAD, showing that the Li$^+$ is not crucial for the device operation.

To quantify the influence of PILs, transient photo-voltage and photo-current decay measurements were performed on PIL based ss-DSSCs. From these transient measurements, it is possible estimates the density of states in the $TiO_2$, recombination lifetime, charge collection lifetime and charge collection efficiency. The extracted values are reported in FIG. 11 for devices stored one week in air and dark condition before measuring. It is shown that the charge transport lifetime monotonically decreases with charge density for Li-TFSI and H-TFSI, meanwhile Himi-TFSI and $Et_4N$-TFSI seem to be limiting the charge transport at high charge density. To explain this trend, one should consider that at low charge densities (1E16 cm$^{-3}$) the electron transport in the $TiO_2$ is limiting the charge transport, which is in fact similar for all the dopants. As the charge density increases (1E17 cm$^{-3}$), the electron transport rate in the $TiO_2$ becomes comparable to the hole transport in the Spiro-OMeTAD. In this regime, the hole transport can limits the charge transport if the conductivity of the Spiro-OMeTAD is below 1 μS cm$^{-1}$. Therefore, Himi-TFSI and $Et_4N$-TFSI are effectively limiting the charge transport for charge density above 1E17 cm$^{-3}$, which is in the range values for the device in standard working condition.

Figure 6:
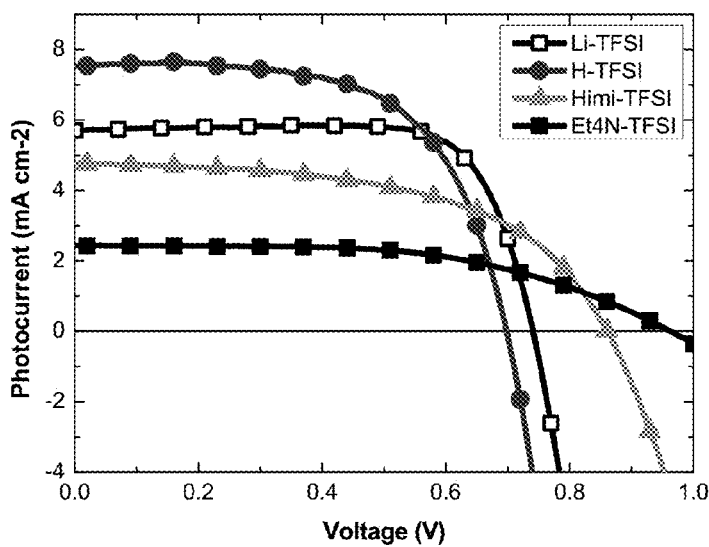
FIG. 6 shows photocurrent-voltage curves for devices employing different additives. All the devices were sensitized with D102 and measured under AM1.5 simulated sun light of 100 mW cm$^{-2}$ equivalent solar irradiance.
Figure 11:
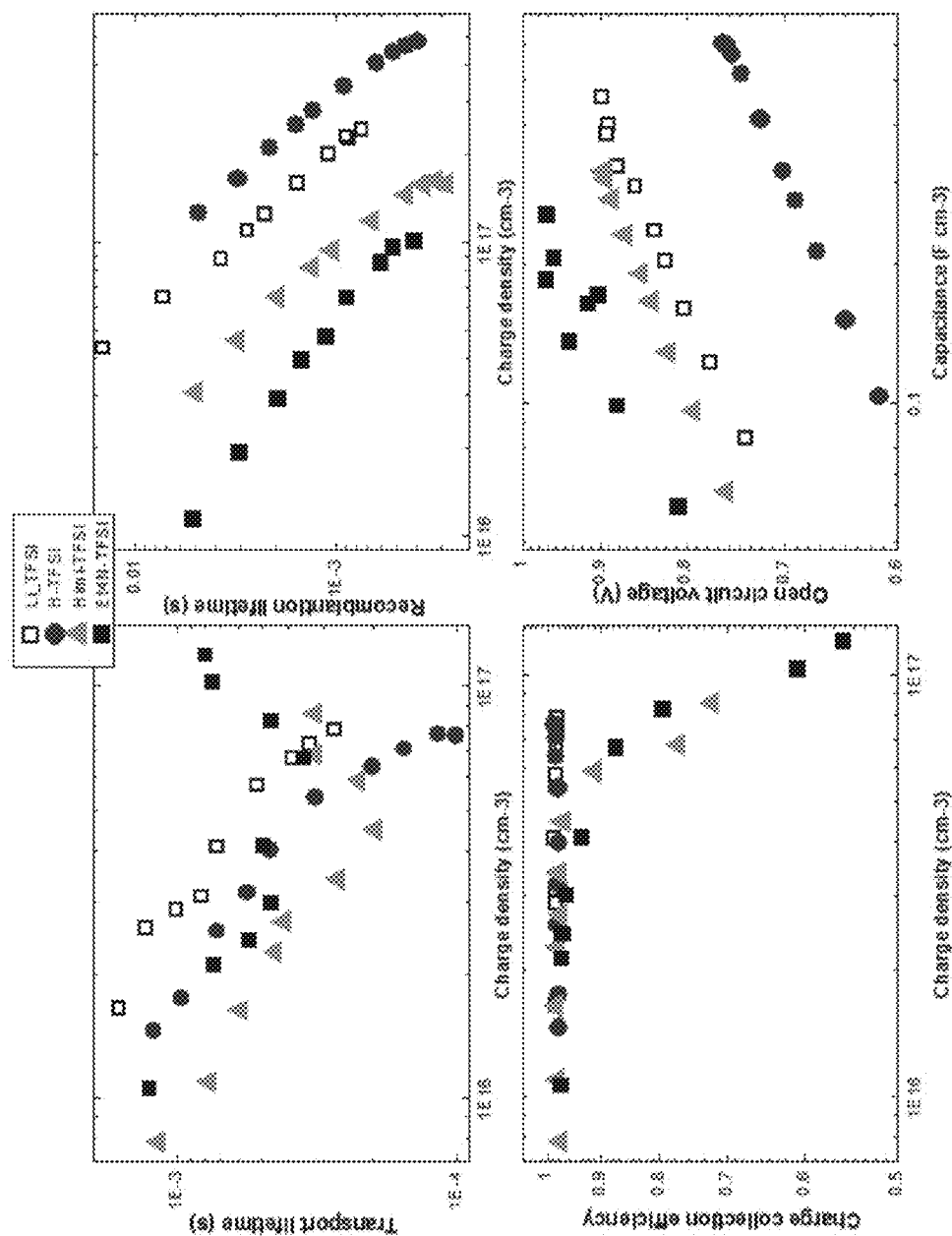
FIG. 11 shows transient photo-voltage and photo-current decay measurements for devices employing Spiro-OMeTAD as hole transporter and different additives.

In FIG. 11 it is shown that the recombination lifetime follow the same trend with charge density for all the dopants. At same charge density, the recombination lifetime increases as the dopant cation size decrease ($Et_4N^+$>Himi$^+$>Li$^+$>H$^+$). A very similar effect has been previously observed for liquid electrolyte dye-sensitized solar cells. The recombination trend with the cation size can be explained with the ability of the positive ion to penetrate the dye layer. From transport and recombination lifetime one can extract the charge collection efficiency as the ratio of the transport rate (inverse of lifetime) over the sum of transport and recombination rates. FIG. 11 shows also constant charge collection efficiency with charge density for Li-TFSI and H-TFSI. This indicates that the faster charge transport compensates the higher recombination rate moving from lower to higher charge density. For Himi-TFSI and $Et_4N$-TFSI, the same increase in recombination cannot be compensated by faster transport, which is thus limiting the charge collection efficiency. In FIG. 11 it is finally shown that the density of states (DOS) in the $TiO_2$, as described by the open circuit voltage as function of the capacitance, is strongly affected by the employed dopant. It has already been reported that the DOS becomes shallower and broader as Li-TFSI is added. The first is attributed to a downshift of the Fermi level of the electrons due to the positive charges (Li$^+$) at $TiO_2$ interface, the latter is explained as the result of an increased DOS below the conduction band due to Li$^+$ intercalation in the $TiO_2$. Similarly, the H$^+$ can more or less strongly affects the DOS in the $TiO_2$, depending on the acid character of the employed PIL as shown in FIG. 11 for H-TFSI and Himi-TFSI. In particular, the protonation of the metal oxides surface has been reported resulting in increased DOS below the conduction band, as well as observed for Li$^+$. In absence of both H$^+$ or Li$^+$ the DOS looks different from the previously described dopants, as shown for $Et_4N$-TFSI. The voltage first rapidly grows with capacitance, and then it remains nearly constant about 0.95 V with further increase in capacitance. This could be explained considering that in the first regime the electrons injected in the $TiO_2$ are filling the narrow DOS of the conduction band edges, and then they are injected in the effective conduction band. To show how the parameter extracted from the transient photo-voltage and photo-current decay measurements impact the device performances, the characteristic current-voltage (JV) curves for the same devices are reported in FIG. 6. All the curves have been measured under AM1.5 simulated sun light of 100 mW cm$^{-2}$ equivalent solar irradiance with shadow masking. Table 1 lists the figures-of-merit parameters for the devices reported in FIG. 6.

TABLE 1

|  | $J_{sc}$ (mA cm$^{-2}$) | eff (%) | $V_{oc}$ (V) | ff | $R_s$ (Ohm) |
|---|---|---|---|---|---|
| H-TFSI | 7.53 | 3.34 | 0.70 | 0.62 | 43 |
| Li-TFSI | 5.70 | 3.26 | 0.74 | 0.75 | 57 |

TABLE 1-continued

|  | $J_{sc}$ (mA cm$^{-2}$) | eff (%) | $V_{oc}$ (V) | ff | $R_s$ (Ohm) |
|---|---|---|---|---|---|
| Himi-TFSI | 4.77 | 2.26 | 0.86 | 0.54 | 224 |
| Et$_4$N-TFSI | 2.44 | 1.28 | 0.96 | 0.54 | 1293 |

The short circuit photocurrent density ($J_{sc}$) shows a monotonic growth moving from the Et$_4$N-TFSI to H-TFSI. This trend could be explained considering the shift of the electron Fermi level in the TiO$_2$ for different additives as described in FIG. 11. As widely reported in literature, a downshift of the Fermi level in the TiO$_2$ result in a more favourable electron injection from the dye excited state to the metal oxide. The $J_{sc}$ for Li-TFSI, according to the DOS, is located between the Himi-TFSI and H-TFSI. For the same reason, open circuit voltage ($V_{oc}$) follows exactly the opposite trend. The fill factor could be explained considering both the charge recombination and the device series resistance due to the hole transport. For Li-TFSI and H-TFSI the device series resistance are very similar, as could be extracted by the slope of the JV in open circuit condition. Also the conductivity of the Spiro-OMeTAD with Li-TFSI and H-TFSI are very similar after leaving the device in air for one week. The lower fill factor for H-TFSI could be explained considering the recombination lifetime as reported in FIG. 11. Although at same charge density Li-TFSI is recombining faster than H-TFSI, the latter can reach higher charge density, which give more recombination. Himi-TFSI and Et4N-TFSI are suffering both high recombination and series resistance, which result in a poor fill factor. The overall efficiency shows that H-TFSI and Li-TFSI are performing very close, then Himi-TFSI and Et$_4$N-TFSI.

Figure 7:
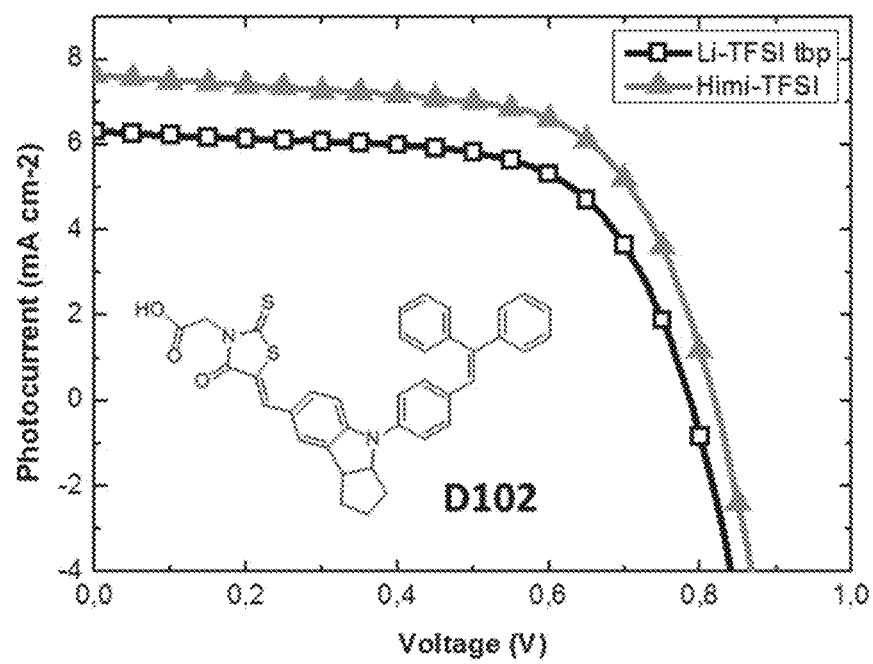
FIG. 7 shows photocurrent-voltage curves for devices employing the optimized additive composition Li-TFSI and tBP or Himi-TFSI. The devices were sensitized with D102 and measured under AM1.5 simulated sun light of 100 mW cm$^{-2}$ equivalent solar irradiance.
Figure 8:
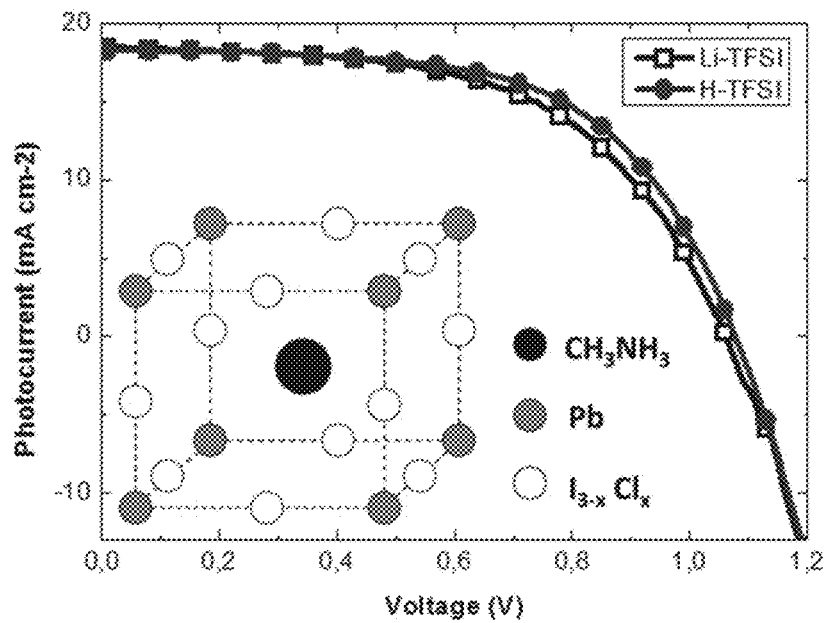
FIG. 8 shows photocurrent-voltage curves for devices employing the optimized Li-TFSI additive composition or H-TFSI. The devices use perovskite photoactive layer as described in the experimental section. They have been measured under AM1.5 simulated sun light of 100 mW cm$^{-2}$ equivalent solar irradiance.

We should remember that the previous device have been prepared, according to the state-of-art ss-DSSCSs, employing 4-tert-Butylpyridine (tbp) as extra additive to Spiro-OMeTAD. The tbp has been reported rising the Fermi level of the electron in the TiO$_2$, partially compensating the effect of the Li$^+$ by increasing the $V_{oc}$ and decreasing the $J_{sc}$. The best device performance for Li-TFSI have been collected tuning the relative amount of Li$^+$ and tbp in order to get a good compromise between the $J_{sc}$ and $V_{oc}$. In the previous experiment we used the additives, both the salts and the tbp, at the concentration that has been optimized for Li-TFSI devices. However, looking at Himi-TFSI in particular, it seems that the addition of tbp could be detrimental for the device performance, since it is suffering for low $J_{sc}$ despite high $V_{oc}$. In FIG. 7, we reported the device JV for Himi-TFSI without tbp compared to the optimized Li-TFSI tbp device. Notably the Himi-TFSI reaches 4.6% efficiency (Table 2), which overtakes the previous record reported for D102 dye in ss-DSSCs. We should note that best performing Himi-TFSI device was collected after one month storing the device in air and dark condition. This allows the conductivity of the Spiro-OMeTAD to considerable increase due to the doping effect of water and oxygen from air.

TABLE 2

|  | $J_{sc}$ (mA cm$^{-2}$) | eff (%) | $V_{oc}$ (V) | ff | $R_s$ (Ohm) |
|---|---|---|---|---|---|
| Himi-TFSI (no tBP) | 7.63 | 4.66 | 0.82 | 0.64 | 87 |
| Li-TFSI | 6.31 | 3.18 | 0.79 | 0.64 | 89 |

Example 14—p-Doping of Other Organic Semiconductors Using PILs

Using the same methodologies described above the following organic semiconductors were doped using HTFSI:
poly(3-hexylthiophene) (P3HT):
2 orders of magnitude increase in conductivity. It showed about 6% devices with perovskite;
poly [N,N-diphenyl-4-methoxyphenylamine-4',4"-diyl] (PMeOTPA):
1 order of magnitude increase in conductivity; and
sexthiophene:
2 orders of magnitude increase in conductivity.

For all of these semiconductors the experimental procedure to prepare and test the conductivity are the same as reported for the Spiro-OMeTAD. The only difference was the concentration of the polymeric semiconductor, which was 10 mg/mL.

Although the foregoing invention has been described in some detail by way of illustration and example for purposes of clarity of understanding, it is apparent to those skilled in the art that certain changes and modifications will be practiced. Therefore, the description and examples should not be construed as limiting the scope of the invention to the particular forms set forth, but, on the contrary it is intended to cover all such alternatives, modifications, and equivalents as may be included in the spirit and scope of the invention as defined by the appended claims.

Example 15—Comparison of [Spiro]$^+$ [TFSI]$^-$ and [Spiro]$^+$ [SbCl$_6$]$^-$

Figure 12:
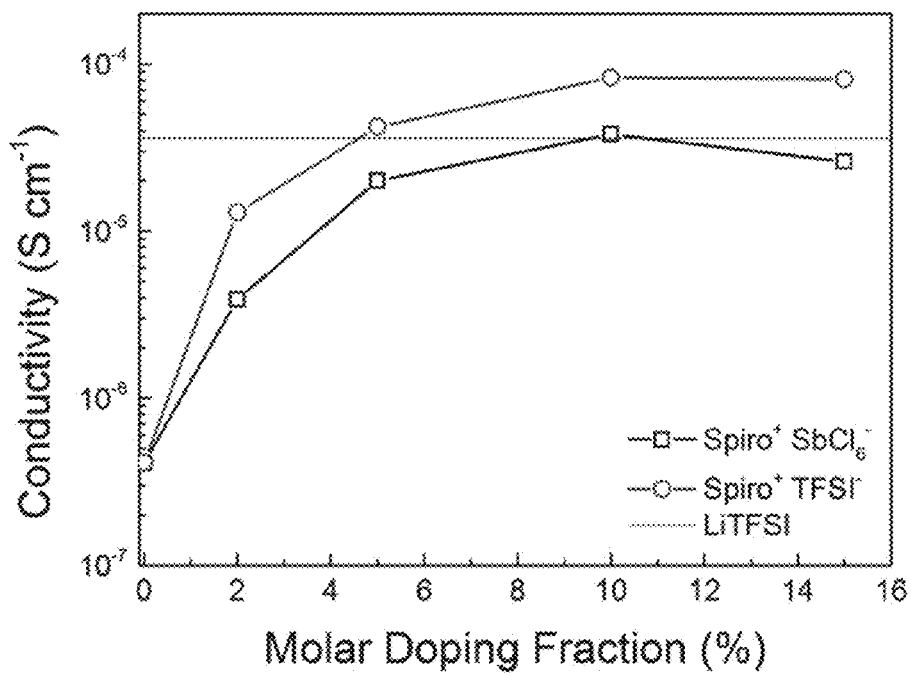
FIG. 12 shows the conductivity of spiro-OMeTAD films doped with different molar doping fractions of TFSI$^-$ or SbCl$_6^-$ salts of spiro-OMeTAD.

The [TFSI]$^-$ and [SbCl$_6$]$^-$ salts of spiro-OMeTAD ("Spiro") were prepared by the methods described above, except that no anion exchange was performed for producing the [SbCl$_6$] salt. The anion exchange for the TFSI salt was performed by using 10 times excess tetraethylammonium TFSI. A thin 200 nm mesoporous scaffold was used to allow for good film formation of a film of the doped semiconductor which was approximately 1 μm thick. FIG. 12 plots the conductivity of films of Spiro-OMeTAD at different doping fractions. The conductivities for films doped with Spiro$^+$ TFSI$^-$ are 2-3 times higher than the conductivities for those doped with Spiro$^+$ SbCl$_6^-$. The maximum conductivity reached using Spiro$^+$ TFSI$^-$ is almost 3 times higher than that using the previous best system: LiTFSI.

Figure 13:
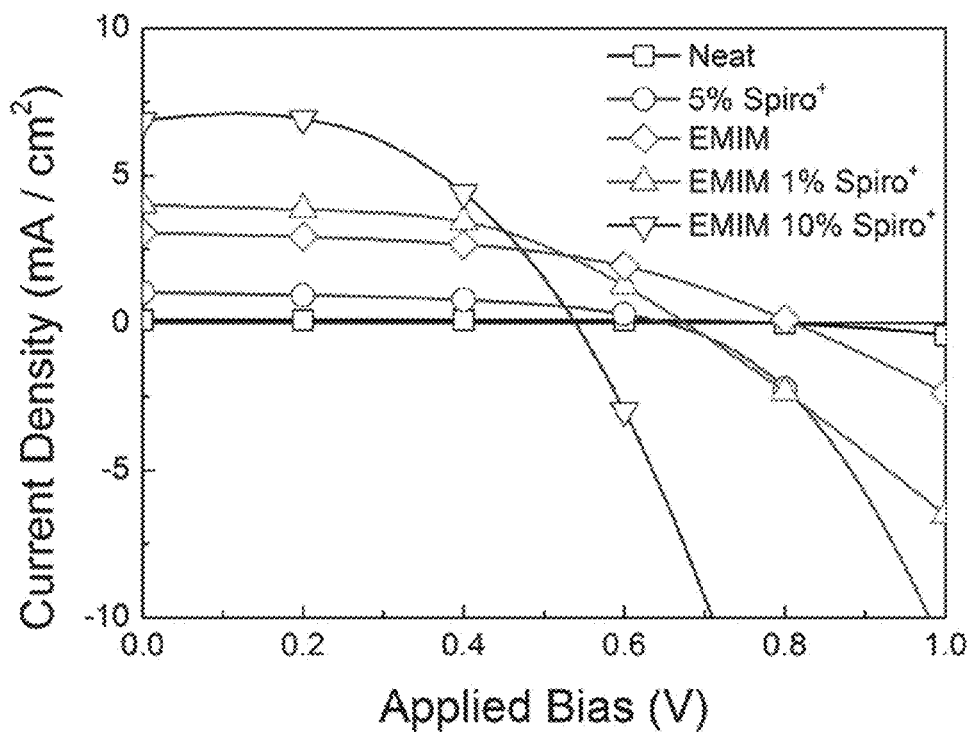
FIG. 13 shows photocurrent-voltage curves for dye sensitized solar cells employing varying levels of doping.

Example 16—J-V Curves for Dye Sensitized Solar Cells Made Using [Spiro]$^+$[TFSI]$^-$ Dye sensitized cells were constructed by the method described above (Example 10) and had the structure FTO, TiO$_2$ compact layer, mesoporous TiO$_2$, D102 sensitising dye, doped organic semiconductor (hole transporter) and silver electrodes. The thickness of the hole transporter layer was from 300 to 500 nm thick. FIG. 13 shows the characteristic current density-voltage (J-V) curves for dye sensitized solar cells made using the Spiro$^+$ TFSI$^-$ doping method, and incorporating no LiTFSI. EMIM TFSI (1-Ethyl-3-methylimidazolium bis(trifluoromethylsulfonyl) imide) is used to facilitate charge generation at the dye-TiO$_2$ interface but has very little influence on the conductivity of the hole transporter, as can be observed by the 650 ohm series resistance in devices with only this additive. Performance characteristics of the cells were as follows.

|  | $J_{SC}$ (mA/cm²) | PCE (%) | $V_{OC}$ (V) | FF | $R_{SERIES}$ (Ohms) |
|---|---|---|---|---|---|
| Neat | 0.104 | 0.06 | 0.79 | 0.67 | 3300 |
| 5% Spiro⁺ | 1.03 | 0.33 | 0.65 | 0.47 | 156 |
| EMIM | 3.05 | 1.24 | 0.81 | 0.49 | 650 |
| EMIM + 1% Spiro⁺ | 4.01 | 1.45 | 0.52 | 0.47 | 393 |
| EMIM + 10% Spiro⁺ | 6.86 | 1.95 | 0.54 | 0.49 | 86 |

Example 17—J-V Curves for Mesosuperstructured Solar Cells Made Using [Spiro]⁺ [TFSI]⁻

Figure 14:
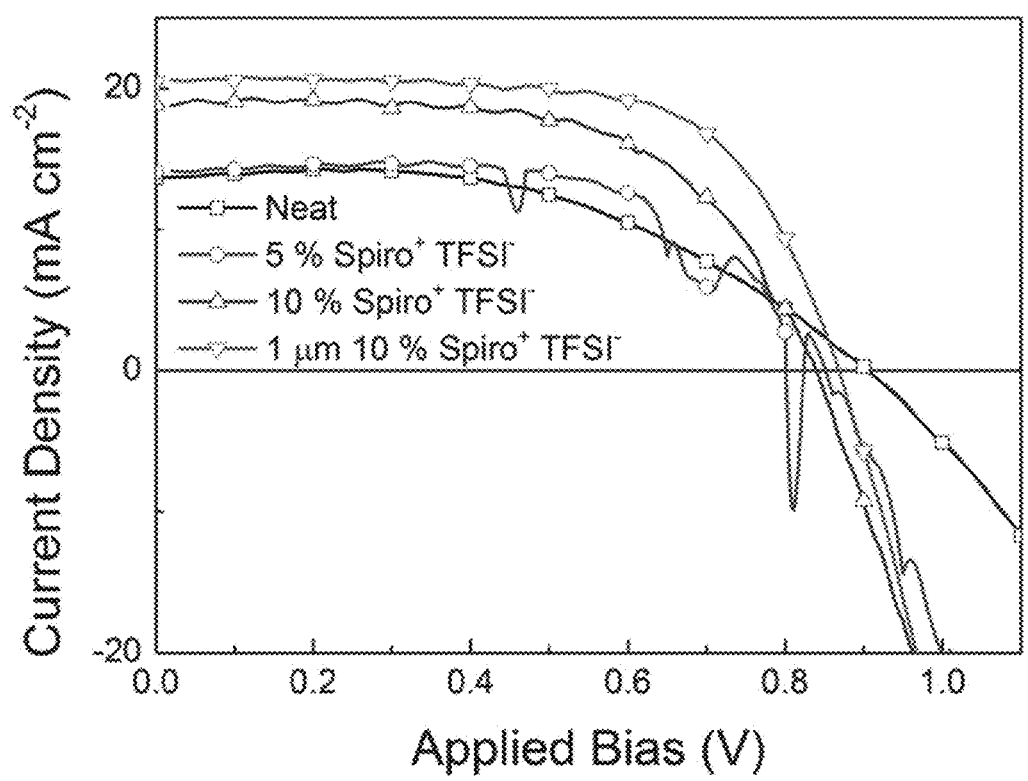
FIG. 14 shows photocurrent-voltage curves for mesosuperstructured solar cells employing varying levels of doping.

FIG. 14 shows characteristic current density-voltage (J-V) curves for mesosuperstructured solar cells (MSSCs) made using an organometal trihalide perovskite semiconductor when the Spiro⁺ TFSI⁻ doping method is used to prepare the HTM (hole transport material) layers. The devices were constructed by the method described above (Example 11) and had the structure FTO, compact $TiO_2$ layer, 400 nm mesoporous $Al_2O_3$ layer, methylammonium lead triiodide perovskite absorber layer, doped organic semiconductor (hole transporter) and silver electrodes. No other additives are present. The thickness of the hole transporter layer was from 300 to 500 nm thick, unless specified as 1 μm thick. The doping percentage refers to a molar doping percentage of the HTM salt and the neutral HTM. The upper curve (▼) corresponds to an MSSC fabricated with a 1 micrometer thick hole transporter layer, which should make such cells more stable to water ingress. Making such thick layers is possible because of the superior conductivity of the HTM layers when doped with the oxidized HTM salt. The thickest HTM layer with the conventional LiTFSI dopant is around 400 nm before the device begins to suffer from low fill factors (data not shown). Performance characteristics of the cells were as follows.

|  | $J_{SC}$ (mA cm⁻²) | PCE (%) | $V_{OC}$ (V) | FF |
|---|---|---|---|---|
| Neat | 13.7 | 6.5 | 0.91 | 0.49 |
| 5% Doped | 14 | 7.7 | 0.88 | 0.63 |
| 10% Doped | 18.8 | 9.9 | 0.87 | 0.61 |
| 1 μm 10% Doped | 20.4 | 12.2 | 0.87 | 0.69 |

Example 18—Thermal Stressing of Perovskite Films

Figure 15:
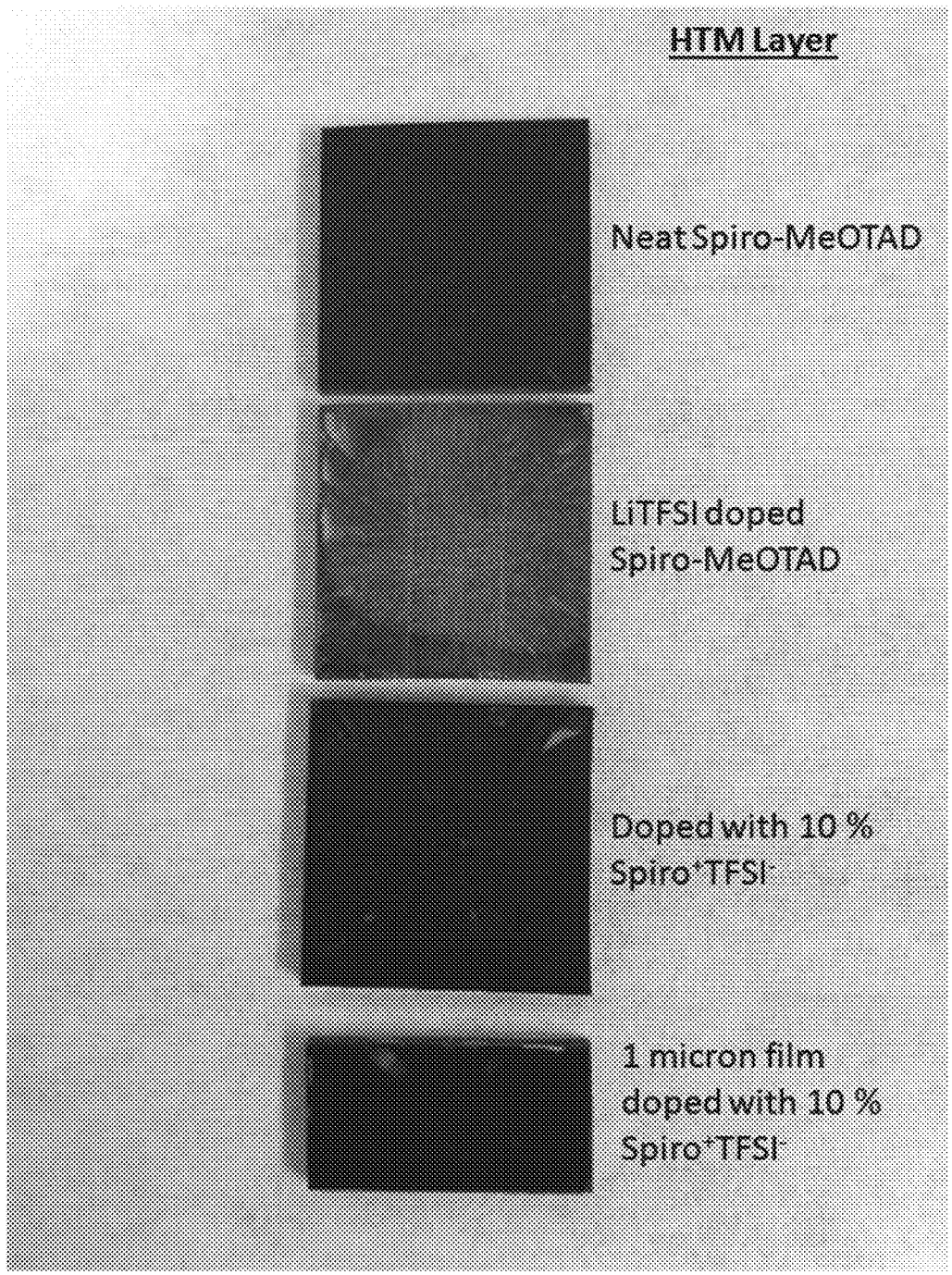
FIG. 15 shows a photograph of complete solar cells after exposure to ambient air (50% humidity) at 80° C. for 18 hours.

Complete mesosuperstructured solar cells (MSSCs) were produced and exposed to ambient air (50% humidity) at 80° C. for 18 hours before evaporation of the top electrode. The MSSCs were produced by the same method and with the same structure as in Example 17, except that the silver electrodes were evaporated after thermal stressing. FIG. 15 shows a photograph of these complete cells following the heat treatment. The solar cell where the LiTFSI dopant is used has rapidly degraded because the hydroscopic LiTFSI salt leads to high water content in the perovskite film, so that the perovskite layer is degraded to $PbI_2$ (explaining the observed yellow color). Solar cells prepared with the oxidized HTM salt as dopant are clearly far more stable to moisture ingress and thermal treatment.

Figure 16:
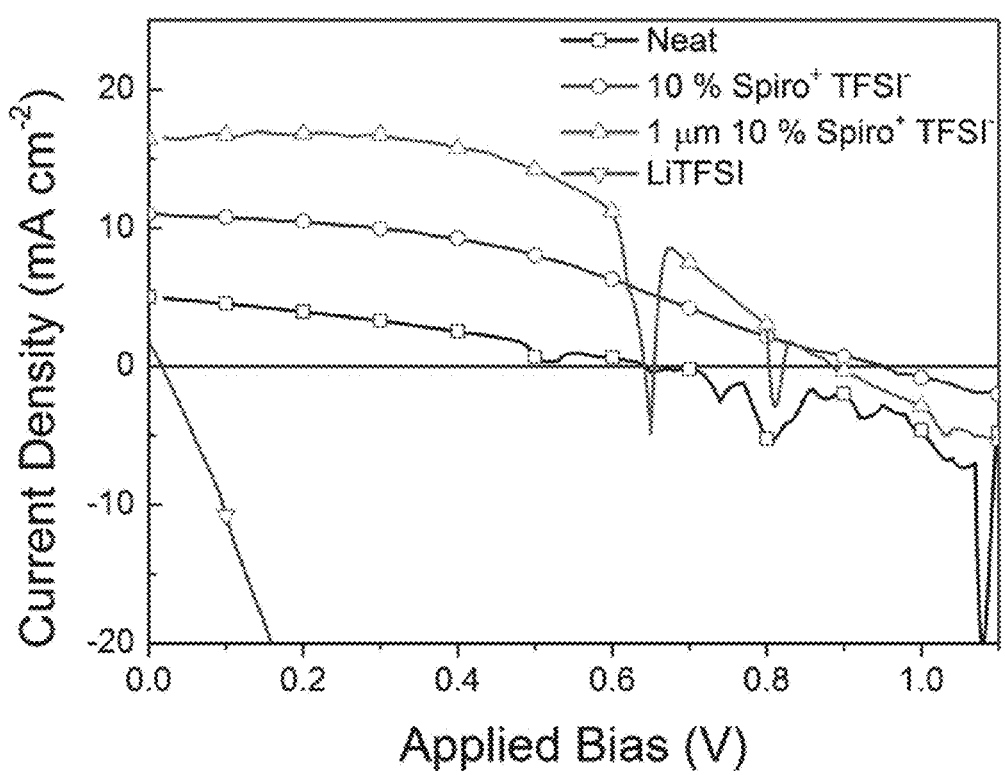
FIG. 16 shows photocurrent-voltage curves for mesosuperstructured solar cells after exposure to ambient air (50% humidity) at 80° C. for 18 hours.

FIG. 16 shows the characteristic current density-voltage (J-V) curves for the mesosuperstructured solar cells described above and shown in FIG. 15. The solar cells using LiTFSI to dope the HTM do not function at all, as is expected from the degradation evident in the photograph (FIG. 15). The solar cells protected by the thick 1 micron layer of HTM doped with 10% Spiro⁺ TFSI⁻ have withstood the thermal stressing the best, still delivering over 7% power conversion efficiency. The performance characteristics of these devices are as follows.

|  | $J_{SC}$ (mA cm⁻²) | PCE (%) | $V_{OC}$ (V) | FF |
|---|---|---|---|---|
| Neat | 5.03 | 1.04 | 0.7 | 0.32 |
| 10% Doped | 11.04 | 4.1 | 0.95 | 0.53 |
| 1 μm 10% Doped | 16.4 | 7.3 | 0.94 | 0.49 |
| LiTFSI Doped | 1.8 | 0.01 | 0.02 | 0.22 |

The invention claimed is:

1. A process for producing a p-doped organic semiconductor comprising treating an organic semiconductor with a composition comprising an oxidised salt of the organic semiconductor, which oxidised salt of the organic semiconductor is a salt of formula [OS][A], wherein OS is a cation of an organic semiconductor and A is $ClO_4^-$, $NO_3^-$ or an anion of formula (i), (ii), (iii) or (iv)

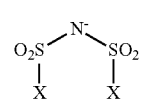
(i)

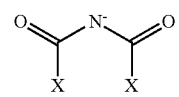
(ii)

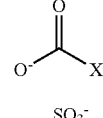
(iii)

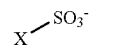
(iv)

wherein each X is the same or different and is an electron withdrawing group.

2. A process according to claim 1 which comprises treating the organic semiconductor with a composition comprising from 80 to 100 wt % of the oxidised salt of the organic semiconductor.

3. A process according to claim 1 wherein the organic semiconductor comprises:

an organic semiconductor comprising a triarylamine moiety, an organic semiconductor comprising a conjugated polymer, an organic semiconductor comprising a conjugated oligomer, or an organic semiconductor comprising a polycyclic aromatic hydrocarbon.

4. A process according to claim 1 wherein the organic semiconductor comprises a compound of formula (V), (I), (II), (III), (IV), (VI) or (VII):

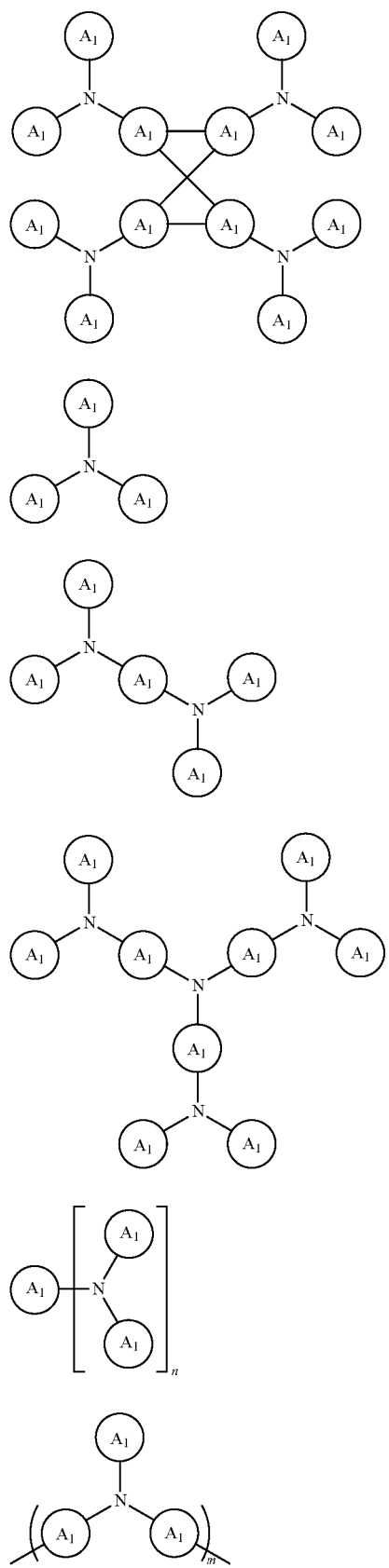

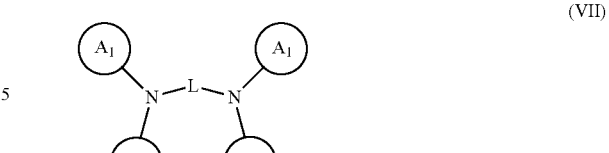

wherein:
each $A_1$ is the same or different and is an unsubstituted or substituted aryl ring or an unsubstituted or substituted heteroaryl ring;
L is a conjugated linker;
n is 3 or 4; and
m is an integer of 2 or more.

5. A process according to claim 1 wherein the organic semiconductor comprises unsubstituted or substituted polythiophene or an unsubstituted or substituted oligothiophene.

6. A process according to claim 1 wherein the organic semiconductor comprises a compound of formula (V) or (Vb):

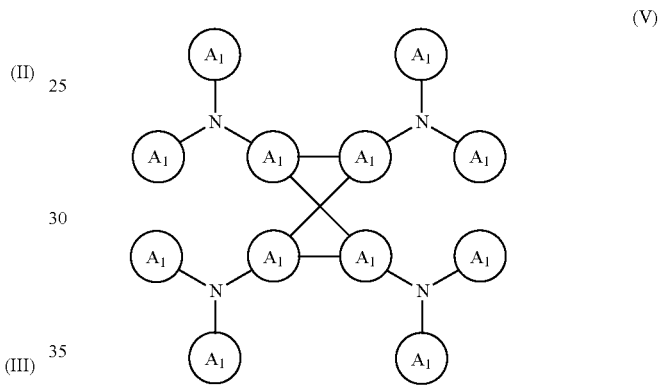

wherein each $A_1$ is the same or different and is an unsubstituted or substituted aryl ring or an unsubstituted or substituted heteroaryl ring;

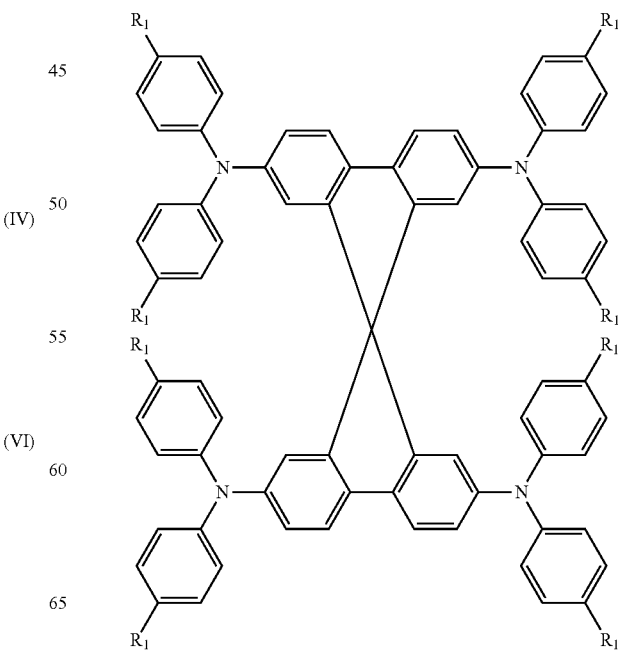

wherein each $R_1$ is the same or different and is a group selected from hydrogen, $C_{1-8}$ alkyl, $C_{2-8}$ alkenyl, $C_{2-8}$ alkynyl, $C_{1-8}$ alkoxy, hydroxyl, mono-$C_{1-8}$ alkylamino, di-$C_{1-8}$ alkylamino, amino, halide, cyano, nitro, and thiol.

7. A process according to claim 1 wherein A is bis(trifluoromethanesulfonyl)imide, bis(pentafluoroethanesulfonyl)imide, bis(perfluoropropanesulfonyl)imide, trifluoroacetate, or trifluoromethanesulfonate.

8. A process according to claim 1 wherein the process further comprises producing the oxidised salt of the organic semiconductor by a process comprising:
(a) treating the organic semiconductor with an oxidant to produce an oxidation product;
(b) isolating the oxidation product;
(c) performing an anion exchange with A on the oxidation product to produce an oxidised salt of the organic semiconductor comprising A, wherein A is as defined in claim 1 and
(d) isolating the oxidised salt of the organic semiconductor.

9. A process according to claim 8 wherein the oxidant comprises
a compound selected from percyanocarbon compounds, quinone compounds, chloroquinone compounds, halogen compounds or interhalogen compounds;
a cation selected from triarylaminium radical cations, heterocyclic radical cations, triarylcarbenium cations, tropylium cations, complex cations of metals or nitrosonium cation; or
an anion selected from a hexacyanotrimethylenecyclopropane radical anion $[C_3\{C(CN)_2\}_3]^-$, or a hexachloroplatinate anion $[PtCl_6]^{2-}$.

10. A process according to claim 8 wherein the oxidant comprises
a compound selected from TCNE, TCNQ, F4TCNQ, DDQ, 1,2-benzoquinone, 1,4-benzoquinone, 1,4-napthoquinone, dichlorobenzoquinone, chloranil, fluorine, chlorine, bromine, or iodine; or
a cation selected from $[NAr_3]^+$, thianthrene cation, phenoxathiin cation, phenothiazine cation, N-methylphenothiazine cation, N-phenylphenothiazine cation, $[CAr_3]^+$, $[Ru(phen)_3]^{3+}$, $[Fe(bipy)_3]^{3+}$, $[Fe(\eta-C_5H_4COMe)_2]^+$, $[Fe(\eta-C_5H_4COMe)Cp]^+$, or $[FeCp_2]^+$;
wherein Ar is an unsubstituted or substituted aryl group.

11. A process according to claim 8 wherein the oxidant comprises a cation selected from $[N(4-C_6H_4Br)_3]^+$, $[N(2,4-C_6H_3Br_2)_3]^+$, $[N(2,4,6-C_6H_2Br_3)_3]^+$, $N(4-C_6H_4Cl)_3]^+$, $[N(2,4-C_6H_3Cl_2)_3]^+$, $[N(2,4,6-C_6H_2Cl_3)_3]^+$, $[N(C_6Cl_5)_3]^+$, $[N(4C_6H_4-CN)_3]^+$, $[N(4-C_6H_4CO_2Me)_3]^+$, $[N(4-C_6H_4Me)_3]^+$, $[N(4-C_6H_4OMe)_3]^+$, or $[N(4-C_6H_4NO_2)_3]^+$.

12. A process according to claim 8 wherein the oxidant comprises an anion selected from $[SbCl_6]^-$, $[BCl_4]^-$, $[AlCl_4]^-$, $[PF_6]^-$, $[SbF_6]^-$, $[BF_4]^-$, $[AlF_4]^-$, $[ClO_4]^-$, or $[NO_3]^-$.

13. A process according to claim 8 wherein the oxidant comprises $[N(4-C_6H_4Br)_3][SbCl_6]$ or $[N(4-C_6H_4Br)_3][SbF_6]$.

14. A process according to claim 8 wherein the amount of the oxidant is from 1 to 2 equivalents relative to the amount of the organic semiconductor.

15. A process according to claim 8 wherein (c) comprises treating the oxidation product with a salt comprising A.

16. A process according to claim 8 wherein (c) comprises treating the oxidation product with a salt of formula [M][A], wherein M is a cation selected from metal cations, ammonium cations or a sulfonium cation.

17. A process according to claim 16 wherein M is selected from $Li^+$, $Na^+$, $K^+$, $Be^{2+}$, $Mg^{2+}$, $Ca^{2+}$, $Ag^+$ or $Zn^{2+}$.

18. A process according to claim 8 wherein (c) comprises treating the oxidation product with a salt selected from LiTFSI, NaTFSI, KTFSI, AgTFSI, $Zn(TFSI)_2$, LiBETI, NaBETI, KBETI, AgBETI, $Zn(BETI)_2$.

19. A process according to claim 8 wherein (c) comprises treating the oxidation product with 10 to 30 equivalents of a salt comprising the anion A.

20. A process according to claim 1 wherein the organic semiconductor is treated with from 0.1 to 50 mol % of the oxidised salt of the organic semiconductor relative to the amount of the organic semiconductor.

21. The process of claim 1, wherein wherein X is $CF_3$ or $CF_2CF_3$.

22. A process for producing a layer of p-doped organic semiconductor comprising:
(a) producing a p-doped organic semiconductor by a process comprising treating an organic semiconductor with a composition comprising an oxidised salt of the organic semiconductor, which oxidised salt of the organic semiconductor is a salt of formula [OS][A], wherein OS is a cation of an organic semiconductor and A is $ClO_4^-$, $NO_3^-$ or an anion of formula (i), (ii), (iii) or (iv)

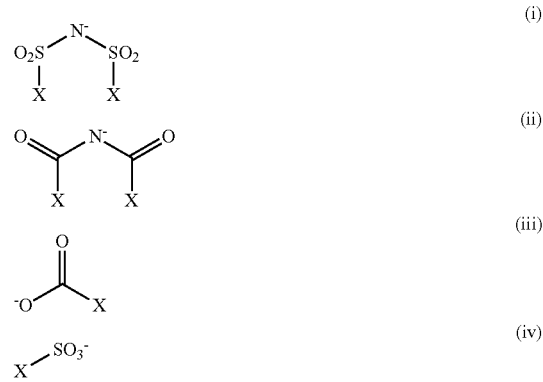

wherein each X is the same or different and is an electron withdrawing group;
(b) disposing on a substrate a composition comprising a solvent and the p-doped organic semiconductor; and
(c) removing the solvent.

23. A process according to claim 22 wherein the composition disposed on the substrate further comprises LiTFSI and/or tert-butyl pyridine.

24. A process according to claim 23 wherein the composition comprises from 1 to 40 mol % LiTFSI and from 50 to 150 mol % tert-butyl pyridine relative to the amount of the organic semiconductor.

25. A process according to claim 22 wherein the solvent comprises acetonitrile and/or chlorobenzene.

26. A process according to claim 22 wherein the substrate comprises an electrode material or a semiconductor material or a mesoporous layer of a semiconductor material or a mesoporous layer of a dielectric material.

27. A layer of a p-doped organic semiconductor obtainable by a process according to claim 22.

28. A semiconductor device which comprises a layer of a p-doped organic semiconductor, wherein the layer of a p-doped organic semiconductor is as defined in claim 27.

29. The process of claim 22, wherein wherein X is $CF_3$ or $CF_2CF_3$.

30. A process for producing a semiconductor device comprising
a step of producing a p-doped organic semiconductor by a process comprising treating an organic semiconductor with a composition comprising an oxidised salt of the organic semiconductor, which oxidised salt of the organic semiconductor is a salt of formula [OS][A], wherein OS is a cation of an organic semiconductor and A is $ClO_4^-$, $NO_3^-$ or an anion of formula (i), (ii), (iii) or (iv)

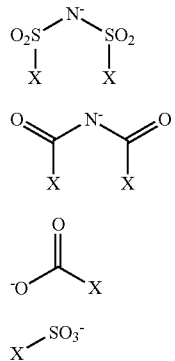

wherein each X is the same or different and is an electron withdrawing group; or
a step of producing a layer of a p-doped organic semiconductor by a process comprising:
(a) producing a p-doped organic semiconductor by a process comprising treating an organic semiconductor with a composition comprising an oxidised salt of the organic semiconductor, which oxidised salt of the organic semiconductor is a salt of formula [OS][A], wherein OS is a cation of an organic semiconductor and A is $ClO_4^-$, $NO_3^-$ or an anion of formula (i), (ii), (iii) or (iv)

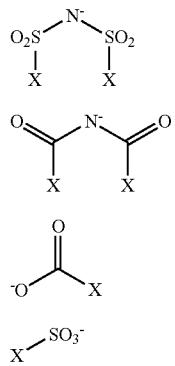

wherein each X is the same or different and is an electron withdrawing group;
(b) disposing on a substrate a composition comprising a solvent and the p-doped organic semiconductor; and
(c) removing the solvent.

31. A process according to claim 30 wherein the process comprises:
(a) disposing on a first electrode material at least one layer of a semiconductor material to produce a resulting substrate comprising a first electrode material and at least one layer of a semiconductor material;
(b) sensitizing the resulting substrate to produce a sensitized substrate; and
(c) producing a layer of a p-doped organic semiconductor by a process according to claim 27 on the sensitized substrate, or
producing a p-doped organic semiconductor by a process according to claim 27 and forming a layer of the p-doped organic semiconductor thus produced on the sensitized substrate.

32. A process according to claim 31 wherein (a) comprises disposing on a first electrode material a compact layer of a semiconductor material and/or a mesoporous layer of a semiconductor material.

33. A process according claim 31 wherein the first electrode material comprises a transparent conducting oxide.

34. A process according to claim 31 wherein (b) comprises treating the resulting substrate comprising a first electrode material and at least one layer of a semiconductor material with a dye or a semiconducting perovskite.

35. A process according to claim 31 which further comprises:
(d) disposing a second electrode material on the layer of a p-doped organic semiconductor.

36. A process according to claim 30 wherein the device is any of an optoelectronic device, a photovoltaic device, a solar cell, a photo detector, a light-sensitive transistor, a capacitor, a super-capacitor, a phototransistor, a solid-state triode, a battery, a battery electrode, a light-emitting device, a light-emitting diode a dye-sensitized solar cell, a perovskite-sensitized solar cell, a quantum dot sensitized solar cell, an extremely thin absorber cell or a meso-super structured solar cell.

37. A semiconductor device obtainable by a process according to claim 30.

38. The process of claim 30, wherein wherein X is $CF_3$ or $CF_2CF_3$.

39. A composition which comprises from 50 to 100 wt % of an oxidised salt of an organic semiconductor according to formula (VIII)

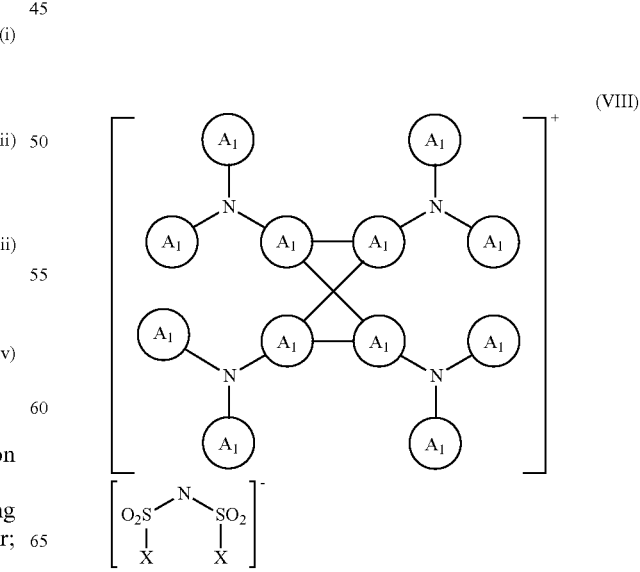

wherein each $A_1$ is the same or different and is an unsubstituted or substituted aryl ring or an unsubstituted or substituted heteroaryl ring; and X is a $C_{1-8}$-haloalkyl group.

40. A composition according to claim 39 wherein the composition comprises from 80 to 100 wt % of the oxidised salt of the organic semiconductor.

41. A composition according to claim 39 wherein the oxidised salt of the organic semiconductor is [2,2-7,7-tetrakis(N,N-di-pmethoxyphenylamine)-9,9-spirobifluorene]$^+$[TFSI]$^-$ or [2,2-7,7-tetrakis(N,N-di-pmethoxyphenylamine)-9,9-spirobifluorene]$^+$[BETI]$^-$.

* * * * *